(12) United States Patent
Wilberding et al.

(10) Patent No.: US 11,064,306 B2
(45) Date of Patent: Jul. 13, 2021

(54) CALIBRATION STATE VARIABLE

(71) Applicant: Sonos, Inc., Santa Barbara, CA (US)

(72) Inventors: Dayn Wilberding, Santa Barbara, CA (US); Neil Griffiths, Santa Barbara, CA (US)

(73) Assignee: Sonos, Inc., Santa Barbara, CA (US)

( * ) Notice: Subject to any disclaimer, the term of this patent is extended or adjusted under 35 U.S.C. 154(b) by 0 days.

(21) Appl. No.: 16/403,077

(22) Filed: May 3, 2019

(65) Prior Publication Data

US 2019/0261106 A1 Aug. 22, 2019

Related U.S. Application Data

(63) Continuation of application No. 16/055,884, filed on Aug. 6, 2018, now Pat. No. 10,284,984, which is a
(Continued)

(51) Int. Cl.
| | |
|---|---|
| *H04R 29/00* | (2006.01) |
| *H04S 7/00* | (2006.01) |
| *H03G 5/16* | (2006.01) |
| *H03G 5/00* | (2006.01) |
| *H04R 3/12* | (2006.01) |
| *H04R 27/00* | (2006.01) |

(Continued)

(52) U.S. Cl.
CPC .......... *H04R 29/001* (2013.01); *G06F 3/165* (2013.01); *H03G 3/20* (2013.01); *H03G 5/005* (2013.01); *H03G 5/16* (2013.01); *H03G 5/165* (2013.01); *H04R 1/22* (2013.01); *H04R 3/04* (2013.01); *H04R 3/12* (2013.01); *H04R 5/04* (2013.01); *H04R 27/00* (2013.01); *H04R 29/008* (2013.01); *H04S 1/007* (2013.01); *H04S 7/301* (2013.01); *H04R 2227/005* (2013.01)

(58) Field of Classification Search
None
See application file for complete search history.

(56) References Cited

U.S. PATENT DOCUMENTS

| | | | |
|---|---|---|---|
| 4,306,113 A | 12/1981 | Morton | |
| 4,342,104 A | 7/1982 | Jack | |

(Continued)

FOREIGN PATENT DOCUMENTS

| | | | |
|---|---|---|---|
| CN | 1447624 A | 10/2003 | |
| CN | 1622694 A | 6/2005 | |

(Continued)

OTHER PUBLICATIONS

Notice of Allowance dated Nov. 9, 2016, issued in connection with U.S. Appl. No. 14/805,340, filed Jul. 21, 2015, 13 pages.
(Continued)

*Primary Examiner* — Paul W Huber
(74) *Attorney, Agent, or Firm* — Akerman LLP

(57) ABSTRACT

Example techniques involve a calibration state variable. An example implementation receives, via a network interface, an indication that the first playback device is calibrated. Based on receiving the indication that the first playback device is calibrated, the example implementation updates a calibration state variable to indicate that the first playback device is calibrated, wherein the calibration state variable is stored in the data storage. The example implementation sends, via the network interface, an indication of the updated calibration state variable to a second device.

16 Claims, 13 Drawing Sheets

Related U.S. Application Data continuation of application No. 15/727,913, filed on Oct. 9, 2017, now Pat. No. 10,045,139, which is a continuation of application No. 14/793,190, filed on Jul. 7, 2015, now Pat. No. 9,788,113.

(51) Int. Cl.

| | |
|---|---|
| *G06F 3/16* | (2006.01) |
| *H04R 3/04* | (2006.01) |
| *H04R 5/04* | (2006.01) |
| *H04S 1/00* | (2006.01) |
| *H03G 3/20* | (2006.01) |
| *H04R 1/22* | (2006.01) |

(56) References Cited

U.S. PATENT DOCUMENTS

| | | |
|---|---|---|
| 4,504,704 A | 3/1985 | Ohyaba et al. |
| 4,592,088 A | 5/1986 | Shimada |
| 4,628,530 A | 12/1986 | Op De Beek et al. |
| 4,631,749 A | 12/1986 | Rapaich |
| 4,694,484 A | 9/1987 | Atkinson et al. |
| 4,773,094 A | 9/1988 | Dolby |
| 4,995,778 A | 2/1991 | Brussel |
| 5,218,710 A | 6/1993 | Yamaki et al. |
| 5,255,326 A | 10/1993 | Stevenson |
| 5,323,257 A | 6/1994 | Abe et al. |
| 5,386,478 A | 1/1995 | Plunkett |
| 5,440,644 A | 8/1995 | Farinelli et al. |
| 5,553,147 A | 9/1996 | Pineau |
| 5,581,621 A | 12/1996 | Koyama et al. |
| 5,754,774 A | 5/1998 | Bittinger et al. |
| 5,757,927 A | 5/1998 | Gerzon et al. |
| 5,761,320 A | 6/1998 | Farinelli et al. |
| 5,910,991 A | 6/1999 | Farrar |
| 5,923,902 A | 7/1999 | Inagaki |
| 5,939,656 A | 8/1999 | Suda |
| 6,018,376 A | 1/2000 | Nakatani |
| 6,032,202 A | 2/2000 | Lea et al. |
| 6,072,879 A | 6/2000 | Ouchi et al. |
| 6,111,957 A | 8/2000 | Thomasson |
| 6,256,554 B1 | 7/2001 | Dilorenzo |
| 6,363,155 B1 | 3/2002 | Horbach |
| 6,404,811 B1 | 6/2002 | Cvetko et al. |
| 6,469,633 B1 | 10/2002 | Wachter |
| 6,522,886 B1 | 2/2003 | Youngs et al. |
| 6,573,067 B1 | 6/2003 | Dib-Hajj et al. |
| 6,611,537 B1 | 8/2003 | Edens et al. |
| 6,631,410 B1 | 10/2003 | Kowalski et al. |
| 6,639,989 B1 | 10/2003 | Zacharov et al. |
| 6,643,744 B1 | 11/2003 | Cheng |
| 6,704,421 B1 | 3/2004 | Kitamura |
| 6,721,428 B1 | 4/2004 | Allred et al. |
| 6,731,760 B2 | 5/2004 | Pedersen |
| 6,757,517 B2 | 6/2004 | Chang et al. |
| 6,760,451 B1 | 7/2004 | Craven et al. |
| 6,766,025 B1 | 7/2004 | Levy et al. |
| 6,778,869 B2 | 8/2004 | Champion |
| 6,798,889 B1 | 9/2004 | Dicker et al. |
| 6,862,440 B2 | 3/2005 | Sampath |
| 6,916,980 B2 | 7/2005 | Ishida et al. |
| 6,931,134 B1 | 8/2005 | Waller, Jr. et al. |
| 6,985,694 B1 | 1/2006 | De Bonet et al. |
| 6,990,211 B2 | 1/2006 | Parker |
| 7,031,476 B1 | 4/2006 | Chrisop et al. |
| 7,039,212 B2 | 5/2006 | Poling et al. |
| 7,058,186 B2 | 6/2006 | Tanaka |
| 7,072,477 B1 | 7/2006 | Kincaid |
| 7,092,537 B1 | 8/2006 | Allred et al. |
| 7,103,187 B1 | 9/2006 | Neuman |
| 7,130,608 B2 | 10/2006 | Hollstrom et al. |
| 7,130,616 B2 | 10/2006 | Janik |
| 7,143,939 B2 | 12/2006 | Henzerling |
| 7,187,947 B1 | 3/2007 | White et al. |
| 7,236,773 B2 | 6/2007 | Thomas |
| 7,289,637 B2 | 10/2007 | Montag et al. |
| 7,295,548 B2 | 11/2007 | Blank et al. |
| 7,312,785 B2 | 12/2007 | Tsuk et al. |
| 7,391,791 B2 | 6/2008 | Balassanian et al. |
| 7,477,751 B2 | 1/2009 | Lyon et al. |
| 7,483,538 B2 | 1/2009 | McCarty et al. |
| 7,483,540 B2 | 1/2009 | Rabinowitz et al. |
| 7,489,784 B2 | 2/2009 | Yoshino |
| 7,490,044 B2 | 2/2009 | Kulkarni |
| 7,492,909 B2 | 2/2009 | Carter et al. |
| 7,519,188 B2 | 4/2009 | Berardi et al. |
| 7,529,377 B2 | 5/2009 | Nackvi et al. |
| 7,571,014 B1 | 8/2009 | Lambourne et al. |
| 7,590,772 B2 | 9/2009 | Marriott et al. |
| 7,630,500 B1 | 12/2009 | Beckman et al. |
| 7,630,501 B2 | 12/2009 | Blank et al. |
| 7,643,894 B2 | 1/2010 | Braithwaite et al. |
| 7,657,910 B1 | 2/2010 | McAulay et al. |
| 7,664,276 B2 | 2/2010 | McKee |
| 7,676,044 B2 | 3/2010 | Sasaki et al. |
| 7,689,305 B2 | 3/2010 | Kreifeldt et al. |
| 7,720,237 B2 | 5/2010 | Bharitkar et al. |
| 7,742,740 B2 | 6/2010 | Goldberg et al. |
| 7,769,183 B2 | 8/2010 | Bharitkar et al. |
| 7,796,068 B2 | 9/2010 | Raz et al. |
| 7,835,689 B2 | 11/2010 | Goldberg et al. |
| 7,853,341 B2 | 12/2010 | McCarty et al. |
| 7,876,903 B2 | 1/2011 | Sauk |
| 7,925,203 B2 | 4/2011 | Lane et al. |
| 7,949,140 B2 | 5/2011 | Kino |
| 7,949,707 B2 | 5/2011 | McDowall et al. |
| 7,961,893 B2 | 6/2011 | Kino |
| 7,970,922 B2 | 6/2011 | Svendsen |
| 7,987,294 B2 | 7/2011 | Bryce et al. |
| 8,005,228 B2 | 8/2011 | Bharitkar et al. |
| 8,014,423 B2 | 9/2011 | Thaler et al. |
| 8,045,721 B2 | 10/2011 | Burgan et al. |
| 8,045,952 B2 | 10/2011 | Qureshey et al. |
| 8,050,652 B2 | 11/2011 | Qureshey et al. |
| 8,063,698 B2 | 11/2011 | Howard |
| 8,074,253 B1 | 12/2011 | Nathan |
| 8,103,009 B2 | 1/2012 | McCarty et al. |
| 8,116,476 B2 | 2/2012 | Inohara |
| 8,126,172 B2 | 2/2012 | Horbach et al. |
| 8,131,390 B2 | 3/2012 | Braithwaite et al. |
| 8,139,774 B2 | 3/2012 | Berardi et al. |
| 8,144,883 B2 | 3/2012 | Pedersen et al. |
| 8,160,276 B2 | 4/2012 | Liao et al. |
| 8,160,281 B2 | 4/2012 | Kim et al. |
| 8,170,260 B2 | 5/2012 | Reining et al. |
| 8,175,292 B2 | 5/2012 | Aylward et al. |
| 8,175,297 B1 | 5/2012 | Ho et al. |
| 8,194,874 B2 | 6/2012 | Starobin et al. |
| 8,229,125 B2 | 7/2012 | Short |
| 8,233,632 B1 | 7/2012 | MacDonald et al. |
| 8,234,395 B2 | 7/2012 | Millington et al. |
| 8,238,547 B2 | 8/2012 | Ohki et al. |
| 8,238,578 B2 | 8/2012 | Aylward |
| 8,243,961 B1 | 8/2012 | Morrill |
| 8,264,408 B2 | 9/2012 | Kainulainen et al. |
| 8,265,310 B2 | 9/2012 | Berardi et al. |
| 8,270,620 B2 | 9/2012 | Christensen et al. |
| 8,279,709 B2 | 10/2012 | Choisel et al. |
| 8,281,001 B2 | 10/2012 | Busam et al. |
| 8,290,185 B2 | 10/2012 | Kim |
| 8,291,349 B1 | 10/2012 | Park et al. |
| 8,300,845 B2 | 10/2012 | Zurek et al. |
| 8,306,235 B2 | 11/2012 | Mahowald |
| 8,325,931 B2 | 12/2012 | Howard et al. |
| 8,325,935 B2 | 12/2012 | Rutschman |
| 8,325,944 B1 | 12/2012 | Duwenhorst et al. |
| 8,331,585 B2 | 12/2012 | Hagen et al. |
| 8,332,414 B2 | 12/2012 | Nguyen et al. |
| 8,379,876 B2 | 2/2013 | Zhang |
| 8,391,501 B2 | 3/2013 | Khawand et al. |
| 8,392,505 B2 | 3/2013 | Haughay et al. |
| 8,401,202 B2 | 3/2013 | Brooking |
| 8,433,076 B2 | 4/2013 | Zurek et al. |
| 8,452,020 B2 | 5/2013 | Gregg et al. |

(56) References Cited

U.S. PATENT DOCUMENTS

| | | |
|---|---|---|
| 8,463,184 B2 | 6/2013 | Dua |
| 8,483,853 B1 | 7/2013 | Lambourne et al. |
| 8,488,799 B2 | 7/2013 | Goldstein et al. |
| 8,503,669 B2 | 8/2013 | Mao |
| 8,527,876 B2 | 9/2013 | Wood et al. |
| 8,577,045 B2 | 11/2013 | Gibbs |
| 8,577,048 B2 | 11/2013 | Chaikin et al. |
| 8,600,075 B2 | 12/2013 | Lim |
| 8,620,006 B2 | 12/2013 | Berardi et al. |
| 8,682,002 B2 | 3/2014 | Wihardja et al. |
| 8,731,206 B1 | 5/2014 | Park |
| 8,755,538 B2 | 6/2014 | Kwon |
| 8,798,280 B2 | 8/2014 | Goldberg et al. |
| 8,819,554 B2 | 8/2014 | Basso et al. |
| 8,831,244 B2 | 9/2014 | Apfel |
| 8,855,319 B2 | 10/2014 | Liu et al. |
| 8,862,273 B2 | 10/2014 | Karr |
| 8,879,761 B2 | 11/2014 | Johnson et al. |
| 8,903,526 B2 | 12/2014 | Beckhardt et al. |
| 8,914,559 B2 | 12/2014 | Kalayjian et al. |
| 8,930,005 B2 | 1/2015 | Reimann et al. |
| 8,934,647 B2 | 1/2015 | Joyce et al. |
| 8,934,655 B2 | 1/2015 | Breen et al. |
| 8,942,252 B2 | 1/2015 | Balassanian et al. |
| 8,965,033 B2 | 2/2015 | Wiggins |
| 8,965,546 B2 | 2/2015 | Visser et al. |
| 8,977,974 B2 | 3/2015 | Kraut |
| 8,984,442 B2 | 3/2015 | Pirnack et al. |
| 8,989,406 B2 | 3/2015 | Wong et al. |
| 8,995,687 B2 | 3/2015 | Marino, Jr. et al. |
| 8,995,688 B1 | 3/2015 | Chemtob et al. |
| 8,996,370 B2 | 3/2015 | Ansell |
| 9,020,153 B2 | 4/2015 | Britt, Jr. |
| 9,021,153 B2 | 4/2015 | Lu |
| 9,065,929 B2 | 6/2015 | Chen et al. |
| 9,084,058 B2 | 7/2015 | Reilly et al. |
| 9,100,766 B2 | 8/2015 | Soulodre et al. |
| 9,106,192 B2 | 8/2015 | Sheen et al. |
| 9,179,233 B2 | 11/2015 | Kang |
| 9,215,545 B2 | 12/2015 | Dublin et al. |
| 9,219,460 B2 | 12/2015 | Bush |
| 9,231,545 B2 | 1/2016 | Agustin et al. |
| 9,264,839 B2 | 2/2016 | Oishi et al. |
| 9,286,384 B2 | 3/2016 | Kuper et al. |
| 9,288,597 B2 | 3/2016 | Carlsson et al. |
| 9,300,266 B2 | 3/2016 | Grokop |
| 9,307,340 B2 | 4/2016 | Seefeldt |
| 9,319,816 B1 | 4/2016 | Narayanan |
| 9,398,392 B2 | 7/2016 | Ridihalgh et al. |
| 9,451,377 B2 | 9/2016 | Massey et al. |
| 9,462,399 B2 | 10/2016 | Bharitkar et al. |
| 9,467,779 B2 | 10/2016 | Iyengar et al. |
| 9,472,201 B1 | 10/2016 | Sleator |
| 9,473,207 B2 | 10/2016 | McCormack et al. |
| 9,489,948 B1 | 11/2016 | Chu et al. |
| 9,524,098 B2 | 12/2016 | Griffiths et al. |
| 9,538,305 B2 | 1/2017 | Lehnert et al. |
| 9,538,308 B2 | 1/2017 | Isaac et al. |
| 9,544,701 B1 | 1/2017 | Rappoport |
| 9,560,449 B2 | 1/2017 | Carlsson et al. |
| 9,560,460 B2 | 1/2017 | Chaikin et al. |
| 9,609,383 B1 | 3/2017 | Hirst |
| 9,615,171 B1 | 4/2017 | O'Neill et al. |
| 9,648,422 B2 | 5/2017 | Sheen et al. |
| 9,674,625 B2 | 6/2017 | Armstrong-Muntner et al. |
| 9,686,625 B2 | 6/2017 | Patel |
| 9,689,960 B1 | 6/2017 | Barton et al. |
| 9,690,271 B2 | 6/2017 | Sheen et al. |
| 9,699,582 B2 | 7/2017 | Sheerin et al. |
| 9,706,323 B2 | 7/2017 | Sheen et al. |
| 9,723,420 B2 | 8/2017 | Family et al. |
| 9,729,984 B2 | 8/2017 | Tan et al. |
| 9,743,207 B1 | 8/2017 | Hartung |
| 9,743,208 B2 | 8/2017 | Oishi et al. |
| 9,763,018 B1 | 9/2017 | McPherson et al. |
| 9,788,113 B2 | 10/2017 | Wilberding et al. |
| 9,860,662 B2 | 1/2018 | Jarvis et al. |
| 9,864,574 B2 | 1/2018 | Hartung et al. |
| 9,910,634 B2 | 3/2018 | Sheen |
| 9,913,056 B2 | 3/2018 | Master et al. |
| 9,984,703 B2 | 5/2018 | Ur et al. |
| 10,045,142 B2 | 8/2018 | McPherson et al. |
| 10,125,006 B2 | 11/2018 | Jacobsen et al. |
| 10,127,006 B2 | 11/2018 | Sheen |
| 10,154,359 B2 | 12/2018 | Sheen |
| 10,206,052 B2 | 2/2019 | Perianu |
| 10,299,061 B1 | 5/2019 | Sheen |
| 10,402,154 B2 | 9/2019 | Hartung et al. |
| 2001/0038702 A1 | 11/2001 | Lavoie et al. |
| 2001/0042107 A1 | 11/2001 | Palm |
| 2001/0043592 A1 | 11/2001 | Jimenez et al. |
| 2001/0053228 A1 | 12/2001 | Jones |
| 2002/0022453 A1 | 2/2002 | Balog et al. |
| 2002/0026442 A1 | 2/2002 | Lipscomb et al. |
| 2002/0078161 A1 | 6/2002 | Cheng |
| 2002/0089529 A1 | 7/2002 | Robbin |
| 2002/0124097 A1 | 9/2002 | Isely et al. |
| 2002/0126852 A1 | 9/2002 | Kashani et al. |
| 2002/0136414 A1 | 9/2002 | Jordan et al. |
| 2002/0146136 A1 | 10/2002 | Carter et al. |
| 2003/0002689 A1 | 1/2003 | Folio |
| 2003/0031334 A1 | 2/2003 | Layton et al. |
| 2003/0081115 A1 | 5/2003 | Curry et al. |
| 2003/0157951 A1 | 8/2003 | Hasty |
| 2003/0159569 A1 | 8/2003 | Ohta |
| 2003/0161479 A1 | 8/2003 | Yang et al. |
| 2003/0161492 A1 | 8/2003 | Miller et al. |
| 2003/0179891 A1 | 9/2003 | Rabinowitz et al. |
| 2003/0235311 A1 | 12/2003 | Grancea et al. |
| 2004/0024478 A1 | 2/2004 | Hans et al. |
| 2004/0114771 A1 | 6/2004 | Vaughan et al. |
| 2004/0131338 A1 | 7/2004 | Asada et al. |
| 2004/0237750 A1 | 12/2004 | Smith et al. |
| 2005/0031143 A1 | 2/2005 | Devantier et al. |
| 2005/0063554 A1 | 3/2005 | Devantier et al. |
| 2005/0147261 A1 | 7/2005 | Yeh |
| 2005/0157885 A1 | 7/2005 | Olney et al. |
| 2005/0276425 A1 | 12/2005 | Forrester et al. |
| 2006/0008256 A1 | 1/2006 | Khedouri et al. |
| 2006/0026521 A1 | 2/2006 | Hotelling et al. |
| 2006/0032357 A1 | 2/2006 | Roovers et al. |
| 2006/0153391 A1 | 7/2006 | Hooley et al. |
| 2006/0195480 A1 | 8/2006 | Spiegelman et al. |
| 2006/0225097 A1 | 10/2006 | Lawrence-Apfelbaum |
| 2007/0003067 A1 | 1/2007 | Gierl et al. |
| 2007/0025559 A1 | 2/2007 | Mihelich et al. |
| 2007/0032895 A1 | 2/2007 | Nackvi et al. |
| 2007/0038999 A1 | 2/2007 | Millington et al. |
| 2007/0086597 A1 | 4/2007 | Kino |
| 2007/0116254 A1 | 5/2007 | Looney et al. |
| 2007/0121955 A1 | 5/2007 | Johnston et al. |
| 2007/0142944 A1 | 6/2007 | Goldberg et al. |
| 2008/0002839 A1 | 1/2008 | Eng |
| 2008/0014989 A1 | 1/2008 | Sandegard et al. |
| 2008/0065247 A1 | 3/2008 | Igoe et al. |
| 2008/0069378 A1 | 3/2008 | Rabinowitz et al. |
| 2008/0077261 A1 | 3/2008 | Baudino et al. |
| 2008/0098027 A1 | 4/2008 | Aarts |
| 2008/0136623 A1 | 6/2008 | Calvarese |
| 2008/0144864 A1 | 6/2008 | Huon et al. |
| 2008/0175411 A1 | 7/2008 | Greve |
| 2008/0214160 A1 | 9/2008 | Jonsson |
| 2008/0232603 A1 | 9/2008 | Soulodre et al. |
| 2008/0266385 A1 | 10/2008 | Smith et al. |
| 2008/0281523 A1 | 11/2008 | Dahl et al. |
| 2009/0003613 A1 | 1/2009 | Christensen et al. |
| 2009/0024662 A1 | 1/2009 | Park et al. |
| 2009/0047993 A1 | 2/2009 | Vasa |
| 2009/0063274 A1 | 3/2009 | Dublin, III et al. |
| 2009/0110218 A1 | 4/2009 | Swain |
| 2009/0138507 A1 | 5/2009 | Burckart et al. |
| 2009/0147134 A1 | 6/2009 | Iwamatsu |
| 2009/0175476 A1 | 7/2009 | Bottum |
| 2009/0180632 A1 | 7/2009 | Goldberg et al. |

(56) References Cited

U.S. PATENT DOCUMENTS

| | | |
|---|---|---|
| 2009/0196428 A1 | 8/2009 | Kim |
| 2009/0202082 A1 | 8/2009 | Bharitkar et al. |
| 2009/0252481 A1 | 10/2009 | Ekstrand |
| 2009/0285404 A1 | 11/2009 | Hsu et al. |
| 2009/0304194 A1 | 12/2009 | Eggleston et al. |
| 2009/0304205 A1 | 12/2009 | Hardacker et al. |
| 2009/0316923 A1 | 12/2009 | Tashev et al. |
| 2010/0013550 A1 | 1/2010 | Tanaka |
| 2010/0095332 A1 | 4/2010 | Gran et al. |
| 2010/0104114 A1 | 4/2010 | Chapman |
| 2010/0128902 A1 | 5/2010 | Liu et al. |
| 2010/0135501 A1 | 6/2010 | Corbett et al. |
| 2010/0142735 A1 | 6/2010 | Yoon et al. |
| 2010/0146445 A1 | 6/2010 | Kraut |
| 2010/0162117 A1 | 6/2010 | Basso et al. |
| 2010/0189203 A1 | 7/2010 | Wilhelmsson et al. |
| 2010/0195846 A1 | 8/2010 | Yokoyama |
| 2010/0272270 A1 | 10/2010 | Chaikin et al. |
| 2010/0296659 A1 | 11/2010 | Tanaka |
| 2010/0303248 A1 | 12/2010 | Tawada |
| 2010/0303250 A1 | 12/2010 | Goldberg et al. |
| 2010/0323793 A1 | 12/2010 | Andall |
| 2011/0007904 A1 | 1/2011 | Tomoda et al. |
| 2011/0007905 A1 | 1/2011 | Sato et al. |
| 2011/0029111 A1 | 2/2011 | Sabin et al. |
| 2011/0087842 A1 | 4/2011 | Lu et al. |
| 2011/0091055 A1 | 4/2011 | Leblanc |
| 2011/0135103 A1 | 6/2011 | Sun et al. |
| 2011/0150228 A1 | 6/2011 | Yoon et al. |
| 2011/0150230 A1 | 6/2011 | Tanaka |
| 2011/0150247 A1 | 6/2011 | Oliveras |
| 2011/0170710 A1 | 7/2011 | Son |
| 2011/0234480 A1 | 9/2011 | Fino et al. |
| 2011/0235808 A1 | 9/2011 | Kon |
| 2011/0268281 A1 | 11/2011 | Florencio et al. |
| 2011/0293123 A1 | 12/2011 | Neumeyer et al. |
| 2012/0032928 A1 | 2/2012 | Alberth et al. |
| 2012/0051558 A1 | 3/2012 | Kim et al. |
| 2012/0057724 A1 | 3/2012 | Rabinowitz et al. |
| 2012/0063615 A1 | 3/2012 | Crockett et al. |
| 2012/0093320 A1 | 4/2012 | Flaks et al. |
| 2012/0127831 A1 | 5/2012 | Gicklhorn et al. |
| 2012/0140936 A1 | 6/2012 | Bonnick et al. |
| 2012/0148075 A1 | 6/2012 | Goh et al. |
| 2012/0183156 A1 | 7/2012 | Schlessinger et al. |
| 2012/0184335 A1 | 7/2012 | Kim et al. |
| 2012/0213391 A1 | 8/2012 | Usami et al. |
| 2012/0215530 A1 | 8/2012 | Harsch et al. |
| 2012/0237037 A1 | 9/2012 | Ninan et al. |
| 2012/0243697 A1 | 9/2012 | Frye et al. |
| 2012/0263325 A1 | 10/2012 | Freeman et al. |
| 2012/0268145 A1 | 10/2012 | Chandra et al. |
| 2012/0269356 A1 | 10/2012 | Sheerin et al. |
| 2012/0275613 A1 | 11/2012 | Soulodre et al. |
| 2012/0283593 A1 | 11/2012 | Searchfield et al. |
| 2012/0288124 A1 | 11/2012 | Fejzo et al. |
| 2013/0003981 A1 | 1/2013 | Lane |
| 2013/0010970 A1 | 1/2013 | Hegarty et al. |
| 2013/0019193 A1 | 1/2013 | Rhee et al. |
| 2013/0028443 A1 | 1/2013 | Pance et al. |
| 2013/0051572 A1 | 2/2013 | Goh et al. |
| 2013/0066453 A1 | 3/2013 | Seefeldt |
| 2013/0108055 A1 | 5/2013 | Hanna et al. |
| 2013/0129102 A1 | 5/2013 | Li et al. |
| 2013/0129122 A1 | 5/2013 | Johnson et al. |
| 2013/0166227 A1 | 6/2013 | Hermann et al. |
| 2013/0170647 A1 | 7/2013 | Reilly et al. |
| 2013/0179535 A1 | 7/2013 | Baalu et al. |
| 2013/0202131 A1 | 8/2013 | Kemmochi et al. |
| 2013/0211843 A1 | 8/2013 | Clarkson |
| 2013/0216071 A1 | 8/2013 | Maher et al. |
| 2013/0223642 A1 | 8/2013 | Warren et al. |
| 2013/0230175 A1 | 9/2013 | Bech et al. |
| 2013/0259254 A1 | 10/2013 | Xiang et al. |
| 2013/0279706 A1 | 10/2013 | Marti et al. |
| 2013/0305152 A1 | 11/2013 | Griffiths et al. |
| 2013/0315405 A1 | 11/2013 | Kanishima et al. |
| 2013/0329896 A1 | 12/2013 | Krishnaswamy et al. |
| 2013/0331970 A1 | 12/2013 | Beckhardt et al. |
| 2013/0346559 A1 | 12/2013 | Van Erven et al. |
| 2014/0003611 A1 | 1/2014 | Mohammad et al. |
| 2014/0003622 A1 | 1/2014 | Ikizyan et al. |
| 2014/0003623 A1 | 1/2014 | Lang |
| 2014/0003625 A1 | 1/2014 | Sheen et al. |
| 2014/0003626 A1 | 1/2014 | Holman et al. |
| 2014/0003635 A1 | 1/2014 | Mohammad et al. |
| 2014/0006587 A1 | 1/2014 | Kusano |
| 2014/0016784 A1 | 1/2014 | Sen et al. |
| 2014/0016786 A1 | 1/2014 | Sen |
| 2014/0016802 A1 | 1/2014 | Sen |
| 2014/0023196 A1 | 1/2014 | Xiang et al. |
| 2014/0029201 A1 | 1/2014 | Yang et al. |
| 2014/0032709 A1 | 1/2014 | Saussy et al. |
| 2014/0037097 A1 | 2/2014 | Labosco |
| 2014/0037107 A1 | 2/2014 | Marino, Jr. et al. |
| 2014/0052770 A1 | 2/2014 | Gran et al. |
| 2014/0064501 A1 | 3/2014 | Olsen et al. |
| 2014/0079242 A1 | 3/2014 | Nguyen et al. |
| 2014/0084014 A1 | 3/2014 | Sim et al. |
| 2014/0086423 A1 | 3/2014 | Domingo Yaguez et al. |
| 2014/0112481 A1 | 4/2014 | Li et al. |
| 2014/0119551 A1 | 5/2014 | Bharitkar et al. |
| 2014/0126730 A1 | 5/2014 | Crawley et al. |
| 2014/0161265 A1 | 6/2014 | Chaikin et al. |
| 2014/0169569 A1 | 6/2014 | Toivanen et al. |
| 2014/0180684 A1 | 6/2014 | Strub |
| 2014/0192986 A1 | 7/2014 | Lee et al. |
| 2014/0219456 A1 | 8/2014 | Morrell et al. |
| 2014/0219483 A1 | 8/2014 | Hong |
| 2014/0226823 A1 | 8/2014 | Sen et al. |
| 2014/0242913 A1 | 8/2014 | Pang |
| 2014/0267148 A1 | 9/2014 | Luna et al. |
| 2014/0270202 A1 | 9/2014 | Ivanov et al. |
| 2014/0270282 A1 | 9/2014 | Tammi et al. |
| 2014/0273859 A1 | 9/2014 | Luna et al. |
| 2014/0274212 A1 | 9/2014 | Zurek et al. |
| 2014/0279889 A1 | 9/2014 | Luna et al. |
| 2014/0285313 A1 | 9/2014 | Luna et al. |
| 2014/0286496 A1 | 9/2014 | Luna et al. |
| 2014/0294200 A1 | 10/2014 | Baumgarte et al. |
| 2014/0294201 A1 | 10/2014 | Johnson et al. |
| 2014/0310269 A1 | 10/2014 | Zhang et al. |
| 2014/0321670 A1 | 10/2014 | Nystrom et al. |
| 2014/0323036 A1 | 10/2014 | Daley et al. |
| 2014/0334644 A1 | 11/2014 | Selig et al. |
| 2014/0341399 A1 | 11/2014 | Dusse |
| 2014/0344689 A1 | 11/2014 | Scott et al. |
| 2014/0355768 A1 | 12/2014 | Sen et al. |
| 2014/0355794 A1 | 12/2014 | Morrell et al. |
| 2014/0364056 A1 | 12/2014 | Belk et al. |
| 2015/0011195 A1 | 1/2015 | Li |
| 2015/0016642 A1 | 1/2015 | Walsh et al. |
| 2015/0023509 A1 | 1/2015 | Devantier et al. |
| 2015/0031287 A1 | 1/2015 | Pang et al. |
| 2015/0032844 A1 | 1/2015 | Tarr et al. |
| 2015/0036847 A1 | 2/2015 | Donaldson |
| 2015/0036848 A1 | 2/2015 | Donaldson |
| 2015/0043736 A1 | 2/2015 | Olsen et al. |
| 2015/0063610 A1 | 3/2015 | Mossner |
| 2015/0078586 A1 | 3/2015 | Ang et al. |
| 2015/0078596 A1 | 3/2015 | Sprogis et al. |
| 2015/0100991 A1 | 4/2015 | Risberg et al. |
| 2015/0146886 A1 | 5/2015 | Baumgarte |
| 2015/0149943 A1 | 5/2015 | Nguyen et al. |
| 2015/0161360 A1 | 6/2015 | Paruchuri et al. |
| 2015/0195666 A1 | 7/2015 | Massey et al. |
| 2015/0201274 A1 | 7/2015 | Ellner et al. |
| 2015/0208184 A1 | 7/2015 | Tan et al. |
| 2015/0212788 A1 | 7/2015 | Lang |
| 2015/0220558 A1 | 8/2015 | Snibbe et al. |
| 2015/0223002 A1 | 8/2015 | Mehta et al. |
| 2015/0229699 A1 | 8/2015 | Liu |
| 2015/0260754 A1 | 9/2015 | Perotti et al. |
| 2015/0264023 A1 | 9/2015 | Reno |

(56) References Cited

U.S. PATENT DOCUMENTS

| | | |
|---|---|---|
| 2015/0271616 A1 | 9/2015 | Kechichian et al. |
| 2015/0271620 A1 | 9/2015 | Lando et al. |
| 2015/0281866 A1 | 10/2015 | Williams et al. |
| 2015/0286360 A1 | 10/2015 | Wachter |
| 2015/0289064 A1 | 10/2015 | Jensen et al. |
| 2015/0358756 A1 | 12/2015 | Harma et al. |
| 2015/0382128 A1 | 12/2015 | Ridihalgh et al. |
| 2016/0007116 A1 | 1/2016 | Holman |
| 2016/0011846 A1 | 1/2016 | Sheen |
| 2016/0011850 A1 | 1/2016 | Sheen et al. |
| 2016/0014509 A1 | 1/2016 | Hansson et al. |
| 2016/0014510 A1 | 1/2016 | Sheen |
| 2016/0014511 A1 | 1/2016 | Sheen et al. |
| 2016/0014534 A1 | 1/2016 | Sheen |
| 2016/0014536 A1 | 1/2016 | Sheen |
| 2016/0021458 A1 | 1/2016 | Johnson et al. |
| 2016/0021473 A1 | 1/2016 | Riggi et al. |
| 2016/0021481 A1 | 1/2016 | Johnson et al. |
| 2016/0027467 A1 | 1/2016 | Proud |
| 2016/0029142 A1 | 1/2016 | Isaac et al. |
| 2016/0035337 A1 | 2/2016 | Aggarwal |
| 2016/0036881 A1 | 2/2016 | Tembey et al. |
| 2016/0037277 A1 | 2/2016 | Matsumoto et al. |
| 2016/0061597 A1 | 3/2016 | De Bruijn |
| 2016/0070526 A1 | 3/2016 | Sheen |
| 2016/0073210 A1 | 3/2016 | Sheen |
| 2016/0088438 A1 | 3/2016 | O'Keeffe |
| 2016/0119730 A1 | 4/2016 | Virtanen |
| 2016/0140969 A1 | 5/2016 | Srinivasan et al. |
| 2016/0165297 A1 | 6/2016 | Jamal-Syed et al. |
| 2016/0192098 A1 | 6/2016 | Oishi et al. |
| 2016/0192099 A1 | 6/2016 | Oishi et al. |
| 2016/0212535 A1 | 7/2016 | Le Nerriec et al. |
| 2016/0239255 A1 | 8/2016 | Chavez et al. |
| 2016/0254696 A1 | 9/2016 | Plumb et al. |
| 2016/0260140 A1 | 9/2016 | Shirley et al. |
| 2016/0309276 A1 | 10/2016 | Ridihalgh et al. |
| 2016/0313971 A1 | 10/2016 | Bierbower et al. |
| 2016/0316305 A1 | 10/2016 | Sheen et al. |
| 2016/0330562 A1 | 11/2016 | Crockett |
| 2016/0353018 A1 | 12/2016 | Anderson et al. |
| 2016/0366517 A1 | 12/2016 | Chandran et al. |
| 2017/0026769 A1 | 1/2017 | Patel |
| 2017/0041724 A1 | 2/2017 | Master et al. |
| 2017/0069338 A1 | 3/2017 | Elliot et al. |
| 2017/0083279 A1 | 3/2017 | Sheen et al. |
| 2017/0086003 A1 | 3/2017 | Rabinowitz et al. |
| 2017/0105084 A1 | 4/2017 | Holman |
| 2017/0142532 A1 | 5/2017 | Pan |
| 2017/0207762 A1 | 7/2017 | Porter et al. |
| 2017/0223447 A1 | 8/2017 | Johnson et al. |
| 2017/0230772 A1 | 8/2017 | Johnson et al. |
| 2017/0257722 A1 | 9/2017 | Kerdranvat et al. |
| 2017/0280265 A1 | 9/2017 | Po |
| 2017/0303039 A1 | 10/2017 | Iyer et al. |
| 2017/0311108 A1 | 10/2017 | Patel et al. |
| 2017/0374482 A1 | 12/2017 | McPherson et al. |
| 2018/0122378 A1 | 5/2018 | Mixter et al. |
| 2019/0037328 A1 | 1/2019 | McPherson et al. |

FOREIGN PATENT DOCUMENTS

| | | |
|---|---|---|
| CN | 1984507 A | 6/2007 |
| CN | 101047777 A | 10/2007 |
| CN | 101366177 A | 2/2009 |
| CN | 101491116 A | 7/2009 |
| CN | 101681219 A | 3/2010 |
| CN | 101754087 A | 6/2010 |
| CN | 101800051 A | 8/2010 |
| CN | 102318325 A | 1/2012 |
| CN | 102823277 A | 12/2012 |
| CN | 102893633 A | 1/2013 |
| CN | 103491397 A | 1/2014 |
| CN | 103988523 A | 8/2014 |
| CN | 104219604 A | 12/2014 |
| CN | 104247461 A | 12/2014 |
| CN | 104284291 A | 1/2015 |
| CN | 104584061 A | 4/2015 |
| CN | 105163221 A | 12/2015 |
| EP | 0505949 A1 | 9/1992 |
| EP | 0772374 A2 | 5/1997 |
| EP | 1133896 B1 | 8/2002 |
| EP | 1349427 A2 | 10/2003 |
| EP | 1389853 A1 | 2/2004 |
| EP | 2043381 A2 | 4/2009 |
| EP | 1349427 B1 | 12/2009 |
| EP | 2161950 A2 | 3/2010 |
| EP | 2194471 A1 | 6/2010 |
| EP | 2197220 A2 | 6/2010 |
| EP | 2288178 A1 | 2/2011 |
| EP | 2429155 A1 | 3/2012 |
| EP | 1825713 B1 | 10/2012 |
| EP | 2613573 A1 | 7/2013 |
| EP | 2591617 B1 | 6/2014 |
| EP | 2835989 A2 | 2/2015 |
| EP | 2860992 A1 | 4/2015 |
| EP | 2874413 A1 | 5/2015 |
| EP | 3128767 A2 | 2/2017 |
| EP | 2974382 B1 | 4/2017 |
| EP | 2986034 B1 | 5/2017 |
| EP | 3285502 A1 | 2/2018 |
| JP | H02280199 A | 11/1990 |
| JP | H05199593 A | 8/1993 |
| JP | H05211700 A | 8/1993 |
| JP | H06327089 A | 11/1994 |
| JP | H0723490 A | 1/1995 |
| JP | H1069280 A | 3/1998 |
| JP | H110307592 A | 11/1998 |
| JP | 2002502193 A | 1/2002 |
| JP | 2003143252 A | 5/2003 |
| JP | 2003304590 A | 10/2003 |
| JP | 2005086686 A | 3/2005 |
| JP | 2005538633 A | 12/2005 |
| JP | 2006017893 A | 1/2006 |
| JP | 2006180039 A | 7/2006 |
| JP | 2006340285 A | 12/2006 |
| JP | 2007068125 A | 3/2007 |
| JP | 2007271802 A | 10/2007 |
| JP | 2008228133 A | 9/2008 |
| JP | 2009188474 A | 8/2009 |
| JP | 2010056970 A | 3/2010 |
| JP | 2010081124 A | 4/2010 |
| JP | 2010141892 A | 6/2010 |
| JP | 2011123376 A | 6/2011 |
| JP | 2011130212 A | 6/2011 |
| JP | 2011164166 A | 8/2011 |
| JP | 2011217068 A | 10/2011 |
| JP | 2013247456 A | 12/2013 |
| JP | 2013253884 A | 12/2013 |
| JP | 6356331 B2 | 7/2018 |
| JP | 6567735 B2 | 8/2019 |
| KR | 1020060116383 | 11/2006 |
| KR | 1020080011831 | 2/2008 |
| WO | 200153994 | 7/2001 |
| WO | 0182650 A2 | 11/2001 |
| WO | 200182650 | 11/2001 |
| WO | 2003093950 A2 | 11/2003 |
| WO | 2004066673 A1 | 8/2004 |
| WO | 2007016465 A2 | 2/2007 |
| WO | 2011139502 A1 | 11/2011 |
| WO | 2013016500 A1 | 1/2013 |
| WO | 2013126603 A1 | 8/2013 |
| WO | 2014032709 | 3/2014 |
| WO | 2014032709 A1 | 3/2014 |
| WO | 2014036121 A1 | 3/2014 |
| WO | 2015024881 A1 | 2/2015 |
| WO | 2015108794 A1 | 7/2015 |
| WO | 2015178950 A1 | 11/2015 |

(56) References Cited

FOREIGN PATENT DOCUMENTS

WO 2016040324 A1 3/2016
WO 2017049169 A1 3/2017

OTHER PUBLICATIONS

Notice of Allowance dated Feb. 1, 2018, issued in connection with U.S. Appl. No. 15/480,265, filed Apr. 5, 2017, 8 pages.
Notice of Allowance dated Apr. 10, 2015, issued in connection with U.S. Appl. No. 13/536,493, filed Jun. 28, 2012, 8 pages.
Notice of Allowance dated Aug. 10, 2018, issued in connection with U.S. Appl. No. 15/785,088, filed Oct. 16, 2017, 6 pages.
Notice of Allowance dated Jul. 10, 2018, issued in connection with U.S. Appl. No. 15/673,170, filed Aug. 9, 2017, 2 pages.
Notice of Allowance dated Dec. 11, 2018, issued in connection with U.S. Appl. No. 15/909,327, filed Mar. 1, 2018, 10 pages.
Notice of Allowance dated Feb. 11, 2019, issued in connection with U.S. Appl. No. 15/588,186, filed May 5, 2017, 5 pages.
Notice of Allowance dated Jul. 11, 2017, issued in connection with U.S. Appl. No. 14/678,248, filed Apr. 3, 2015, 11 pages.
Notice of Allowance dated Mar. 11, 2015, issued in connection with U.S. Appl. No. 13/340,126, filed Dec. 29, 2011, 7 pages.
Notice of Allowance dated Apr. 12, 2016, issued in connection with U.S. Appl. No. 14/681,465, filed Apr. 8, 2015, 13 pages.
Notice of Allowance dated Dec. 12, 2016, issued in connection with U.S. Appl. No. 14/805,140, filed Jul. 21, 2015, 24 pages.
Notice of Allowance dated Dec. 12, 2017, issued in connection with U.S. Appl. No. 14/481,505, filed Sep. 9, 2014, 9 pages.
Notice of Allowance dated Sep. 12, 2016, issued in connection with U.S. Appl. No. 15/066,072, filed Mar. 10, 2016, 7 pages.
Notice of Allowance dated Sep. 12, 2017, issued in connection with U.S. Appl. No. 15/207,682, filed Jul. 12, 2016, 8 pages.
Notice of Allowance dated Feb. 13, 2017, issued in connection with U.S. Appl. No. 14/864,506, filed Sep. 24, 2015, 8 pages.
Notice of Allowance dated Nov. 13, 2017, issued in connection with U.S. Appl. No. 14/726,921, filed Jun. 1, 2015, 8 pages.
Notice of Allowance dated Mar. 14, 2019, issued in connection with U.S. Appl. No. 15/343,996, filed Nov. 4, 2016, 8 pages.
Notice of Allowance dated Jan. 15, 2019, issued in connection with U.S. Appl. No. 16/115,524, filed Aug. 28, 2018, 8 pages.
Notice of Allowance dated Jun. 15, 2017, issued in connection with U.S. Appl. No. 15/096,827, filed Apr. 12, 2016, 5 pages.
Notice of Allowance dated Mar. 15, 2017, issued in connection with U.S. Appl. No. 14/826,856, filed Aug. 14, 2015, 7 pages.
Notice of Allowance dated May 15, 2019, issued in connection with U.S. Appl. No. 16/113,032, filed Aug. 27, 2018, 9 pages.
Notice of Allowance dated Oct. 15, 2018, issued in connection with U.S. Appl. No. 15/716,313, filed Sep. 26, 2017, 10 pages.
Notice of Allowance dated Jun. 16, 2017, issued in connection with U.S. Appl. No. 14/884,001, filed Oct. 15, 2015, 8 pages.
Notice of Allowance dated May 16, 2019, issued in connection with U.S. Appl. No. 16/181,213, filed Nov. 5, 2018, 10 pages.
Notice of Allowance dated Oct. 16, 2017, issued in connection with U.S. Appl. No. 15/478,770, filed Apr. 4, 2017, 10 pages.
Notice of Allowance dated Sep. 16, 2016, issued in connection with U.S. Appl. No. 15/066,049, filed Mar. 10, 2016, 7 pages.
Notice of Allowance dated Dec. 17, 2018, issued in connection with U.S. Appl. No. 16/055,884, filed Aug. 6, 2018, 5 pages.
Notice of Allowance dated May 17, 2017, issued in connection with U.S. Appl. No. 15/339,260, filed Oct. 31, 2016, 7 pages.
Notice of Allowance dated Mar. 18, 2019, issued in connection with U.S. Appl. No. 16/056,862, filed Aug. 7, 2018, 12 pages.
Notice of Allowance dated Aug. 19, 2016, issued in connection with U.S. Appl. No. 14/644,136, filed Mar. 10, 2015, 12 pages.
Notice of Allowance dated Jun. 19, 2017, issued in connection with U.S. Appl. No. 14/793,190, filed Jul. 7, 2015, 5 pages.
Notice of Allowance dated Sep. 19, 2017, issued in connection with U.S. Appl. No. 14/793,205, filed Jul. 7, 2015, 16 pages.
Notice of Allowance dated Sep. 19, 2018, issued in connection with U.S. Appl. No. 14/864,393, filed Sep. 24, 2015, 10 pages.
Notice of Allowance dated Apr. 20, 2017, issued in connection with U.S. Appl. No. 14/940,779, filed Nov. 13, 2015, 11 pages.
Notice of Allowance dated Nov. 20, 2017, issued in connection with U.S. Appl. No. 15/298,115, filed Oct. 19, 2016, 10 pages.
Notice of Allowance dated Sep. 20, 2017, issued in connection with U.S. Appl. No. 14/481,514, filed Sep. 9, 2014, 10 pages.
Notice of Allowance dated Dec. 21, 2016, issued in connection with U.S. Appl. No. 14/682,182, filed Apr. 9, 2015, 8 pages.
Notice of Allowance dated Feb. 21, 2018, issued in connection with U.S. Appl. No. 15/005,853, filed Jan. 25, 2016, 5 pages.
Notice of Allowance dated Jul. 21, 2017, issued in connection with U.S. Appl. No. 15/211,835, filed Jul. 15, 2016, 10 pages.
Notice of Allowance dated Jun. 21, 2019, issued in connection with U.S. Appl. No. 15/235,598, filed Aug. 12, 2016, 11 pages.
Notice of Allowance dated Jun. 22, 2017, issued in connection with U.S. Appl. No. 14/644,136, filed Mar. 10, 2015, 12 pages.
Notice of Allowance dated Aug. 23, 2018, issued in connection with U.S. Appl. No. 15/909,529, filed Mar. 1, 2018, 8 pages.
Notice of Allowance dated Jun. 23, 2016, issued in connection with U.S. Appl. No. 14/921,781, filed Oct. 23, 2015, 8 pages.
Notice of Allowance dated May 23, 2018, issued in connection with U.S. Appl. No. 15/698,283, filed Sep. 7, 2017, 8 pages.
Notice of Allowance dated Oct. 23, 2017, issued in connection with U.S. Appl. No. 14/481,522, filed Sep. 9, 2014, 16 pages.
Notice of Allowance dated Sep. 23, 2016, issued in connection with U.S. Appl. No. 15/070,160, filed Mar. 15, 2016, 7 pages.
Notice of Allowance dated Jul. 24, 2019, issued in connection with U.S. Appl. No. 15/229,693, filed Aug. 5, 2016, 13 pages.
Notice of Allowance dated May 24, 2017, issued in connection with U.S. Appl. No. 14/997,868, filed Jan. 18, 2016, 5 pages.
Notice of Allowance dated Nov. 24, 2017, issued in connection with U.S. Appl. No. 15/681,640, filed Aug. 21, 2017, 8 pages.
Notice of Allowance dated Apr. 25, 2017, issued in connection with U.S. Appl. No. 14/696,014, filed Apr. 24, 2015, 7 pages.
Notice of Allowance dated Apr. 25, 2017, issued in connection with U.S. Appl. No. 15/207,682, filed Jul. 12, 2016, 7 pages.
Notice of Allowance dated Apr. 25, 2019, issued in connection with U.S. Appl. No. 15/806,126, filed Nov. 7, 2017, 8 pages.
Notice of Allowance dated Oct. 25, 2016, issued in connection with U.S. Appl. No. 14/826,873, filed Aug. 14, 2015, 5 pages.
Notice of Allowance dated Feb. 26, 2016, issued in connection with U.S. Appl. No. 14/921,762, filed Oct. 23, 2015, 7 pages.
Notice of Allowance dated Jul. 26, 2016, issued in connection with U.S. Appl. No. 14/481,511, filed Sep. 9, 2014, 12 pages.
Notice of Allowance dated Oct. 26, 2016, issued in connection with U.S. Appl. No. 14/811,587, filed Jul. 28, 2015, 11 pages.
Notice of Allowance dated Feb. 27, 2017, issued in connection with U.S. Appl. No. 14/805,340, filed Jul. 21, 2015, 9 pages.
Notice of Allowance dated Jul. 27, 2017, issued in connection with U.S. Appl. No. 15/005,853, filed Jan. 25, 2016, 5 pages.
Notice of Allowance dated Jun. 27, 2017, issued in connection with U.S. Appl. No. 15/344,069, filed Nov. 4, 2016, 8 pages.
Notice of Allowance dated Aug. 28, 2017, issued in connection with U.S. Appl. No. 15/089,004, filed Apr. 1, 2016, 5 pages.
Notice of Allowance dated Jul. 28, 2017, issued in connection with U.S. Appl. No. 14/678,263, filed Apr. 3, 2015, 10 pages.
Notice of Allowance dated Jul. 28, 2017, issued in connection with U.S. Appl. No. 15/211,822, filed Jul. 15, 2016, 9 pages.
Notice of Allowance dated Mar. 28, 2018, issued in connection with U.S. Appl. No. 15/673,170, filed Aug. 9, 2017, 5 pages.
Notice of Allowance dated Aug. 29, 2018, issued in connection with U.S. Appl. No. 15/357,520, filed Nov. 21, 2016, 11 pages.
Notice of Allowance dated Aug. 29, 2018, issued in connection with U.S. Appl. No. 15/718,556, filed Sep. 28, 2017, 8 pages.
Notice of Allowance dated Dec. 29, 2017, issued in connection with U.S. Appl. No. 14/793,205, filed Jul. 7, 2015, 5 pages.
Notice of Allowance dated Jul. 29, 2016, issued in connection with U.S. Appl. No. 14/481,522, filed Sep. 9, 2014, 11 pages.
Notice of Allowance dated Oct. 29, 2015, issued in connection with U.S. Appl. No. 14/216,306, filed Mar. 17, 2014, 9 pages.

(56) References Cited

OTHER PUBLICATIONS

Notice of Allowance dated May 3, 2019, issued in connection with U.S. Appl. No. 15/217,399, filed Jul. 22, 2016, 7 pages.
Notice of Allowance dated May 3, 2019, issued in connection with U.S. Appl. No. 16/181,583, filed Nov. 6, 2018, 7 pages.
Notice of Allowance dated Aug. 30, 2017, issued in connection with U.S. Appl. No. 15/088,994, filed Apr. 1, 2016, 10 pages.
Notice of Allowance dated Dec. 30, 2016, issued in connection with U.S. Appl. No. 14/696,014, filed Apr. 24, 2015, 13 pages.
Notice of Allowance dated Jan. 30, 2017, issued in connection with U.S. Appl. No. 15/339,260, filed Oct. 31, 2016, 8 pages.
Notice of Allowance dated Aug. 31, 2018, issued in connection with U.S. Appl. No. 15/872,979, filed Jan. 16, 2018, 7 pages.
Notice of Allowance dated Aug. 31, 2018, issued in connection with U.S. Appl. No. 16/055,884, filed Aug. 6, 2018, 8 pages.
Notice of Allowance dated Apr. 4, 2017, issued in connection with U.S. Appl. No. 14/682,182, filed Apr. 9, 2015, 8 pages.
Notice of Allowance dated Feb. 4, 2019, issued in connection with U.S. Appl. No. 15/166,241, filed Aug. 26, 2016, 8 pages.
Notice of Allowance dated Feb. 4, 2019, issued in connection with U.S. Appl. No. 16/181,583, filed Nov. 6, 2018, 9 pages.
Notice of Allowance dated Oct. 4, 2018, issued in connection with U.S. Appl. No. 15/166,241, filed May 26, 2016, 7 pages.
Notice of Allowance dated Apr. 5, 2018, issued in connection with U.S. Appl. No. 15/681,640, filed Aug. 21, 2017, 8 pages.
Notice of Allowance dated Jun. 5, 2019, issued in connection with U.S. Appl. No. 15/859,311, filed Dec. 29, 2017, 8 pages.
Notice of Allowance dated Jun. 5, 2019, issued in connection with U.S. Appl. No. 15/865,221, filed Jan. 8, 2018, 8 pages.
Notice of Allowance dated Mar. 5, 2019, issued in connection with U.S. Appl. No. 16/102,499, filed Aug. 13, 2018, 8 pages.
Notice of Allowance dated May 5, 2017, issued in connection with U.S. Appl. No. 14/826,873, filed Aug. 14, 2015, 5 pages.
Notice of Allowance dated Oct. 5, 2018, issued in connection with U.S. Appl. No. 16/115,524, filed Aug. 28, 2018, 10 pages.
Notice of Allowance dated Feb. 6, 2019, issued in connection with U.S. Appl. No. 15/996,878, filed Jun. 4, 2018, 8 pages.
Notice of Allowance dated Apr. 8, 2019, issued in connection with U.S. Appl. No. 16/011,402, filed Jun. 18, 2018, 8 pages.
Notice of Allowance dated Jul. 8, 2019, issued in connection with U.S. Appl. No. 15/856,791, filed Dec. 28, 2017, 5 pages.
Notice of Allowance dated May 8, 2018, issued in connection with U.S. Appl. No. 15/650,386, filed Jul. 14, 2017, 13 pages.
Notice of Allowance dated May 9, 2019, issued in connection with U.S. Appl. No. 15/996,878, filed Jun. 4, 2018, 7 pages.
Notice of Allowance dated Apr. 19, 2017, issued in connection with U.S. Appl. No. 14/481,511, filed Sep. 9, 2014, 10 pages.
Palm, Inc., "Handbook for the Palm VII Handheld," May 2000, 311 pages.
Papp Istvan et al. "Adaptive Microphone Array for Unknown Desired Speaker's Transfer Function", The Journal of the Acoustical Society of America, American Institute of Physics for the Acoustical Society of America, New York, NY vol. 122, No. 2, Jul. 19, 2007, pp. 44-49.
Pre-Brief Appeal Conference Decision mailed on Mar. 19, 2019, issued in connection with U.S. Appl. No. 15/806,126, filed Nov. 7, 2017, 2 pages.
Preinterview First Office Action dated Oct. 6, 2016, issued in connection with U.S. Appl. No. 14/726,921, filed Jun. 1, 2015, 6 pages.
Preinterview First Office Action dated Jul. 12, 2017, issued in connection with U.S. Appl. No. 14/793,205, filed Jul. 7, 2015, 5 pages.
Preinterview First Office Action dated May 17, 2016, issued in connection with U.S. Appl. No. 14/481,505, filed Sep. 9, 2014, 7 pages.
Preinterview First Office Action dated May 25, 2016, issued in connection with U.S. Appl. No. 14/481,514, filed Sep. 9, 2014, 7 pages.
Presentations at WinHEC 2000, May 2000, 138 pages.
PRISMIQ, Inc., "PRISMIQ Media Player User Guide," 2003, 44 pages.
Non-Final Office Action dated Jul. 13, 2016, issued in connection with U.S. Appl. No. 14/940,779, filed Nov. 13, 2015, 16 pages.
Non-Final Office Action dated Dec. 14, 2016, issued in connection with U.S. Appl. No. 14/481,505, filed Sep. 9, 2014, 19 pages.
Non-Final Office Action dated Mar. 14, 2017, issued in connection with U.S. Appl. No. 15/096,827, filed Apr. 12, 2016, 12 pages.
Non-Final Office Action dated May 14, 2019, issued in connection with U.S. Appl. No. 15/955,545, filed Apr. 17, 2018, 15 pages.
Non-Final Office Action dated Oct. 14, 2015, issued in connection with U.S. Appl. No. 14/216,325, filed Mar. 17, 2014, 7 pages.
Non-Final Office Action dated May 15, 2018, issued in connection with U.S. Appl. No. 15/806,126, filed Nov. 7, 2017, 17 pages.
Non-Final Office Action dated Jun. 16, 2017, issued in connection with U.S. Appl. No. 15/005,496, filed Jan. 25, 2016, 15 pages.
Non-Final Office Action dated Nov. 16, 2018, issued in connection with U.S. Appl. No. 15/996,878, filed Jun. 4, 2018, 8 pages.
Non-Final Office Action dated Dec. 18, 2018, issued in connection with U.S. Appl. No. 16/011,402, filed Jun. 18, 2018, 10 pages.
Non-Final Office Action dated Feb. 18, 2016, issued in connection with U.S. Appl. No. 14/644,136, filed Mar. 10, 2015, 10 pages.
Non-Final Office Action dated Jun. 18, 2019, issued in connection with U.S. Appl. No. 15/005,496, filed Jan. 25, 2016, 15 pages.
Non-Final Office Action dated Sep. 19, 2017, issued in connection with U.S. Appl. No. 15/056,553, filed Feb. 29, 2016, 7 pages.
Non-Final Office Action dated Apr. 2, 2018, issued in connection with U.S. Appl. No. 15/872,979, filed Jan. 16, 2018, 6 pages.
Non-Final Office Action dated Aug. 2, 2017, issued in connection with U.S. Appl. No. 15/298,115, filed Oct. 19, 2016, 22 pages.
Non-Final Office Action dated Apr. 20, 2017, issued in connection with U.S. Appl. No. 15/005,853, filed Jan. 25, 2016, 8 pages.
Non-Final Office Action dated Jul. 20, 2016, issued in connection with U.S. Appl. No. 14/682,182, filed Apr. 9, 2015, 13 pages.
Non-Final Office Action dated Jun. 20, 2017, issued in connection with U.S. Appl. No. 15/207,682, filed Jul. 12, 2016, 17 pages.
Non-Final Office Action dated Dec. 21, 2018, issued in connection with U.S. Appl. No. 16/181,213, filed Nov. 5, 2018, 13 pages.
Non-Final Office Action dated Jun. 21, 2016, issued in connection with U.S. Appl. No. 14/678,248, filed Apr. 3, 2015, 10 pages.
Non-Final Office Action dated Jun. 21, 2019, issued in connection with U.S. Appl. No. 16/181,865, filed Nov. 6, 2018, 12 pages.
Non-Final Office Action dated Nov. 21, 2014, issued in connection with U.S. Appl. No. 13/536,493, filed Jun. 28, 2012, 20 pages.
Non-Final Office Action dated Jun. 22, 2018, issued in connection with U.S. Appl. No. 15/217,399, filed Jul. 22, 2016, 33 pages.
Non-Final Office Action dated Jan. 23, 2019, issued in connection with U.S. Appl. No. 16/113,032, filed Aug. 27, 2018, 8 pages.
Non-Final Office Action dated May 24, 2019, issued in connection with U.S. Appl. No. 16/401,981, filed May 2, 2019, 14 pages.
Non-Final Office Action dated Oct. 25, 2016, issued in connection with U.S. Appl. No. 14/864,506, filed Sep. 24, 2015, 9 pages.
Non-Final Office Action dated Sep. 26, 2018, issued in connection with U.S. Appl. No. 15/229,693, filed Aug. 5, 2016, 25 pages.
Non-Final Office Action dated Dec. 27, 2017, issued in connection with U.S. Appl. No. 15/357,520, filed Nov. 21, 2016, 28 pages.
Non-Final Office Action dated Feb. 27, 2018, issued in connection with U.S. Appl. No. 14/864,393, filed Sep. 24, 2015, 19 pages.
Non-Final Office Action dated Feb. 27, 2018, issued in connection with U.S. Appl. No. 15/718,556, filed Sep. 28, 2017, 19 pages.
Non-Final Office Action dated Jul. 27, 2016, issued in connection with U.S. Appl. No. 14/696,014, filed Apr. 24, 2015, 11 pages.
Non-Final Office Action dated Mar. 27, 2017, issued in connection with U.S. Appl. No. 15/211,835, filed Jul. 15, 2016, 30 pages.
Non-Final Office Action dated Mar. 27, 2018, issued in connection with U.S. Appl. No. 15/785,088, filed Oct. 16, 2017, 11 pages.
Non-Final Office Action dated Jul. 28, 2016, issued in connection with U.S. Appl. No. 14/884,001, filed Oct. 15, 2015, 8 pages.
Non-Final Office Action dated Nov. 28, 2017, issued in connection with U.S. Appl. No. 15/673,170, filed Aug. 9, 2017, 7 pages.
Non-Final Office Action dated Sep. 28, 2018, issued in connection with U.S. Appl. No. 15/588,186, filed May 5, 2017, 12 pages.

(56) References Cited

OTHER PUBLICATIONS

Non-Final Office Action dated Sep. 28, 2018, issued in connection with U.S. Appl. No. 15/595,519, filed May 15, 2017, 12 pages.
Non-Final Office Action dated Mar. 29, 2018, issued in connection with U.S. Appl. No. 15/716,313, filed Sep. 26, 2017, 16 pages.
Non-Final Office Action dated May 30, 2017, issued in connection with U.S. Appl. No. 15/478,770, filed Apr. 4, 2017, 9 pages.
Non-Final Office Action dated May 31, 2019, issued in connection with U.S. Appl. No. 16/185,906, filed Nov. 9, 2018, 7 pages.
Non-Final Office Action dated Nov. 6, 2018, issued in connection with U.S. Appl. No. 15/235,598, filed Aug. 12, 2016, 13 pages.
Non-Final Office Action dated Feb. 7, 2019, issued in connection with U.S. Appl. No. 15/859,311, filed Dec. 29, 2017, 9 pages.
Non-Final Office Action dated Feb. 7, 2019, issued in connection with U.S. Appl. No. 15/865,221, filed Jan. 8, 2018, 10 pages.
Non-Final Office Action dated Jan. 9, 2018, issued in connection with U.S. Appl. No. 15/698,283, filed Sep. 7, 2017, 18 pages.
Non-Final Office Action dated Jan. 9, 2018, issued in connection with U.S. Appl. No. 15/727,913, filed Oct. 9, 2017, 8 pages.
Notice of Allowance dated May 1, 2017, issued in connection with U.S. Appl. No. 14/805,140, filed Jul. 21, 2015, 13 pages.
Notice of Allowance dated Nov. 2, 2016, issued in connection with U.S. Appl. No. 14/884,001, filed Oct. 15, 2015, 8 pages.
Notice of Allowance dated Jun. 3, 2016, issued in connection with U.S. Appl. No. 14/921,799, filed Oct. 23, 2015, 8 pages.
Notice of Allowance dated Nov. 4, 2016, issued in connection with U.S. Appl. No. 14/481,514, filed Sep. 9, 2014, 10 pages.
Notice of Allowance dated Jun. 6, 2018, issued in connection with U.S. Appl. No. 15/727,913, filed Oct. 9, 2017, 5 pages.
Notice of Allowance dated Dec. 7, 2015, issued in connection with U.S. Appl. No. 14/216,325, filed Mar. 17, 2014, 7 pages.
International Searching Authority, International Search Report and Written Opinion dated Aug. 3, 2017, in connection with International Application No. PCT/US2017014596, 20 pages.
Japanese Patent Office, English Translation of Office Action dated May 8, 2018, issued in connection with Japanese Application No. 2017-513241, 4 pages.
Japanese Patent Office, Japanese Office Action dated Oct. 3, 2017, issued in connection with Japanese Application No. 2017-501082, 7 pages.
Japanese Patent Office, Non-Final Office Action with Translation dated Apr. 25, 2017, issued in connection with Japanese Patent Application No. 2016-568888, 7 pages.
Japanese Patent Office, Non-Final Office Action with Translation dated Oct. 3, 2017, issued in connection with Japanese Patent Application No. 2017-501082, 3 pages.
Japanese Patent Office, Office Action dated Jun. 12, 2018, issued in connection with Japanese Application No. 2018-502729, 4 pages.
Japanese Patent Office, Office Action dated May 14, 2019, issued in connection with Japanese Patent Application No. 2018-500529, 8 pages.
Japanese Patent Office, Office Action dated Aug. 21, 2018, issued in connection with Japanese Application No. 2018-514418, 7 pages.
Japanese Patent Office, Office Action dated Jul. 24, 2018, issued in connection with Japanese Application No. 2018-514419, 5 pages.
Japanese Patent Office, Office Action dated Jun. 4, 2019, issued in connection with Japanese Patent Application No. 2018-112810, 4 pages.
Japanese Patent Office, Office Action dated May 8, 2018, issued in connection with Japanese Application No. 2017-513241, 8 pages.
Japanese Patent Office, Office Action with English Summary dated Jul. 18, 2017, issued in connection with Japanese Patent Application No. 2017-513171, 4 pages.
Japanese Patent Office, Translation of Office Action dated May 14, 2019, issued in connection with Japanese Patent Application No. 2018-500529, 5 pages.
Jo et al., "Synchronized One-to-many Media Streaming with Adaptive Playout Control," Proceedings of SPIE, 2002, pp. 71-82, vol. 4861.

John Mark and Paul Hufnagel "What is 1451.4, what are its uses and how does it work?" IEEE Standards Association, The IEEE 1451.4 Standard for Smart Transducers, 14pages.
Jones, Stephen, "Dell Digital Audio Receiver: Digital upgrade for your analog stereo," Analog Stereo, Jun. 24, 2000 retrieved Jun. 18, 2014, 2 pages.
"AuEQ for the iPhone," Mar. 25, 2015, retrieved from the internet: URL:https://web.archive.org/web20150325152629/http://www.hotto.de/mobileapps/iphoneaueq.html [retrieved on Jun. 24, 2016], 6 pages.
Louderback, Jim, "Affordable Audio Receiver Furnishes Homes With MP3," TechTV Vault. Jun. 28, 2000 retrieved Jul. 10, 2014, 2 pages.
Microsoft Corporation, "Using Microsoft Outlook 2003," Cambridge College, 2003.
Motorola, "Simplefi, Wireless Digital Audio Receiver, Installation and User Guide," Dec. 31, 2001, 111 pages.
Mulcahy, John, "Room EQ Wizard: Room Acoustics Software," REW, 2014, retrieved Oct. 10, 2014, 4 pages.
Non-Final Action dated Jan. 29, 2016, issued in connection with U.S. Appl. No. 14/481,511, filed Sep. 9, 2014, 10 pages.
Non-Final Office Action dated Mar. 1, 2017, issued in connection with U.S. Appl. No. 15/344,069, filed Nov. 4, 2016, 20 pages.
Non-Final Office Action dated Nov. 1, 2017, issued in connection with U.S. Appl. No. 15/235,598, filed Aug. 12, 2016, 15 pages.
Non-Final Office Action dated Jun. 2, 2014, issued in connection with U.S. Appl. No. 13/340,126, filed Dec. 29, 2011, 14 pages.
Non-Final Office Action dated Jun. 2, 2017, issued in connection with U.S. Appl. No. 15/229,693, filed Aug. 5, 2016, 18 pages.
Non-Final Office Action dated Nov. 2, 2017, issued in connection with U.S. Appl. No. 15/166,241, filed May 26, 2016, 12 pages.
Non-Final Office Action dated Oct. 2, 2017, issued in connection with U.S. Appl. No. 15/005,853, filed Jan. 25, 2016, 8 pages.
Non-Final Office Action dated Feb. 3, 2016, issued in connection with U.S. Appl. No. 14/481,522, filed Sep. 9, 2014, 12 pages.
Non-Final Office Action dated Jul. 3, 2018, issued in connection with U.S. Appl. No. 15/909,327, filed Mar. 1, 2018, 30 pages.
Non-Final Office Action dated Jan. 4, 2017, issued in connection with U.S. Appl. No. 15/207,682, filed Jul. 12, 2016, 6 pages.
Non-Final Office Action dated Nov. 4, 2016, issued in connection with U.S. Appl. No. 14/826,856, filed Aug. 14, 2015, 10 pages.
Non-Final Office Action dated Jul. 5, 2017, issued in connection with U.S. Appl. No. 14/481,522, filed Sep. 9, 2014, 8 pages.
Non-Final Office Action dated Jul. 6, 2016, issued in connection with U.S. Appl. No. 15/070,160, filed Mar. 15, 2016, 6 pages.
Non-Final Office Action dated Oct. 6, 2016, issued in connection with U.S. Appl. No. 14/678,263, filed Apr. 3, 2015, 30 pages.
Non-Final Office Action dated Jun. 6, 2018, issued in connection with U.S. Appl. No. 15/005,496, filed Jan. 25, 2016, 16 pages.
Non-Final Office Action dated Dec. 7, 2015, issued in connection with U.S. Appl. No. 14/921,762, filed Oct. 23, 2015, 5 pages.
Non-Final Office Action dated Jul. 7, 2016, issued in connection with U.S. Appl. No. 15/066,049, filed Mar. 10, 2016, 6 pages.
Non-Final Office Action dated Mar. 7, 2017, issued in connection with U.S. Appl. No. 14/481,514, filed Sep. 9, 2014, 24 pages.
Non-Final Office Action dated Sep. 7, 2016, issued in connection with U.S. Appl. No. 14/826,873, filed Aug. 14, 2015, 12 pages.
Non-Final Office Action dated Jul. 8, 2016, issued in connection with U.S. Appl. No. 15/066,072, filed Mar. 10, 2016, 6 pages.
Non-Final Office Action dated Dec. 9, 2016, issued in connection with U.S. Appl. No. 14/678,248, filed Apr. 3, 2015, 22 pages.
Non-Final Office Action dated Apr. 10, 2018, issued in connection with U.S. Appl. No. 15/909,529, filed Mar. 1, 2018, 8 pages.
Non-Final Office Action dated Mar. 10, 2017, issued in connection with U.S. Appl. No. 14/997,868, filed Jan. 18, 2016, 10 pages.
Non-Final Office Action dated Sep. 10, 2018, issued in connection with U.S. Appl. No. 15/056,553, filed Feb. 29, 2016, 8 pages.
Non-Final Office Action dated Apr. 11, 2017, issued in connection with U.S. Appl. No. 15/088,994, filed Apr. 1, 2016, 13 pages.
Non-Final Office Action dated Apr. 11, 2017, issued in connection with U.S. Appl. No. 15/089,004, filed Apr. 1, 2016, 9 pages.
Non-Final Office Action dated Oct. 11, 2017, issued in connection with U.S. Appl. No. 15/480,265, filed Apr. 5, 2017, 8 pages.

(56) References Cited

OTHER PUBLICATIONS

Non-Final Office Action dated Oct. 11, 2018, issued in connection with U.S. Appl. No. 15/856,791, filed Dec. 28, 2017, 13 pages.
Non-Final Office Action dated Sep. 12, 2016, issued in connection with U.S. Appl. No. 14/811,587, filed Jul. 28, 2015, 24 pages.
Advisory Action dated Jul. 1, 2019, issued in connection with U.S. Appl. No. 15/229,693, filed Aug. 5, 2016, 2 pages.
Advisory Action dated Jul. 10, 2018, issued in connection with U.S. Appl. No. 15/056,553, filed Feb. 29, 2016, 3 pages.
Advisory Action dated Jul. 12, 2018, issued in connection with U.S. Appl. No. 15/166,241, filed May 26, 2016, 3 pages.
Advisory Action dated Jul. 12, 2018, issued in connection with U.S. Appl. No. 15/235,598, filed Aug. 12, 2016, 3 pages.
Advisory Action dated Aug. 16, 2017, issued in connection with U.S. Appl. No. 14/481,505, filed Sep. 9, 2014, 3 pages.
Advisory Action dated Jun. 19, 2018, issued in connection with U.S. Appl. No. 15/229,693, filed Aug. 5, 2016, 3 pages.
Advisory Action dated Sep. 19, 2017, issued in connection with U.S. Appl. No. 14/726,921, filed Jun. 1, 2015, 3 pages.
Advisory Action dated Apr. 30, 2019, issued in connection with U.S. Appl. No. 15/005,496, filed Jan. 25, 2016, 3 pages.
Advisory Action dated Feb. 7, 2019, issued in connection with U.S. Appl. No. 15/806,126, filed Nov. 7, 2017, 3 pages.
An Overview of IEEE 1451.4 Transducer Electronic Data Sheets (TEDS) National Instruments, 19 pages.
AudioTron Quick Start Guide, Version 1.0, Mar. 2001, 24 pages.
AudioTron Reference Manual, Version 3.0, May 2002, 70 pages.
AudioTron Setup Guide, Version 3.0, May 2002, 38 pages.
Bluetooth. "Specification of the Bluetooth System: The ad hoc SCATTERNET for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Burger, Dennis, "Automated Room Correction Explained," hometheaterreview.com, Nov. 18, 2013, Retrieved Oct. 10, 2014, 3 pages.
Chinese Patent Office, First Office Action and Translation dated Jun. 19, 2019, issued in connection with Chinese Application No. 201680054189.X, 11 pages.
Chinese Patent Office, First Office Action dated Aug. 11, 2017, issued in connection with Chinese Patent Application No. 201580013837.2, 8 pages.
Chinese Patent Office, First Office Action dated Nov. 20, 2018, issued in connection with Chinese Application No. 201580047998.3, 21 pages.
Chinese Patent Office, First Office Action dated Sep. 25, 2017, issued in connection with Chinese Patent Application No. 201580013894.0, 9 pages.
Chinese Patent Office, First Office Action dated Nov. 5, 2018, issued in connection with Chinese Application No. 201680044080.8, 5 pages.
Chinese Patent Office, Second Office Action dated Jan. 11, 2019, issued in connection with Chinese Application No. 201680044080.8, 4 pages.
Chinese Patent Office, Second Office Action dated Feb. 3, 2019, issued in connection with Chinese Application No. 201580048594.6, 11 pages.
Chinese Patent Office, Second Office Action with Translation dated Jan. 9, 2018, issued in connection with Chinese Patent Application No. 201580013837.2, 10 pages.
Chinese Patent Office, Third Office Action dated Apr. 11, 2019, issued in connection with Chinese Application No. 201580048594.6, 4 pages.
"Constellation Acoustic System: a revolutionary breakthrough in acoustical design," Meyer Sound Laboratories, Inc. 2012, 32 pages.
"Constellation Microphones," Meyer Sound Laboratories, Inc. 2013, 2 pages.
Corrected Notice of Allowability dated Jan. 19, 2017, issued in connection with U.S. Appl. No. 14/826,873, filed Aug. 14, 2015, 11 pages.
Daddy, B., "Calibrating Your Audio with a Sound Pressure Level (SPL) Meter," Blue-ray.com, Feb. 22, 2008 Retrieved Oct. 10, 2014, 15 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
European Patent Office, European Examination Report dated May 11, 2018, issued in connection with European Application No. 16748186.0, 6 pages.
European Patent Office, European Extended Search Report dated Oct. 16, 2018, issued in connection with European Application No. 17185193.4, 6 pages.
European Patent Office, European Extended Search Report dated Jul. 17, 2019, issued in connection with European Application No. 19167365.6, 7 pages.
European Patent Office, European Extended Search Report dated Jun. 26, 2018, issued in connection with European Application No. 18171206.8, 9 pages.
European Patent Office, European Extended Search Report dated Sep. 8, 2017, issued in connnection with European Application No. 17000460.0, 8 pages.
European Patent Office, European Office Action dated Dec. 11, 2018, issued in connection with European Application No. 15778787.0, 6 pages.
European Patent Office, European Office Action dated Nov. 2, 2018, issued in connection with European Application No. 18171206.8, 6 pages.
European Patent Office, European Office Action dated Feb. 4, 2019, issued in connection with European Application No. 17703876.7, 9 pages.
European Patent Office, European Office Action dated May 9, 2019, issued in connection with European Application No. 18171206.8, 7 pages.
European Patent Office, European Partial Search Report dated Jun. 7, 2019, issued in connection with European Application No. 19161826.3, 17 pages.
European Patent Office, European Search Report dated Jun. 13, 2019, issued in connection with European Application No. 18204450.3, 11 pages.
European Patent Office, European Search Report dated Jan. 18, 2018, issued in connection with European Patent Application No. 17185193.4, 9 pages.
European Patent Office, European Search Report dated Jul. 9, 2019, issued in connection with European Application No. 19168800.1, 12 pages.
European Patent Office, Extended European Search Report dated Jan. 5, 2017, issued in connection with European Patent Application No. 15765555.6, 8 pages.
European Patent Office, Extended Search Report dated Jan. 25, 2017, issued in connection with European Application No. 15765548.1, 7 pages.
European Patent Office, Extended Search Report dated Apr. 26, 2017, issued in connection with European Application No. 15765548.1, 10 pages.
European Patent Office, Office Action dated Nov. 12, 2018, issued in connection with European Application No. 17000460.0, 6 pages.
European Patent Office, Office Action dated Jun. 13, 2017, issued in connection with European patent application No. 17000484.0, 10 pages.
Ross, Alex, "Wizards of Sound: Retouching acoustics, from the restaurant to the concert hall," The New Yorker, Feb. 23, 2015. Web. Feb. 26, 2015, 9 pages.
Supplemental Notice of Allowability dated Oct. 27, 2016, issued in connection with U.S. Appl. No. 14/481,511, filed Sep. 9, 2014, 6 pages.
United States Patent and Trademark Office, U.S. Appl. No. 60/490,768, filed Jul. 28, 2003, entitled "Method for synchronizing audio playback between multiple networked devices," 13 pages.
United States Patent and Trademark Office, U.S. Appl. No. 60/825,407, filed Sep. 12, 2006, entitled "Controlling and manipulating groupings in a multi-zone music or media system," 82 pages.

(56) References Cited

OTHER PUBLICATIONS

UPnP; "Universal Plug and Play Device Architecture," Jun. 8, 2000; version 1.0; Microsoft Corporation; pp. 1-54.
Wikipedia, Server(Computing) https://web.archive.org/web/20160703173710/https://en.wikipedia.org/wiki/Server_(computing), published Jul. 3, 2016, 7 pages.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.
European Patent Office, Office Action dated Dec. 15, 2016, issued in connection with European Application No. 15766998.7, 7 pages.
European Patent Office, Summons to Attend Oral Proceedings mailed on Nov. 15, 2018, issued in connection with European Application No. 16748186.0, 57 pages.
Ex Parte Quayle Office Action mailed on Apr. 15, 2019, issued in connection with U.S. Appl. No. 15/235,598, filed Aug. 12, 2016, 7 pages.
Final Office Action dated Apr. 3, 2017, issued in connection with U.S. Appl. No. 14/678,248, filed Apr. 3, 2015, 22 pages.
Final Office Action dated Jul. 13, 2017, issued in connection with U.S. Appl. No. 14/726,921, filed Jun. 1, 2015, 10 pages.
Final Office Action dated Jun. 13, 2017, issued in connection with U.S. Appl. No. 14/481,505, filed Sep. 9, 2014, 22 pages.
Final Office Action dated Feb. 14, 2019, issued in connection with U.S. Appl. No. 15/005,496, filed Jan. 25, 2016, 16 pages.
Final Office Action dated Feb. 14, 2019, issued in connection with U.S. Appl. No. 15/217,399, filed Jul. 22, 2016, 37 pages.
Final Office Action dated Oct. 14, 2016, issued in connection with U.S. Appl. No. 14/682,182, filed Apr. 9, 2015, 16 pages.
Final Office Action dated Oct. 17, 2016, issued in connection with U.S. Appl. No. 14/678,248, filed Apr. 3, 2015, 22 pages.
Final Office Action dated Apr. 18, 2017, issued in connection with U.S. Appl. No. 14/678,263, filed Apr. 3, 2015, 16 pages.
Final Office Action dated Apr. 18, 2018, issued in connection with U.S. Appl. No. 15/056,553, filed Feb. 29, 2016, 8 pages.
Final Office Action dated Dec. 18, 2014, issued in connection with U.S. Appl. No. 13/340,126, filed Dec. 29, 2011, 12 pages.
Final Office Action dated Jan. 19, 2017, issued in connection with U.S. Appl. No. 14/940,779, filed Nov. 13, 2015, 15 pages.
Final Office Action dated Apr. 2, 2018, issued in connection with U.S. Appl. No. 15/166,241, filed May 26, 2016, 14 pages.
Final Office Action dated Oct. 21, 2016, issued in connection with U.S. Appl. No. 14/696,014, filed Apr. 24, 2015, 13 pages.
Final Office Action dated Jan. 25, 2018, issued in connection with U.S. Appl. No. 15/005,496, filed Jan. 25, 2016, 17 pages.
Final Office Action dated Mar. 25, 2019, issued in connection with U.S. Appl. No. 15/856,791, filed Dec. 28, 2017, 11 pages.
Final Office Action dated Apr. 3, 2018, issued in connection with U.S. Appl. No. 15/235,598, filed Aug. 12, 2016, 12 pages.
Final Office Action dated Feb. 5, 2018, issued in connection with U.S. Appl. No. 15/229,693, filed Aug. 5, 2016, 21 pages.
Final Office Action dated Mar. 5, 2019, issued in connection with U.S. Appl. No. 15/056,553, filed Feb. 29, 2016, 9 pages.
Final Office Action dated Dec. 6, 2018, issued in connection with U.S. Appl. No. 15/806,126, filed Nov. 7, 2017, 18 pages.
Final Office Action dated Apr. 9, 2019, issued in connection with U.S. Appl. No. 15/229,693, filed Aug. 5, 2016, 33 pages.
First Action Interview Office Action dated Mar. 3, 2017, issued in connection with U.S. Appl. No. 14/726,921, filed Jun. 1, 2015, 9 pages.
First Action Interview Office Action dated Jul. 12, 2016, issued in connection with U.S. Appl. No. 14/481,514, filed Sep. 9, 2014, 10 pages.
First Action Interview Office Action dated Jun. 30, 2016, issued in connection with U.S. Appl. No. 14/481,505, filed Sep. 9, 2014, 9 pages.

Frrst Action Interview Pilot Program Pre-Interview Communication dated Apr. 5, 2017, issued in connection with U.S. Appl. No. 14/793,190, filed Jul. 7, 2015, 4 pages.
First Action Interview Pilot Program Pre-Interview Communication dated Oct. 7, 2015, issued in connection with U.S. Appl. No. 14/216,306, filed Mar. 17, 2014, 5 pages.
First Action Interview Pilot Program Pre-Interview Communication dated Feb. 16, 2016, issued in connection with U.S. Appl. No. 14/681,465, filed Apr. 8, 2015, 5 pages.
Gonzalez et al., "Simultaneous Measurement of Multichannel Acoustic Systems," J. Audio Eng. Soc., 2004, pp. 26-42, vol. 52, No. 1/2.
International Bureau, International Preliminary Report on Patentability, dated Sep. 24, 2015, issued in connection with International Application No. PCT/US2014/030560, filed on Mar. 17, 2014, 7 pages.
International Bureau, International Preliminary Report on Patentability dated Sep. 29, 2016, issued in connection with International Application No. PCT/US2015/020993, filed on Mar. 17, 2015, 8 pages.
International Bureau, International Preliminary Report on Patentability dated Sep. 29, 2016, issued in connection with International Application No. PCT/US2015/021000, filed on Mar. 17, 2015, 9 pages.
International Bureau, International Preliminary Report on Patentability, dated Aug. 9, 2018, issued in connection with International Application No. PCT/US2017/014596, filed on Jan. 23, 2017, 11 pages.
International Searching Authority, International Preliminary Report on Patentability dated Mar. 23, 2017, issued in connection with International Patent Application No. PCT/US2015/048944, filed on Sep. 8, 2015, 8 pages.
International Searching Authority, International Preliminary Report on Patentability dated Oct. 24, 2017, issued in connection with International Application No. PCT/US2016/028994 filed on Apr. 22, 2016, 7 pages.
International Searching Authority, International Search Report and Written Opinion dated Jul. 4, 2016, issued in connection with International Application No. PCT/US2016/028994, filed on Apr. 22, 2016, 12 pages.
International Searching Authority, International Search Report and Written Opinion dated Jul. 5, 2016, issued in connection with International Application No. PCT/US2016/028997, filed on Apr. 22, 2016, 13 pages.
International Searching Authority, International Search Report and Written Opinion dated Jun. 5, 2015, issued in connection with International Application No. PCT/US2015/021000, filed on Mar. 17, 2015, 12 pages.
International Searching Authority, International Search Report and Written Opinion dated Oct. 12, 2016, issued in connection with International Application No. PCT/US2016/041179 filed on Jul. 6, 2016, 9 pages.
International Searching Authority, International Search Report and Written Opinion dated Jun. 16, 2015, issued in connection with International Application No. PCT/US2015/020993, filed on Mar. 17, 2015, 11 pages.
International Searching Authority, International Search Report and Written Opinion dated Nov. 18, 2015, issued in connection with International Application No. PCT/US2015/048954, filed on Sep. 8, 2015, 11 pages.
International Searching Authority, International Search Report and Written Opinion dated Oct. 18, 2016, issued in connection with International Application No. PCT/US2016/043116, filed on Jul. 20, 2016, 14 pages.
International Searching Authority, International Search Report and Written Opinion dated Oct. 18, 2016, issued in connection with International Application No. PCT/US2016/043840, filed on Jul. 25, 2016, 14 pages.
International Searching Authority, International Search Report and Written Opinion dated Nov. 23, 2015, issued in connection with International Application No. PCT/US2015/048942, filed on Sep. 8, 2015, 14 pages.

(56) References Cited

OTHER PUBLICATIONS

International Searching Authority, International Search Report and Written Opinion dated Nov. 23, 2015, issued in connection with International Application No. PCT/US2015/048944, filed on Sep. 8, 2015, 12 pages.
International Searching Authority, International Search Report and Written Opinion dated Nov. 23, 2016, issued in connection with International Patent Application No. PCT/US2016/052266, filed on Sep. 16, 2016, 11 pages.
International Searching Authority, International Search Report and Written Opinion dated Jan. 24, 2017, issued in connection with International Application No. PCT/US2016/052264, filed on Sep. 16, 2016, 17 pages.
Nternational Searching Authority, International Search Report and Written Opinion dated Oct. 25, 2016, issued in connection with International Application No. PCT/US2016/043109, filed on Jul. 20, 2016, 12 pages.
International Searching Authority, International Search Report and Written Opinion dated Sep. 25, 2017, issued in connection with International Application No. PCT/US2017/042191, filed on Jul. 14, 2017, 16 pages.
Advisory Action dated Dec. 11, 2020, issued in connection with U.S. Appl. No. 15/005,496, filed Jan. 25, 2016, 3 pages.
Advisory Action dated Jun. 3, 2020, issued in connection with U.S. Appl. No. 16/115,525, filed Aug. 28, 2018, 3 pages.
Chen, Trista P. et al. VRAPS: Visual Rhythm-Based Audio Playback System. IEEE, Gracenote, Inc., 2010, pp. 721-722.
Chinese Patent Office, First Office Action and Translation dated Jun. 29, 2020, issued in connection with Chinese Application No. 2017800570933, 11 pages.
Chinese Patent Office, First Office Action and Translation dated Feb. 3, 2021, issued in connection with Chinese Application No. 202010095178.4, 15 pages.
Chinese Patent Office, First Office Action and Translation dated Aug. 4, 2020, issued in connection with Chinese Application No. 201910395715.4, 22 pages.
Chinese Patent Office, First Office Action dated Jan. 28, 2021, issued in connection with Chinese Application No. 201680054164.X, 9 pages.
Chinese Patent Office, Office Action dated Nov. 14, 2019, issued in connection with Chinese Application No. 201680040086.8, 9 pages.
Chinese Patent Office, Office Action dated Dec. 24, 2020, issued in connection with Chinese Application No. 201910978233.1, 8 pages.
Chinese Patent Office, Second Office Action and Translation dated Aug. 26, 2019, issued in connection with Chinese Application No. 201580047998.3, 25 pages.
Chinese Patent Office, Second Office Action dated May 6, 2020, issued in connection with Chinese Application No. 201680040086.8, 3 pages.
European Patent Office, European Extended Search Report dated Dec. 11, 2020, issued in connection with European Application No. 20196286.7, 6 pages.
European Patent Office, European Extended Search Report dated Mar. 16, 2020, issued in connection with European Application No. 19209551.1, 7 pages.
European Patent Office, European Extended Search Report dated Mar. 25, 2020, issued in connection with European Application No. 19215348.4, 10 pages.
European Patent Office, European Office Action dated Nov. 10, 2020, issued in connection with European Application No 19168800.1, 5 pages.
European Patent Office, European Office Action dated Jul. 11, 2019, issued in connection with European Applic.ation No. 15778787.0, 10 pages.
European Patent Office, European Office Action dated Sep. 16, 2020, issued in connection with European Application No. 15778787.0, 7 pages.
European Patent Office, European Office Action dated Aug. 19, 2020, issued in connection with European Application No. 17754501.9, 6 pages.
European Patent Office, European Office Action dated Jan. 3, 2020, issued in connection with European Application No. 17703876.7, 8 pages.
European Patent Office, European Office Action dated Sep. 7, 2020, issued in connection with European Application No. 19161826.3, 6 pages.
European Patent Office, European Office Action dated Jul. 9, 2020, issued in connection with European Application No. 19167365.6, 4 pages.
European Patent Office, European Search Report dated Sep. 13, 2019, issued in connection with European Application No. 19161826.3, 13 pages.
European Patent Office, Summons to Attend Oral Proceedings dated Sep. 24, 2019, issued in connection with European Application No. 17000460.0, 5 pages.
Ex Parte Quayle Office Action dated Dec. 26, 2019, issued in connection with U.S. Appl. No. 16/542,418, filed Aug. 16, 2019, 7 pages.
Final Office Action dated Dec. 2, 2019, issued in connection with U.S. Appl. No. 15/005,496, filed Jan. 25, 2016, 19 pages.
Final Office Action dated Dec. 2, 2020, issued in connection with U.S. Appl. No. 16/812,618, filed Mar. 9, 2020, 17 pages.
Final Office Action dated Sep. 22, 2020, issued in connection with U.S. Appl. No. 15/005,496, filed Jan. 5, 2016, 17 pages.
Final Office Action dated Oct. 28, 2019, issued in connection with U.S. Appl. No. 16/181,865, filed Nov. 6, 2018, 17 pages.
Final Office Action dated Mar. 3, 2020, issued in connection with U.S. Appl. No. 16/115,525, filed Aug. 28, 2018, 13 pages.
International Bureau, International Search Report and Written Opinion dated Dec. 15, 2020, issued in connection with International Application No. PCT/US2020/045746, filed Aug. 11, 2020, 23 pages.
Japanese Patent Office, Non-Final Office Action and Translation dated Dec. 10, 2019, issued in connection with Japanese Patent Application No. 2018-213477, 8 pages.
Japanese Patent Office, Office Action and Translation dated Jun. 12, 2020, issued in connection with Japanese Patent Application No. 2019-056360, 6 pages.
Japanese Patent Office, Office Action and Translation dated Nov. 4, 2020, issued in connection with Japanese Patent Application No. 2019-141349, 6 pages.
Japanese Patent Office, Office Action dated Feb. 4, 2020, issued in connection with Japanese Patent Application No. 2018-500529, 6 pages.
Lei et al. An Audio Frequency Acquision and Release System Based on TMS320VC5509, Instrumentation Technology, Editorial Department Email, Issue 02, 2007, 4 pages.
Non-Final Office Action dated Sep. 4, 2019, issued in connection with U.S. Appl. No. 16/213,552, filed Dec. 7, 2018, 16 pages.
Non-Final Office Action dated Dec. 11, 2019, issued in connection with U.S. Appl. No. 16/556,297, filed Aug. 30, 2019, 9 pages.
Non-Final Office Action dated Dec. 11, 2019, issued in connection with U.S. Appl. No. 16/658,896, filed Oct. 21, 2019, 14 pages.
Non-Final Office Action dated Feb. 11, 2021, issued in connection with U.S. Appl. No. 17/104,466, filed Nov. 25, 2020, 39 pages.
Non-Final Office Action dated Mar. 12, 2020, issued in connection with U.S. Appl. No. 16/796,496, filed Feb. 20, 2020, 13 pages.
Non-Final Office Action dated Mar. 13, 2020, issued in connection with U.S. Appl. No. 15/005,496, filed Jan. 25, 2016, 20 pages.
Non-Final Office Action dated Sep. 16, 2020, issued in connection with U.S. Appl. No. 16/115,525, filed Aug. 28, 2018, 11 pages.
Non-Final Office Action dated Aug. 18, 2020, issued in connection with U.S. Appl. No. 16/827,143, filed Mar. 23, 2020, 8 pages.
Non-Final Office Action dated Feb. 19, 2020, issued in connection with U.S. Appl. No. 16/665,415, filed Oct. 28, 2019, 53 pages.
Non-Final Office Action dated Jun. 19, 2020, issued in connection with U.S. Appl. No. 16/403,077, filed May 3, 2019, 6 pages.
Non-Final Office Action dated Jun. 22, 2020, issued in connection with U.S. Appl. No. 16/555,832, filed Aug. 29, 2019, 15 pages.
Non-Final Office Action dated Oct. 22, 2019, issued in connection with U.S. Appl. No. 16/416,619, filed May 20, 2019, 12 pages.
Non-Final Office Action dated Aug. 30, 2019, issued in connection with U.S. Appl. No. 16/115,525, filed Aug. 28, 2018, 13 pages.

(56) References Cited

OTHER PUBLICATIONS

Non-Final Office Action dated Mar. 4, 2020, issued in connection with U.S. Appl. No. 15/966,534, filed Apr. 30, 2018, 11 pages.
Non-Final Office Action dated Jan. 5, 2021, issued in connection with U.S. Appl. No. 17/078,382, filed Oct. 23, 2020, 11 pages.
Non-Final Office Action dated Jul. 6, 2020, issued in connection with U.S. Appl. No. 16/812,618, filed Mar. 9, 2020, 15 pages.
Notice of Allowance dated Jun. 10, 2020, issued in connection with U.S. Appl. No. 16/713,858, filed Dec. 13, 2019, 8 pages.
Notice of Allowance dated Aug. 12, 2019, issued in connection with U.S. Appl. No. 16/416,648, filed May 20, 2019, 7 pages.
Notice of Allowance dated Nov. 12, 2019, issued in connection with U.S. Appl. No. 15/955,545, filed Apr. 17, 2018, 9 pages.
Notice of Allowance dated Apr. 13, 2020, issued in connection with U.S. Appl. No. 16/181,865, filed Nov. 5, 2018, 10 pages.
Notice of Allowance dated Jul. 14, 2020, issued in connection with U.S. Appl. No. 16/556,297, filed Aug. 30, 2019, 11 pages.
Notice of Allowance dated Jul. 16, 2020, issued in connection with U.S. Appl. No. 16/530,324, filed Aug. 2, 2019, 9 pages.
Notice of Allowance dated Oct. 16, 2019, issued in connection with U.S. Appl. No. 16/401,981, filed May 2, 2019, 8 pages.
Notice of Allowance dated Oct. 17, 2019, issued in connection with U.S. Appl. No. 16/542433, filed Aug. 16, 2019, 9 pages.
Notice of Allowance dated Mar. 2, 2020, issued in connection with U.S. Appl. No. 16/213,552, filed Dec. 7, 2018, 9 pages.
Notice of Allowance dated Oct. 21, 2019, issued in connection with U.S. Appl. No. 16/182,886, filed Nov. 7, 2018, 10 pages.
Notice of Allowance dated Mar. 23, 2020, issued in connection with U.S. Appl. No. 16/542,418, filed Aug. 16, 2019, 5 pages.
Notice of Allowance dated Nov. 23, 2020, issued in connection with U.S. Appl. No. 16/403,077, filed May 3, 2019, 6 pages.
Notice of Allowance dated Oct. 23, 2020, issued in connection with U.S. Appl. No. 16/555,846, filed Aug. 29, 2019, 5 pages.
Notice of Allowance dated Jul. 24, 2020, issued in connection with U.S. Appl. No. 16/665,415, filed Oct. 28, 2019, 12 pages.
Notice of Allowance dated Jan. 25, 2021, issued in connection with U.S. Appl. No. 17/129,670, filed Dec. 21, 2020, 10 pages.
Notice of Allowance dated Oct. 27, 2020, issued in connection with U.S. Appl. No. 16/555,832, filed Aug. 29, 2019, 5 pages.
Notice of Allowance dated Aug. 29, 2019, issued in connection with U.S. Appl. No. 16/185,906, filed Nov. 9, 2018, 8 pages.
Notice of Allowance dated Mar. 31, 2020, issued in connection with U.S. Appl. No. 16/538,629, filed Aug. 12, 2019, 9 pages.
Notice of Allowance dated Feb. 4, 2020, issued in connection with U.S. Appl. No. 16/416,619, filed May 20, 2019, 7 pages.
Notice of Allowance dated Feb. 5, 2021, issued in connection with U.S. Appl. No. 16/827,143, filed Mar. 23, 2020, 9 pages.
Notice of Allowance dated Aug. 6, 2020, issued in connection with U.S. Appl. No. 16/564,684, filed Sep. 9, 2019, 8 pages.
Notice of Allowance dated Jun. 8, 2020, issued in connection with U.S. Appl. No. 16/658,896, filed Oct. 21, 2019, 8 pages.
Notice of Allowance dated Apr. 9, 2020, issued in connection with U.S. Appl. No. 16/416,593, filed May 20, 2019, 9 pages.
Notice of Allowance dated Jun. 9, 2020, issued in connection with U.S. Appl. No. 15/966,534, filed Apr. 30, 2018, 16 pages.
Yamaha DME Designer 3.0 Owner's Manual; Copyright 2008, 501 pages.
BeoLab5 User Manual. Bang & Olufsen. Version 1.0, 20 pages [produced by Google in WDTX Case No. 6:20-cv-00881 Answer on Jan. 8, 2021].
Excerpts from Andrew Tanenbaum, Computer Networks. 4th Edition. Copyright 2003, 87 pages [produced by Google in. IPR of U.S. Pat. No. 9,219,460, IPR2021-00475 on Feb. 5, 2021].
Excerpts from Morfey, Christopher L, Dictionary of Acoustics. Copyright 2001, 4 pages [produced by Google in IPR of U.S. Pat. No. 9,219,460, IPR2021-00475 on Feb. 5, 2021].
*Google LLC* v. *Sonos, Inc.*, Declaration of Jeffery S. Vipperman, PHD. In Support of Petition for Inter Partes Review of U.S. Pat. No. 9,219,460, IPR2021-00475, Feb. 2, 2021, 92 pages.
*Google LLC* v. *Sonos, Inc.*, Petition for IPR of U.S. Pat. No. 9,219,460, IPR2021-00475, Feb. 5, 2021, 88 pages.
*Sonos, Inc.* v. *Google LLC*, WDTX Case No. 6:20-cv-00881, Google's Answer and Counterclaims; dated Jan. 8, 2021, 39 pages.
Office Action dated Apr. 8, 2021 in Japanese Patent Application 2020-048867 (4 pages).

| Device/Device Base | Zone | Calibration State | Time of Last Calibration | Bonded Zone Configuration At Last Calibration |
|---|---|---|---|---|
| Playback Device 102 | Balcony | Calibrated | 7/4/2015 10:15 | |
| Playback Device 104 | Living Room | Calibrated | 12/26/2014 13:15 | Surround Sound |
| Playback Device 106 | Living Room | Calibrated | 12/26/2014 13:15 | Surround Sound |
| Playback Device 108 | Living Room | Calibrated | 12/26/2014 13:15 | Surround Sound |
| Playback Device 110 | Living Room | Calibrated | 12/26/2014 13:15 | Surround Sound |
| Playback Device 112 | Dining Room | Calibrated | 6/28/2015 10:20 | |
| Playback Device 114 | Kitchen | Calibrated | 6/26/2015 11:25 | |
| Playback Device 116 | Bathroom | Calibrated | 3/18/2015 15:45 | |
| Playback Device 118 | Office | Calibrated | 4/17/2015 16:25 | |
| Playback Device 120 | Bedroom | Calibrated | 6/12/2015 7:30 | |
| Playback Device 122 | Master Bedroom | Calibrated | 2/15/2015 20:30 | Stereo Pair |
| Playback Device 124 | Master Bedroom | Calibrated | 2/15/2015 20:30 | Stereo Pair |

| Device/Device Base | Zone | Calibration State | Time of Last Calibration | Bonded Zone Configuration At Last Calibration |
|---|---|---|---|---|
| Playback Device 102 | Balcony | Uncalibrated | | Stereo Pair |
| Playback Device 104 | Living Room | Calibrated | 12/26/2014 13:15 | Surround Sound |
| Playback Device 106 | Living Room | Calibrated | 12/26/2014 13:15 | Surround Sound |
| Playback Device 108 | Living Room | Calibrated | 12/26/2014 13:15 | Surround Sound |
| Playback Device 110 | | Uncalibrated | | |
| Playback Device 112 | Dining Room | Uncalibrated | | |
| Playback Device 114 | Kitchen | Uncalibrated | | |
| Playback Device 116 | Bathroom | Calibrated | 3/18/2015 15:45 | |
| Playback Device 118 | Balcony | Uncalibrated | | Stereo Pair |
| Playback Device 120 | Bedroom | Calibrated | 6/12/2015 7:30 | |
| Playback Device 122 | Master Bedroom | Uncalibrated | | Stereo Pair |
| Playback Device 124 | Master Bedroom | Uncalibrated | | Stereo Pair |

CALIBRATION STATE VARIABLE

CROSS REFERENCE TO RELATED APPLICATIONS

This application claims priority under 35 U.S.C. § 120 to, and is a continuation of, U.S. non-provisional patent application Ser. No. 16/055,884, filed on Aug. 6, 2018, entitled "Calibration State Variable," which is a continuation of, U.S. non-provisional patent application Ser. No. 15/727,913, filed on Oct. 9, 2017, entitled "Calibration State Variable," which is a continuation of U.S. non-provisional patent application Ser. No. 14/793,190, filed on Jul. 7, 2015, entitled "Calibration State Variable," both of which are incorporated herein by reference in their entirety.

This application is related to U.S. patent application Ser. No. 13/536,493 filed Jun. 28, 2012, entitled "System and Method for Device Playback Calibration," and U.S. patent application Ser. No. 14/793,205 filed Jul. 7, 2015, entitled "Calibration Indicator," which are also both incorporated herein in their entirety.

FIELD OF THE DISCLOSURE

The disclosure is related to consumer goods and, more particularly, to methods, systems, products, features, services, and other elements directed to media playback or some aspect thereof.

BACKGROUND

Options for accessing and listening to digital audio in an out-loud setting were limited until in 2003, when SONOS, Inc. filed for one of its first patent applications, entitled "Method for Synchronizing Audio Playback between Multiple Networked Devices," and began offering a media playback system for sale in 2005. The Sonos Wireless HiFi System enables people to experience music from many sources via one or more networked playback devices. Through a software control application installed on a smartphone, tablet, or computer, one can play what he or she wants in any room that has a networked playback device. Additionally, using the controller, for example, different songs can be streamed to each room with a playback device, rooms can be grouped together for synchronous playback, or the same song can be heard in all rooms synchronously.

Given the ever growing interest in digital media, there continues to be a need to develop consumer-accessible technologies to further enhance the listening experience.

BRIEF DESCRIPTION OF THE DRAWINGS

Features, aspects, and advantages of the presently disclosed technology may be better understood with regard to the following description, appended claims, and accompanying drawings where:

FIG. 6 is a table representing an instance of calibration state variables stored by an example device, according to an example embodiment;

FIG. 8 is a table representing another instance of calibration state variables stored by an example device, according to an example embodiment;

Figure 1:
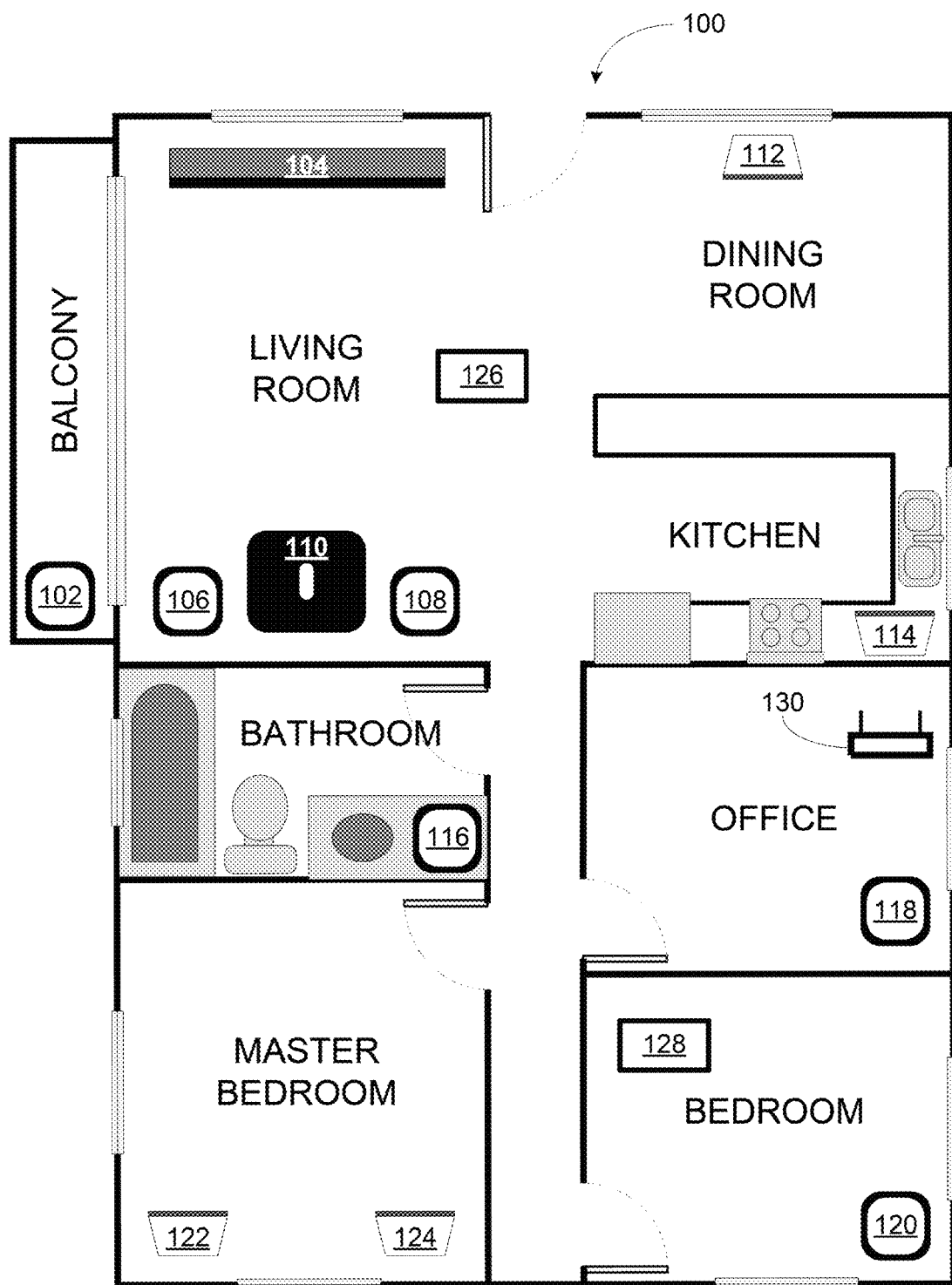
FIG. 1 shows an example media playback system configuration in which certain embodiments may be practiced.

The drawings are for the purpose of illustrating example embodiments, but it is understood that the inventions are not limited to the arrangements and instrumentality shown in the drawings.

DETAILED DESCRIPTION

I. Overview

Embodiments described herein involve, inter alia, techniques to maintain a calibration state of one or more playback devices across a media playback system by way of a calibration state variable. The calibration state variable may indicate the calibration status of one or more playback devices of the media playback system (i.e., whether a given playback device is calibrated). In some implementations, the calibration state may also indicate a calibration profile of one or more playback devices (e.g., a profile to equalize the response of a given playback device within a particular environment).

Within examples, a calibration state variable may be stored on a playback device and shared with other devices of the media playback system (e.g., playback devices and/or control devices). For instance, a given playback device of a media playback system may maintain in data storage a state variable (or collection of state variables) indicating the calibration state of the playback devices of the media playback system. The given playback device may share the calibration state variable(s) with other devices (e.g., the playback devices and/or the control devices) by transmitting an indication of the state variable(s) to the devices via a network interface. In some implementations, multiple instances of the calibration state variable(s) may be stored on multiple devices, which may provide redundancy across the media playback system, among other possible benefits.

Calibration state variables maintained by a media playback system may facilitate a playback device retaining its calibrated state through power-cycling (i.e., being powered off and subsequently being powered back on). For instance, after being powered-on, a first playback device may receive, from a second device, an indication of a calibration state variable corresponding to that first playback device. In some instances, the calibration state variable may indicate that the first playback device is calibrated. In such instances, the first playback device may configure itself with a pre-existing calibration profile (perhaps stored on the first playback device or on another device of the media playback system (e.g., the second device).

Calibration state variables may also trigger calibration of uncalibrated devices. For example, referring back to the example above, the calibration state variable corresponding to the first playback device may indicate that the first playback device is not calibrated. Receiving an indication of such a calibration state variable may trigger the first playback device to initiate a calibration procedure.

Some calibration procedures contemplated herein involve a control device of the media playback system detecting and analyzing sound waves (e.g., one or more calibration sounds) which were emitted by one or more playback devices of the media playback system. In some cases, such calibration sounds may facilitate the control device determining respective frequency responses of the one or more playback devices within a given environment. After determining such a response for a given playback device, the control device may instruct the given playback device to adopt a certain calibration profile (e.g., an equalization) that offsets the acoustics of the given environment.

Performing such a calibration procedure on a playback device may cause the media playback system to update a calibration state variable that corresponds to that playback device. For instance, a control device may perform a calibration procedure with a given playback device and then send an instruction to the one or more playback devices that are maintaining the calibration state variables which causes the calibration state variable that corresponds to the calibrated playback device to reflect that device's updated calibration status.

A calibration state variable that is stored by a playback device may be updated based on a variety of conditions. For instance, a playback device may lose its calibrated status when the playback device is joined with one or more additional playback devices into a bonded zone (e.g., a stereo pair or surround sound group), as the playback device may operate differently as a member of such a group. Further, since acoustics of an environment may vary from location to location within the environment, a playback device may lose its calibrated state when physical moved. For example, sensors on a playback device may sense a change in physical orientation or a movement to another location. As another example, a playback device that is moved to another zone (e.g., from a "Living Room" zone to a "Bedroom" zone) may lose its calibrated status, as such a zone change may create a presumption that the device has been moved to another physical location. Upon detecting such a condition with respect to a playback device, a device may update calibration state variable(s) to indicate a new calibration state of that playback device perhaps by updating its own calibration state variable(s) or by instructing other devices to update the calibration state variable(s).

A control device of a media playback system may display a graphical user interface that facilitates control of the playback devices of the media playback system. Such a graphical user interface may include one or more interfaces that include an indication of the calibration state variable(s) that correspond to the playback devices of the media playback system. In some embodiments, multiple interfaces may provide varying levels of information on the calibration state. For instance, a first interface may indicate that there is an issue with a particular playback device (or zone that includes the particular playback device). A second interface, possibly accessed via a control on the first interface, may indicate that the particular device is uncalibrated. One or more of the interfaces may provide a control to initiate calibration of the playback devices of the media playback system. A control device may keep the calibration status up to date by receiving an indication of the calibration state variable(s) from the playback device(s) that are maintaining the calibration state variable(s) for the media playback system.

As noted, example techniques may involve a calibration state variable. In one aspect, a method is provided. The method may involve receiving, via a network interface, an indication that the first playback device is calibrated. The method may also involve updating a calibration state variable to indicate that the first playback device is calibrated based on receiving the indication that the first playback device is calibrated. The method may further involve sending, via the network interface, an indication of the updated calibration state variable to a second device.

In another aspect, a device is provided. The device includes a network interface, at least one processor, a data storage, and program logic stored in the data storage and executable by the at least one processor to perform operations. The operations may include receiving, via the network interface, an indication that the first playback device is calibrated. The operations may also include updating a calibration state variable to indicate that the first playback device is calibrated based on receiving the indication that the first playback device is calibrated. The operations may further include sending, via the network interface, an indication of the updated calibration state variable to a second device.

In yet another aspect, a non-transitory computer readable memory is provided. The non-transitory computer readable memory has stored thereon instructions executable by a computing device to cause the computing device to perform operations. The operations may include receiving, via the network interface, an indication that the first playback device is calibrated. The operations may also include updating a calibration state variable to indicate that the first playback device is calibrated based on receiving the indication that the first playback device is calibrated. The operations may further include sending, via the network interface, an indication of the updated calibration state variable to a second device.

Further example techniques may involve a graphical user interface displaying an indication of a calibration state variable. In one aspect, a method is provided. The method may involve receiving, from a first playback device of a media playback system, a calibration state variable indicating that the first playback device is uncalibrated. The method may also involve causing a graphical interface to display an indication that the first playback device is uncalibrated. The method may further involve causing the graphical interface to display a selectable control that, when selected, initiates calibration of the first playback device and initiating calibration of the first playback device.

In another aspect, a device is provided. The device includes a network interface, at least one processor, a data storage, and program logic stored in the data storage and executable by the at least one processor to perform operations. The operations may include receiving, from a first playback device of a media playback system, a calibration state variable indicating that the first playback device is uncalibrated. The operations may also include causing a graphical interface to display an indication that the first playback device is uncalibrated. The operations may further include causing the graphical interface to display a selectable control that, when selected, initiates calibration of the first playback device and initiating calibration of the first playback device.

In yet another aspect, a non-transitory computer readable memory is provided. The non-transitory computer readable memory has stored thereon instructions executable by a computing device to cause the computing device to perform operations. The operations may include receiving, from a first playback device of a media playback system, a calibration state variable indicating that the first playback device is uncalibrated. The operations may also include causing a graphical interface to display an indication that the first playback device is uncalibrated. The operations may further include causing the graphical interface to display a selectable control that, when selected, initiates calibration of the first playback device and initiating calibration of the first playback device.

It will be understood by one of ordinary skill in the art that this disclosure includes numerous other embodiments. It will be understood by one of ordinary skill in the art that this disclosure includes numerous other embodiments. While some examples described herein may refer to functions performed by given actors such as "users" and/or other entities, it should be understood that this description is for purposes of explanation only. The claims should not be interpreted to require action by any such example actor unless explicitly required by the language of the claims themselves.

II. Example Operating Environment

FIG. 1 illustrates an example configuration of a media playback system 100 in which one or more embodiments disclosed herein may be practiced or implemented. The media playback system 100 as shown is associated with an example home environment having several rooms and spaces, such as for example, a master bedroom, an office, a dining room, and a living room. As shown in the example of FIG. 1, the media playback system 100 includes playback devices 102-124, control devices 126 and 128, and a wired or wireless network router 130.

Further discussions relating to the different components of the example media playback system 100 and how the different components may interact to provide a user with a media experience may be found in the following sections. While discussions herein may generally refer to the example media playback system 100, technologies described herein are not limited to applications within, among other things, the home environment as shown in FIG. 1. For instance, the technologies described herein may be useful in environments where multi-zone audio may be desired, such as, for example, a commercial setting like a restaurant, mall or airport, a vehicle like a sports utility vehicle (SUV), bus or car, a ship or boat, an airplane, and so on.

a. Example Playback Devices

Figure 2:
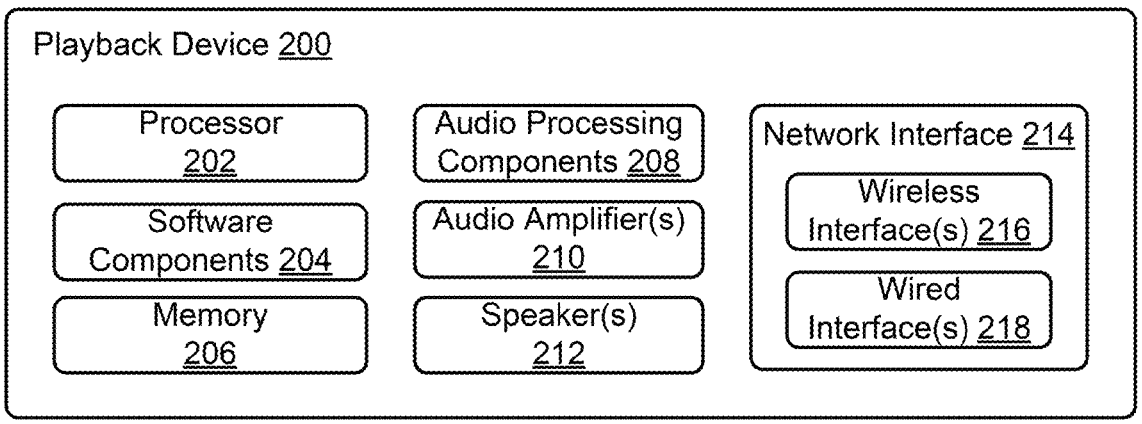
FIG. 2 shows a functional block diagram of an example playback device.

FIG. 2 shows a functional block diagram of an example playback device 200 that may be configured to be one or more of the playback devices 102-124 of the media playback system 100 of FIG. 1. The playback device 200 may include a processor 202, software components 204, memory 206, audio processing components 208, audio amplifier(s) 210, speaker(s) 212, and a network interface 214 including wireless interface(s) 216 and wired interface(s) 218. In one case, the playback device 200 may not include the speaker(s) 212, but rather a speaker interface for connecting the playback device 200 to external speakers. In another case, the playback device 200 may include neither the speaker(s) 212 nor the audio amplifier(s) 210, but rather an audio interface for connecting the playback device 200 to an external audio amplifier or audio-visual receiver.

In one example, the processor 202 may be a clock-driven computing component configured to process input data according to instructions stored in the memory 206. The memory 206 may be a tangible computer-readable medium configured to store instructions executable by the processor 202. For instance, the memory 206 may be data storage that can be loaded with one or more of the software components 204 executable by the processor 202 to achieve certain functions. In one example, the functions may involve the playback device 200 retrieving audio data from an audio source or another playback device. In another example, the functions may involve the playback device 200 sending audio data to another device or playback device on a network. In yet another example, the functions may involve pairing of the playback device 200 with one or more playback devices to create a multi-channel audio environment.

Certain functions may involve the playback device 200 synchronizing playback of audio content with one or more other playback devices. During synchronous playback, a listener will preferably not be able to perceive time-delay differences between playback of the audio content by the playback device 200 and the one or more other playback devices. U.S. Pat. No. 8,234,395 entitled, "System and method for synchronizing operations among a plurality of independently clocked digital data processing devices," which is hereby incorporated by reference, provides in more detail some examples for audio playback synchronization among playback devices.

The memory 206 may further be configured to store data associated with the playback device 200, such as one or more zones and/or zone groups the playback device 200 is a part of, audio sources accessible by the playback device 200, or a playback queue that the playback device 200 (or some other playback device) may be associated with. The data may be stored as one or more state variables that are periodically updated and used to describe the state of the playback device 200. The memory 206 may also include the data associated with the state of the other devices of the media system, and shared from time to time among the devices so that one or more of the devices have the most recent data associated with the system. Other embodiments are also possible.

The audio processing components 208 may include one or more digital-to-analog converters (DAC), an audio preprocessing component, an audio enhancement component or a digital signal processor (DSP), and so on. In one embodiment, one or more of the audio processing components 208 may be a subcomponent of the processor 202. In one example, audio content may be processed and/or intentionally altered by the audio processing components 208 to produce audio signals. The produced audio signals may then be provided to the audio amplifier(s) 210 for amplification and playback through speaker(s) 212. Particularly, the audio amplifier(s) 210 may include devices configured to amplify audio signals to a level for driving one or more of the speakers 212. The speaker(s) 212 may include an individual transducer (e.g., a "driver") or a complete speaker system involving an enclosure with one or more drivers. A particular driver of the speaker(s) 212 may include, for example, a subwoofer (e.g., for low frequencies), a mid-range driver (e.g., for middle frequencies), and/or a tweeter (e.g., for high frequencies). In some cases, each transducer in the one or more speakers 212 may be driven by an individual corresponding audio amplifier of the audio amplifier(s) 210. In addition to producing analog signals for playback by the playback device 200, the audio processing components 208 may be configured to process audio content to be sent to one or more other playback devices for playback.

Audio content to be processed and/or played back by the playback device 200 may be received from an external source, such as via an audio line-in input connection (e.g., an auto-detecting 3.5 mm audio line-in connection) or the network interface 214.

The network interface 214 may be configured to facilitate a data flow between the playback device 200 and one or more other devices on a data network. As such, the playback device 200 may be configured to receive audio content over the data network from one or more other playback devices in communication with the playback device 200, network devices within a local area network, or audio content sources over a wide area network such as the Internet. In one example, the audio content and other signals transmitted and received by the playback device 200 may be transmitted in the form of digital packet data containing an Internet Protocol (IP)-based source address and IP-based destination addresses. In such a case, the network interface 214 may be configured to parse the digital packet data such that the data destined for the playback device 200 is properly received and processed by the playback device 200.

As shown, the network interface 214 may include wireless interface(s) 216 and wired interface(s) 218. The wireless interface(s) 216 may provide network interface functions for the playback device 200 to wirelessly communicate with other devices (e.g., other playback device(s), speaker(s), receiver(s), network device(s), control device(s) within a data network the playback device 200 is associated with) in accordance with a communication protocol (e.g., any wireless standard including IEEE 802.11a, 802.11b, 802.11g, 802.11n, 802.11ac, 802.15, 4G mobile communication standard, and so on). The wired interface(s) 218 may provide network interface functions for the playback device 200 to communicate over a wired connection with other devices in accordance with a communication protocol (e.g., IEEE 802.3). While the network interface 214 shown in FIG. 2 includes both wireless interface(s) 216 and wired interface(s) 218, the network interface 214 may in some embodiments include only wireless interface(s) or only wired interface(s).

In one example, the playback device 200 and one other playback device may be paired to play two separate audio components of audio content. For instance, playback device 200 may be configured to play a left channel audio component, while the other playback device may be configured to play a right channel audio component, thereby producing or enhancing a stereo effect of the audio content. The paired playback devices (also referred to as "bonded playback devices") may further play audio content in synchrony with other playback devices.

In another example, the playback device 200 may be sonically consolidated with one or more other playback devices to form a single, consolidated playback device. A consolidated playback device may be configured to process and reproduce sound differently than an unconsolidated playback device or playback devices that are paired, because a consolidated playback device may have additional speaker drivers through which audio content may be rendered. For instance, if the playback device 200 is a playback device designed to render low frequency range audio content (i.e. a subwoofer), the playback device 200 may be consolidated with a playback device designed to render full frequency range audio content. In such a case, the full frequency range playback device, when consolidated with the low frequency playback device 200, may be configured to render only the mid and high frequency components of audio content, while the low frequency range playback device 200 renders the low frequency component of the audio content. The consolidated playback device may further be paired with a single playback device or yet another consolidated playback device.

By way of illustration, SONOS, Inc. presently offers (or has offered) for sale certain playback devices including a "PLAY:1," "PLAY:3," "PLAY:5," "PLAYBAR," "CONNECT:AMP," "CONNECT," and "SUB." Any other past, present, and/or future playback devices may additionally or alternatively be used to implement the playback devices of example embodiments disclosed herein. Additionally, it is understood that a playback device is not limited to the example illustrated in FIG. 2 or to the SONOS product offerings. For example, a playback device may include a wired or wireless headphone. In another example, a playback device may include or interact with a docking station for personal mobile media playback devices. In yet another example, a playback device may be integral to another device or component such as a television, a lighting fixture, or some other device for indoor or outdoor use.

b. Example Playback Zone Configurations

Referring back to the media playback system 100 of FIG. 1, the environment may have one or more playback zones, each with one or more playback devices. The media playback system 100 may be established with one or more playback zones, after which one or more zones may be added, or removed to arrive at the example configuration shown in FIG. 1. Each zone may be given a name according to a different room or space such as an office, bathroom, master bedroom, bedroom, kitchen, dining room, living room, and/or balcony. In one case, a single playback zone may include multiple rooms or spaces. In another case, a single room or space may include multiple playback zones.

As shown in FIG. 1, the balcony, dining room, kitchen, bathroom, office, and bedroom zones each have one playback device, while the living room and master bedroom zones each have multiple playback devices. In the living room zone, playback devices 104, 106, 108, and 110 may be configured to play audio content in synchrony as individual playback devices, as one or more bonded playback devices, as one or more consolidated playback devices, or any combination thereof. Similarly, in the case of the master bedroom, playback devices 122 and 124 may be configured to play audio content in synchrony as individual playback devices, as a bonded playback device, or as a consolidated playback device.

In one example, one or more playback zones in the environment of FIG. 1 may each be playing different audio content. For instance, the user may be grilling in the balcony zone and listening to hip hop music being played by the playback device 102 while another user may be preparing food in the kitchen zone and listening to classical music being played by the playback device 114. In another example, a playback zone may play the same audio content in synchrony with another playback zone. For instance, the user may be in the office zone where the playback device 118 is playing the same rock music that is being playing by playback device 102 in the balcony zone. In such a case, playback devices 102 and 118 may be playing the rock music in synchrony such that the user may seamlessly (or at least substantially seamlessly) enjoy the audio content that is being played out-loud while moving between different playback zones. Synchronization among playback zones may be achieved in a manner similar to that of synchronization among playback devices, as described in previously referenced U.S. Pat. No. 8,234,395.

As suggested above, the zone configurations of the media playback system 100 may be dynamically modified, and in some embodiments, the media playback system 100 supports numerous configurations. For instance, if a user physically moves one or more playback devices to or from a zone, the media playback system 100 may be reconfigured to accommodate the change(s). For instance, if the user physically moves the playback device 102 from the balcony zone to the office zone, the office zone may now include both the playback device 118 and the playback device 102. The playback device 102 may be paired or grouped with the office zone and/or renamed if so desired via a control device such as the control devices 126 and 128. On the other hand, if the one or more playback devices are moved to a particular area in the home environment that is not already a playback zone, a new playback zone may be created for the particular area.

Further, different playback zones of the media playback system 100 may be dynamically combined into zone groups or split up into individual playback zones. For instance, the dining room zone and the kitchen zone 114 may be combined into a zone group for a dinner party such that playback devices 112 and 114 may render audio content in synchrony. On the other hand, the living room zone may be split into a television zone including playback device 104, and a listening zone including playback devices 106, 108, and 110, if the user wishes to listen to music in the living room space while another user wishes to watch television.

c. Example Control Devices

Figure 3:
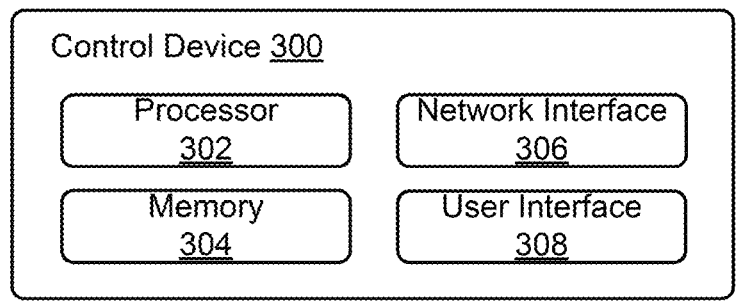
FIG. 3 shows a functional block diagram of an example control device.

FIG. 3 shows a functional block diagram of an example control device 300 that may be configured to be one or both of the control devices 126 and 128 of the media playback system 100. Control device 300 may also be referred to as a controller 300. As shown, the control device 300 may include a processor 302, memory 304, a network interface 306, and a user interface 308. In one example, the control device 300 may be a dedicated controller for the media playback system 100. In another example, the control device 300 may be a network device on which media playback system controller application software may be installed, such as for example, an iPhone™, iPad™ or any other smart phone, tablet or network device (e.g., a networked computer such as a PC or Mac™).

The processor 302 may be configured to perform functions relevant to facilitating user access, control, and configuration of the media playback system 100. The memory 304 may be configured to store instructions executable by the processor 302 to perform those functions. The memory 304 may also be configured to store the media playback system controller application software and other data associated with the media playback system 100 and the user.

In one example, the network interface 306 may be based on an industry standard (e.g., infrared, radio, wired standards including IEEE 802.3, wireless standards including IEEE 802.11a, 802.11b, 802.11g, 802.11n, 802.11ac, 802.15, 4G mobile communication standard, and so on). The network interface 306 may provide a means for the control device 300 to communicate with other devices in the media playback system 100. In one example, data and information (e.g., such as a state variable) may be communicated between control device 300 and other devices via the network interface 306. For instance, playback zone and zone group configurations in the media playback system 100 may be received by the control device 300 from a playback device or another network device, or transmitted by the control device 300 to another playback device or network device via the network interface 306. In some cases, the other network device may be another control device.

Playback device control commands such as volume control and audio playback control may also be communicated from the control device 300 to a playback device via the network interface 306. As suggested above, changes to configurations of the media playback system 100 may also be performed by a user using the control device 300. The configuration changes may include adding/removing one or more playback devices to/from a zone, adding/removing one or more zones to/from a zone group, forming a bonded or consolidated player, separating one or more playback devices from a bonded or consolidated player, among others. Accordingly, the control device 300 may sometimes be referred to as a controller, whether the control device 300 is a dedicated controller or a network device on which media playback system controller application software is installed.

Figure 4:
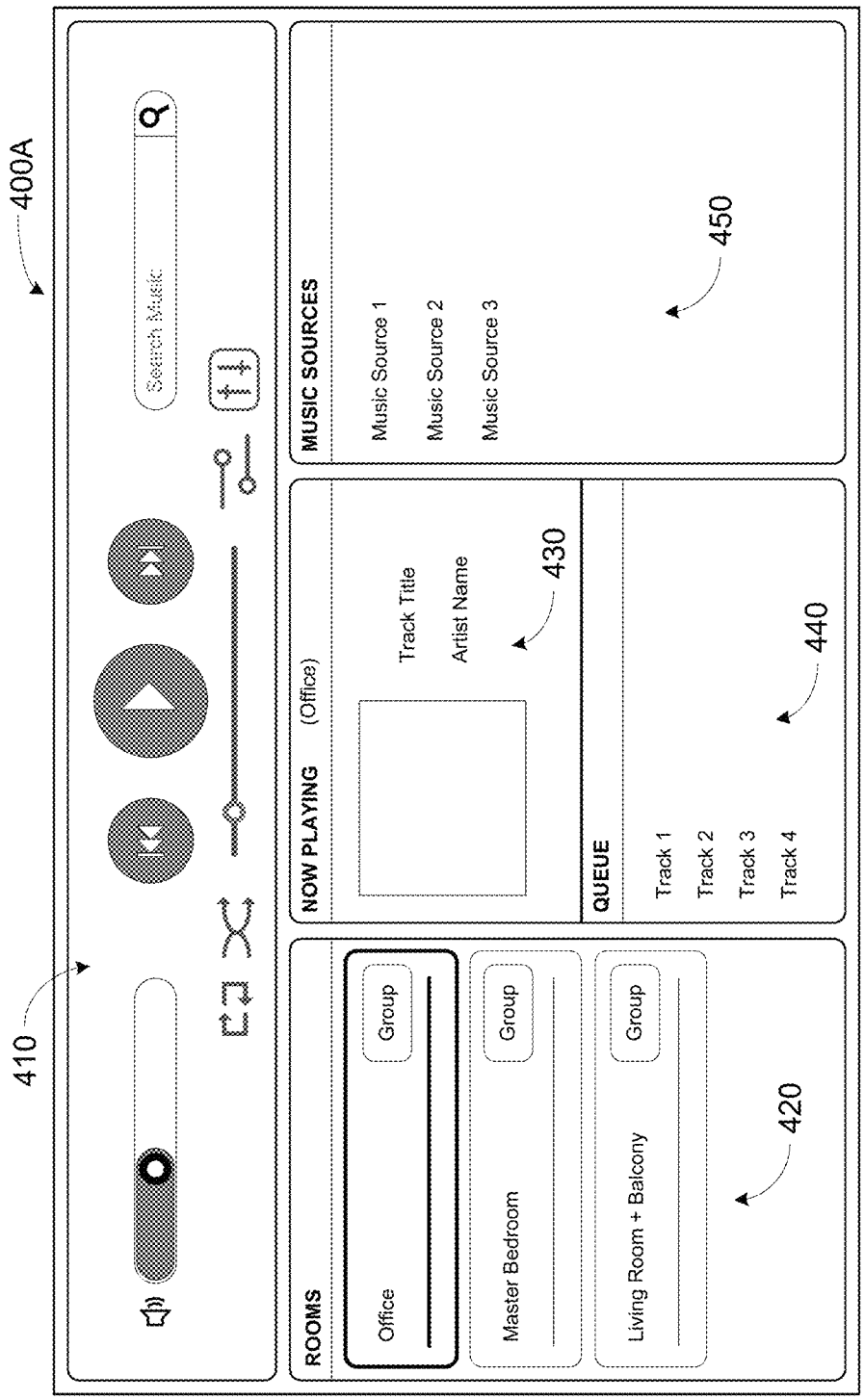
FIG. 4 shows an example controller interface.

The user interface 308 of the control device 300 may be configured to facilitate user access and control of the media playback system 100, by providing a controller interface such as the controller interface 400A shown in FIG. 4. The controller interface 400A includes a playback control region 410, a playback zone region 420, a playback status region 430, a playback queue region 440, and an audio content sources region 450. The user interface 400A as shown is just one example of a user interface that may be provided on a network device such as the control device 300 of FIG. 3 (and/or the control devices 126 and 128 of FIG. 1) and accessed by users to control a media playback system such as the media playback system 100. Other user interfaces of varying formats, styles, and interactive sequences may alternatively be implemented on one or more network devices to provide comparable control access to a media playback system.

The playback control region 410 may include selectable (e.g., by way of touch or by using a cursor) icons to cause playback devices in a selected playback zone or zone group to play or pause, fast forward, rewind, skip to next, skip to previous, enter/exit shuffle mode, enter/exit repeat mode, enter/exit cross fade mode. The playback control region 410 may also include selectable icons to modify equalization settings, and playback volume, among other possibilities.

The playback zone region 420 may include representations of playback zones within the media playback system 100. In some embodiments, the graphical representations of playback zones may be selectable to bring up additional selectable icons to manage or configure the playback zones in the media playback system, such as a creation of bonded zones, creation of zone groups, separation of zone groups, and renaming of zone groups, among other possibilities.

For example, as shown, a "group" icon may be provided within each of the graphical representations of playback zones. The "group" icon provided within a graphical representation of a particular zone may be selectable to bring up options to select one or more other zones in the media playback system to be grouped with the particular zone. Once grouped, playback devices in the zones that have been grouped with the particular zone will be configured to play audio content in synchrony with the playback device(s) in the particular zone. Analogously, a "group" icon may be provided within a graphical representation of a zone group. In this case, the "group" icon may be selectable to bring up options to deselect one or more zones in the zone group to be removed from the zone group. Other interactions and implementations for grouping and ungrouping zones via a user interface such as the user interface 400A are also possible. The representations of playback zones in the playback zone region 420 may be dynamically updated as playback zone or zone group configurations are modified.

The playback status region 430 may include graphical representations of audio content that is presently being played, previously played, or scheduled to play next in the selected playback zone or zone group. The selected playback zone or zone group may be visually distinguished on the user interface, such as within the playback zone region 420 and/or the playback status region 430. The graphical representations may include track title, artist name, album name, album year, track length, and other relevant information that may be useful for the user to know when controlling the media playback system via the user interface 400A.

The playback queue region 440 may include graphical representations of audio content in a playback queue associated with the selected playback zone or zone group. In some embodiments, each playback zone or zone group may be associated with a playback queue containing information corresponding to zero or more audio items for playback by the playback zone or zone group. For instance, each audio item in the playback queue may comprise a uniform resource identifier (URI), a uniform resource locator (URL) or some other identifier that may be used by a playback device in the playback zone or zone group to find and/or retrieve the audio item from a local audio content source or a networked audio content source, possibly for playback by the playback device.

In one example, a playlist may be added to a playback queue, in which case information corresponding to each audio item in the playlist may be added to the playback queue. In another example, audio items in a playback queue may be saved as a playlist. In a further example, a playback queue may be empty, or populated but "not in use" when the playback zone or zone group is playing continuously streaming audio content, such as Internet radio that may continue to play until otherwise stopped, rather than discrete audio items that have playback durations. In an alternative embodiment, a playback queue can include Internet radio and/or other streaming audio content items and be "in use" when the playback zone or zone group is playing those items. Other examples are also possible.

When playback zones or zone groups are "grouped" or "ungrouped," playback queues associated with the affected playback zones or zone groups may be cleared or re-associated. For example, if a first playback zone including a first playback queue is grouped with a second playback zone including a second playback queue, the established zone group may have an associated playback queue that is initially empty, that contains audio items from the first playback queue (such as if the second playback zone was added to the first playback zone), that contains audio items from the second playback queue (such as if the first playback zone was added to the second playback zone), or a combination of audio items from both the first and second playback queues. Subsequently, if the established zone group is ungrouped, the resulting first playback zone may be re-associated with the previous first playback queue, or be associated with a new playback queue that is empty or contains audio items from the playback queue associated with the established zone group before the established zone group was ungrouped. Similarly, the resulting second playback zone may be re-associated with the previous second playback queue, or be associated with a new playback queue that is empty, or contains audio items from the playback queue associated with the established zone group before the established zone group was ungrouped. Other examples are also possible.

Referring back to the user interface 400A of FIG. 4, the graphical representations of audio content in the playback queue region 440 may include track titles, artist names, track lengths, and other relevant information associated with the audio content in the playback queue. In one example, graphical representations of audio content may be selectable to bring up additional selectable icons to manage and/or manipulate the playback queue and/or audio content represented in the playback queue. For instance, a represented audio content may be removed from the playback queue, moved to a different position within the playback queue, or selected to be played immediately, or after any currently playing audio content, among other possibilities. A playback queue associated with a playback zone or zone group may be stored in a memory on one or more playback devices in the playback zone or zone group, on a playback device that is not in the playback zone or zone group, and/or some other designated device. Playback of such a playback queue may involve one or more playback devices playing back media items of the queue, perhaps in sequential or random order.

The audio content sources region 450 may include graphical representations of selectable audio content sources from which audio content may be retrieved and played by the selected playback zone or zone group. Discussions pertaining to audio content sources may be found in the following section.

d. Example Audio Content Sources

As indicated previously, one or more playback devices in a zone or zone group may be configured to retrieve for playback audio content (e.g., according to a corresponding URI or URL for the audio content) from a variety of available audio content sources. In one example, audio content may be retrieved by a playback device directly from a corresponding audio content source (e.g., a line-in connection). In another example, audio content may be provided to a playback device over a network via one or more other playback devices or network devices.

Example audio content sources may include a memory of one or more playback devices in a media playback system such as the media playback system 100 of FIG. 1, local music libraries on one or more network devices (such as a control device, a network-enabled personal computer, or a networked-attached storage (NAS), for example), streaming audio services providing audio content via the Internet (e.g., the cloud), or audio sources connected to the media playback system via a line-in input connection on a playback device or network devise, among other possibilities.

In some embodiments, audio content sources may be regularly added or removed from a media playback system such as the media playback system 100 of FIG. 1. In one example, an indexing of audio items may be performed whenever one or more audio content sources are added, removed or updated. Indexing of audio items may involve scanning for identifiable audio items in all folders/directory shared over a network accessible by playback devices in the media playback system, and generating or updating an audio content database containing metadata (e.g., title, artist, album, track length, among others) and other associated information, such as a URI or URL for each identifiable audio item found. Other examples for managing and maintaining audio content sources may also be possible.

Figure 5:
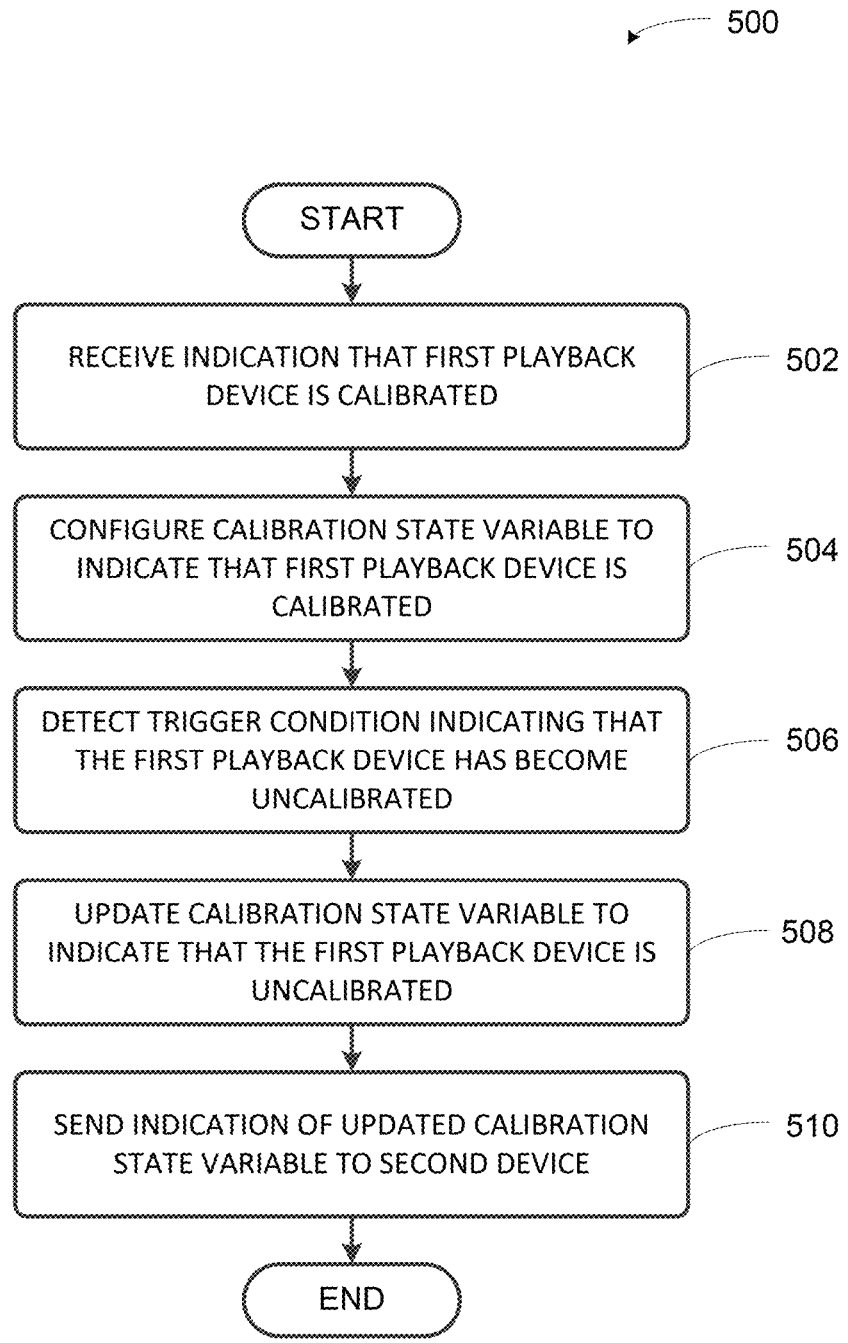
FIG. 5 shows an example flow diagram to update and send a calibration state variable.
Figure 9:
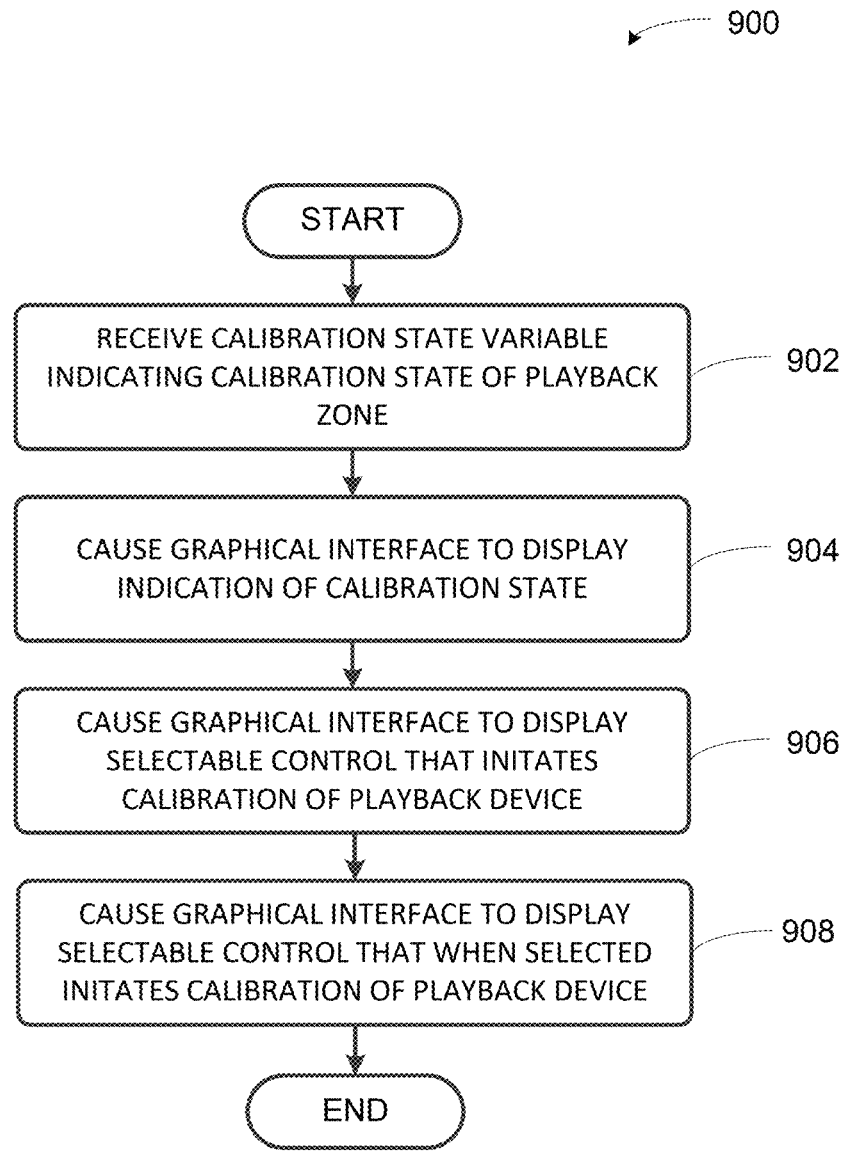
FIG. 9 shows an example flow diagram to display an indication of a calibration state variable.

Moving now to several example implementations, implementations 500 and 900 shown in FIGS. 5 and 9, respectively present example embodiments of techniques described herein. These example embodiments that can be implemented within an operating environment including, for example, the media playback system 100 of FIG. 1, one or more of the playback device 200 of FIG. 2, or one or more of the control device 300 of FIG. 3. Further, operations illustrated by way of example as being performed by a media playback system can be performed by any suitable device, such as a playback device or a control device of a media playback system. Implementations 500 and 900 may include one or more operations, functions, or actions as illustrated by one or more of blocks shown in FIGS. 5 and 9. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

In addition, for the implementations disclosed herein, the flowcharts show functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache, and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the implementations disclosed herein, each block may represent circuitry that is wired to perform the specific logical functions in the process.

III. Example Techniques to Maintain a Calibration State Variable

As discussed above, embodiments described herein may involve a calibration state variable. FIG. 5 illustrates an example implementation 500 to update a calibration state variable and share the calibration state indicated by the calibration state variable with another device.

a. Receive Indication that a First Playback Device is Calibrated

At block 502, implementation 500 involves receiving an indication that a first playback device is calibrated. For instance, a first playback device (e.g., one of playback devices 102-124 of media playback system 100 shown in FIG. 1) may receive, via a network interface, an indication that the first playback device is calibrated. The indication may be sent to the first playback device from another playback device (e.g., another of playback devices 102-124 of media playback system 100) or from a control device (e.g., control device 126 or 128), among other possible examples (e.g., a remote server).

Calibration of a playback device may involve adjusting one or more acoustic parameters of a playback device's speakers (e.g., channels) in an attempt to improve acoustic characteristic of those speakers within a given environment. For instance, a calibration profile may offset the acoustics of the given environment to produce a desired response in that environment (e.g., a flat response, perhaps adjusted by an equalization to boost or cut certain frequencies). To determine a calibration profile for a playback device in a particular position within a given environment, a playback device may perform a calibration procedure, perhaps in combination with a control device. For instance, some example calibration procedures involve a playback device of a media playback system emitting sound waves (e.g., one or more calibration sounds) and a control device of the media playback system detecting and analyzing the emitted sound waves.

As one example, referring to FIG. 1, playback device 122 of media playback system 100 may be calibrated using such a procedure, perhaps with control device 126 detecting and analyzing calibration sounds emitted by playback device 122. After performing the calibration procedure, control device 126 may send to playback device 122 an indication that playback device 122 is calibrated via a network interface. Playback device 122 may receive the indication from control device 126 via an interface of its own. In some embodiments, the indication may include a calibration profile indicating one or more calibration values that adjust equalization of the playback device 122, perhaps to offset acoustic characteristics of the Master Bedroom environment.

As another example, referring again to FIG. 1, playback device 122 may receive an indication that playback device 122 is calibrated from another playback device of media playback system 100, such as playback device 124. Playback device 124 may store a calibration state variable indicating the calibration state of playback device 122. Playback device 124 may send an indication of this calibration state to playback device in various circumstances, such as upon detecting that playback device 122 has been powered on or as part of a regular (e.g., periodic) transmission.

As a further example, playback device 122 may receive an indication that playback device 122 is calibrated from a remote server. Such a remote server may be involved in providing a cloud service to media playback system 100. The cloud service may maintain calibration state variables indicating the calibration state of playback devices 102-124 of media playback system 100. The cloud service might also store calibration state variables indicating the calibration state of other media playback systems, perhaps in other households.

b. Configure a Calibration State Variable to Indicate that the First Playback Device is Calibrated Referring back to FIG. 5, at block 504, implementation 500 involves configuring a calibration state variable to indicate that the first playback device is calibrated. For instance, referring to FIG. 1, playback device 122 may store a calibration state variable indicating the calibration state of playback device 122 in data storage (e.g., in a data storage such as memory 206 of playback device 200 shown in FIG. 2). Playback device 122 may configure that calibration state variable to indicate the calibration state of playback device 122 (e.g., that playback device 122 is calibrated, or that playback device 122 is uncalibrated). In some embodiments, playback device 122 may update such a state variable when playback device 122 receives an indication of a calibration state of playback device 122 (and perhaps also the calibration state of another playback device), perhaps as the indication of the calibration state may include an instruction to update the state variable.

FIG. 6 depicts a table 600 that indicates playback devices of media playback system 100 of FIG. 1 and their respective calibration state, which may be stored as one or more calibration state variables. In this example instance, playback devices of media playback system 100 each calibrated to a particular environment (e.g., a zone). Such calibration states may be stored as one or more calibration state variable(s). State variables, such as the calibration state variables, may also store an indication of the time at which the playback device was last calibrated and possibly the bonded zone configuration at last calibration. Although not shown in FIG. 6, the calibration state variable(s) indicating the calibration states represented by table 600 may also include a calibration profile indicating one or more calibration values that adjust equalization of the playback devices, perhaps to offset acoustic characteristics of the respective environments.

Calibration state variables indicating the calibration state of playback devices may be stored on various devices that are accessible to the media playback system. For instance, in some cases, the media playback system itself may store the state variables, perhaps in data storage of one or more playback device(s) or control device(s) of a media playback system, perhaps using a database or table. Alternatively, a remote server (e.g., a server that provides a cloud service) may store the state variables. Other examples are possible as well.

Within examples, calibration state variables may be maintained across a media playback system using various configurations. For instance, in some examples, each playback device of a media playback system may store calibration state variables indicating the calibration state of the other playback devices of the media playback system. Alternatively, a given device may store a subset of the calibration state variables of a media playback system. For instance, referring to FIG. 6, devices of the Living Room zone may store calibration state variables indicating the calibration state of playback devices that belong to the Living Room zone.

c. Detect Trigger Condition Indicating that the First Playback Device has Become Uncalibrated In FIG. 5, at block 506, implementation 500 involves detecting a trigger condition indicating that the first playback device has become uncalibrated. For instance, referring to FIG. 1, playback device 122 may detect a trigger condition indicating that playback device 122 has become uncalibrated. As several examples, changes to the environment, the physical location or orientation of the device, or the configuration of the device may trigger a loss of calibration state.

In some examples, detecting the trigger condition indicating that the first playback device may involve receiving a command that changes the zone configuration of the first playback device. For instance, referring again to FIG. 1, a control device, such as control device 126, may send a command that instructs playback device 122 to change its zone configuration. Various changes to the zone configuration of a playback device may indicate that the playback device is no longer calibrated.

Figure 7:
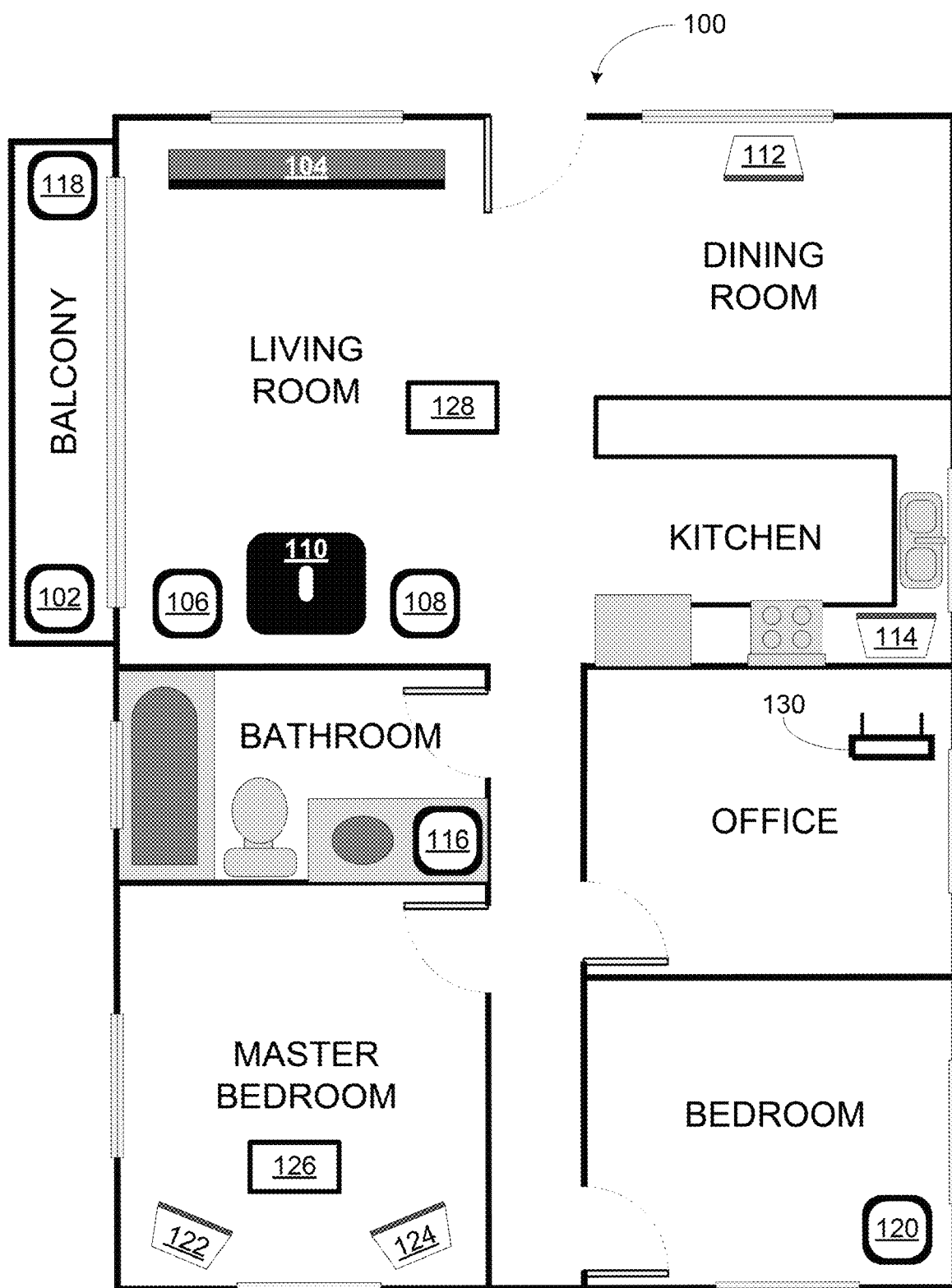
FIG. 7 shows another example media playback system configuration in which certain embodiments may be practiced.

FIG. 7 illustrates example media playback system 700, which is another example configuration of media playback system 100 of FIG. 1. Compared to FIG. 1, certain playback devices have been moved or reconfigured within the household. As described below, such changes may indicate a loss of calibration state.

Within examples, detecting the trigger condition indicating that the first playback device has become uncalibrated may involve receiving a command that causes the first playback device to join (or leave) a bonded zone. For instance, referring to FIG. 7, playback device 112 may receive a command from control device 128 that instructs playback device 112 to join the Kitchen zone as a first channel of a stereo pair that includes a second device (i.e., playback device 114) as a second channel of the stereo pair. Playback device 112 may operate differently as a channel of a stereo pair as compared with operating independently, such that a joining or leaving a stereo pair may trigger a loss of calibration. To become calibrated, playback devices 112 and 114 may perform a calibration procedure as the stereo pair. Another command might instruct playback device 112 to unbond from the bonded zone configuration (i.e., the stereo pair) with playback device 114, which might again trigger a loss in calibration state.

Some playback devices, such as subwoofers, may output specific frequency ranges, which may affect calibration state when such playback devices join or leave a bonded zone configuration. For instance, referring to FIG. 7, the Living Room zone includes a playback device 110 that outputs low frequencies (i.e., a subwoofer) and playback devices 104, 106, and 108 that output mid and high range frequencies. If playback device 110 leaves the Living Room zone, such a change may indicate that playback devices 104, 106, and 108, as the removal of the subwoofer from the zone may suggest that playback devices 104, 106, and 108 should be recalibrated over a range that includes low frequencies.

In some embodiments, a playback device may be assigned a particular name, which may correspond to a particular zone to which the playback device belongs. Changes to this particular name may trigger a loss in calibration state, as such a change may create a presumption that the playback device has been moved to a different zone. For instance, referring to FIG. 7, playback device 118 may be moved from the Office zone to the Balcony zone. To cause playback device 118 to operate as part of the Balcony zone, a control device, such as control device 128, may send a command that instructs playback device 118 to join the Balcony zone, which may cause the assigned name of playback device 118 to change from Office to Balcony. In another example, a control device may send a command to a playback device that causes the playback device to form a new zone (e.g., a Den zone) which may change the name of the playback device to reflect that of the new zone. Such a change to the zone of the playback device may suggest calibrating the playback device in the environment corresponding to this new zone.

As noted above, changes to the physical position or orientation may trigger a loss of calibration, as rotating or moving a playback device may change how that playback device sounds within the environment. For example, when a playback device is pointed into the center of a room, that playback device will typically sound differently than when the device is pointed at a wall. In some embodiments, a playback device may include one or more sensors (e.g., an accelerometer) to detect changes to the physical orientation of the playback device. Such sensors may also detect changes to the physical position of the playback device within the environment. To illustrate, in FIG. 7, playback devices 122 and 124 have been rotated relative to their physical orientation shown in FIG. 1. Detecting that such a physical rotation has exceeded a threshold rotation (e.g., greater than 15 degrees) by way of one or more sensors may indicate that playback device 122 and/or playback device 124 has become uncalibrated. Other positioning techniques, such as echo-location may also be used to detect a change to physical orientation or position.

In other examples, changes to the controller configuration on a playback device may indicate that the playback device has lost its calibration. For instance, the playback device may receive a command that instructs the playback device to reset to factory default settings, which may clear a previous calibration. As another example, the playback device may receive a software update, which may have various effects, such as clearing a previous calibration and/or changing how the playback device operates, that cause the playback device to lose a calibrated state.

As described above in connection with example control devices, a control device of a media playback system may display a graphical user interface containing controls to control operation of the playback devices within that media playback system. Certain controls may indicate that a playback device has become uncalibrated. For instance, a controller interface may display a prompt that requests an indication of whether a playback device has been moved to another physical location. Detecting selection of a control that indicates that the playback device has been moved may indicate that the playback device has become uncalibrated. Such a user interface may also include controls that cause various configuration changes such as causing a playback device to join a zone or to form a bonded zone configuration, which may trigger a loss of calibration state.

d. Update the Calibration State Variable to Indicate that the First Playback Device is Uncalibrated Referring again to FIG. 5, at block 508, implementation 500 involves updating a calibration state variable to indicate that the first playback device is uncalibrated. As noted above, playback devices, such as playback device 122 of FIG. 1 may store a calibration state variable indicating their calibration state in data storage (e.g., in a data storage such as memory 206 of playback device 200 shown in FIG. 2). Upon receiving an indication of a new calibration state, the playback device may update the calibration state to indicate the new calibration state.

For example, based on detecting a trigger condition indicating that the first playback device has become uncalibrated, the first playback device may update the calibration state variable to indicate that the first playback device is uncalibrated. Updating such a calibration state variable may be responsive to detecting such a trigger, such that the playback device updates its calibration state variables when such a trigger is detected.

FIG. 8 depicts a table 800 that indicates the playback devices of media playback system 100 of FIG. 7 and their respective calibration states, which may be stored as one or more calibration state variables. Table 800 represents how the calibration state variables stored by a playback device might be updated based on the changes made media playback system 100 as shown in FIG. 7, as compared with FIG. 1. As shown, playback device 102 and 118 might become uncalibrated, as playback device 118 is moved to the Balcony zone and joined into a stereo pair with playback device 112. Playback device 110 might also become uncalibrated, as it was instructed to leave the Living Room zone. Playback devices 112 and 114 might become uncalibrated when joined as a stereo pair, and remain uncalibrated when the stereo pair is separated and the playback devices are returned to their original zones. In addition, playback devices 122 and 124 may become uncalibrated when they are rotated. Based on detecting such trigger conditions that indicate a change in calibration state, the calibration state variables representing such states may be updated to reflect the change in calibration state, as shown in FIG. 8.

After the playback devices are recalibrated to their new position and/or configuration, the calibration state variables may be updated to indicate that the playback devices are calibrated. For instance, playback devices 122 and 124 may perform a calibration procedure with control device 126. Control device 126 may send playback devices 122 and 124 a calibration profile and instruct the playback devices to update calibration state variables to indicate that the current calibration state. The playback devices may also update state variables to indicate the time of last calibration and the bonded zone configuration of the playback devices during the last calibration.

e. Send Indication of Updated Calibration State Variable to Second Device

In FIG. 5, at block 510, implementation 500 involves sending an indication of the updated state variable to a second device. For instance, playback device 122 may send an indication of the updated state variables to a second playback device, such as playback device 124, or to a control device, such as control device 126 and/or 128. By sending such an indication to a second device, the first playback device may share the current calibration state with the second device(s).

As noted above, in some cases, the first playback device may send an indication of the updated state variable to a second playback device. In some embodiments, sending such an indication may involve sending an instruction that causes the second playback device to update a state variable that is stored on the second playback device. For instance, playback device 122 may send an instruction that causes playback device 124 to update a state variable stored on playback device 124 to indicate that playback device 122 is uncalibrated (or that playback device 122 is calibrated, depending on the circumstances). Further, in some cases, playback device 122 may send an instruction to additional playback devices (e.g., one or more of playback devices 102-120) that cause these playback devices to update respective calibration state variables. Such sharing may help to maintain current calibration states of playback devices across multiple devices. Within example embodiments, the first playback device may transmit calibration states periodically, or perhaps in response to a query from a second device for a calibration state of a given playback device.

In some examples, the first playback device may store calibration state variables indicating calibration states of the second playback devices. For instance, after receiving an indication that a second playback device is calibrated (or uncalibrated), the first playback device may update a calibration state variable to indicate that the second playback device is calibrated. The first playback device may share the calibration state of the second playback device with other devices, such as control devices or other playback devices.

Also as noted above, the first playback device may send an indication of the updated state variable to a control device. For instance, playback device 122 may send an indication of the updated state variable to one or more control devices, such as control device 126 and/or control device. Such an indication may cause the control device to update a displayed interface to indicate the updated calibration state of the playback device (e.g., that playback device 122 is uncalibrated).

Within examples, the first playback device may share information in addition to the calibration state with one or more second devices. For instance, the first playback device may send calibration information with which the first playback device was calibrated. Such calibration information may include a calibration profile that indicates one or more calibration values that adjust equalization of the first playback device. As noted above, such an equalization adjustment may offset the acoustics of a given environment to produce a desired frequency response for sound emitted by the speakers of the first playback device. By sharing such a profile with second devices, the second devices may have the information to send back to the first playback device should the first playback device need or request the profile (e.g., to recover from power loss).

The first playback device may also share contextual information about a calibration with the one or more second devices. For instance, the first playback device may determine a time at which the first playback device was last calibrated and possibly also identify a bonded zone configuration in which the first playback device was configured when the first playback device was last calibrated. After making such determinations, the first playback device may send an indication of these calibration parameters to one or more second devices.

Having such calibration parameters may facilitate a second device detecting that the first playback device has become uncalibrated. For instance, if the first playback device shares that the first playback device was in a first bonded zone configuration when it was last calibrated, and the second device later receives an indication that the first playback device is in a second bonded zone configuration, the second device may determine that the calibration of the first playback device is out of date. Based on making such a determination, a second playback device might send an indication that the first playback device is no longer calibrated to the first playback device. A control device might initiate a procedure to calibrate the first playback device, or possibly display an indication of the uncalibrated state of the first playback device, among other possible operations.

As described above, example devices of a media playback system may store, update, and/or share a calibration state variable, which may provide various benefits, as discussed herein.

IV. Example Techniques to Display an Indication of a Calibration State Variable

As discussed above, embodiments described herein may involve a calibration state variable. FIG. 9 illustrates an example implementation 900 to display an indication of a calibration state variable.

a. Receive a Calibration State Variable Indicating Calibration State of a First Zone At block 902, implementation 900 involves receiving a calibration state variable indicating a calibration state of a first zone. For instance, a control device, such as control device 126 or control device 128 depicted in FIG. 1, may receive one or more calibration state variables indicating the calibration state of one or more playback devices of a particular zone (e.g., the Living Room zone of media playback system 100).

In some cases, the calibration state variable may indicate that a zone is uncalibrated (i.e., that one or more playback devices of the zone are not calibrated). A playback device of the zone may share such a calibration state variable when the playback device becomes uncalibrated. For instance, as described above, a playback device, such as playback device 106 of media playback system 100, may detect a trigger condition indicating that the first playback device has become uncalibrated (e.g., one of the trigger conditions described above in connection with block 506 of FIG. 5. Based on detecting such a trigger condition, playback device 106 may update a calibration state variable to indicate that playback device 106 is uncalibrated and send an indication of the updated calibration state variable to a control device.

b. Causing a Graphical Interface to Display an Indication of the Calibration State Referring back to FIG. 9, at block 904, implementation 900 involves causing a graphical interface to display an indication of the calibration state indicated by the calibration state variable. For example, the control device (e.g., control device 126 or 128) may display a controller interface (e.g., controller interface 400A of FIG. 4) that includes an indication of the calibration state. As noted above, in some cases, a calibration state variable may indicate that a given zone is uncalibrated. In such cases, the control device displays an indication that the given zone is uncalibrated.

As noted above, example media playbacks systems may include one or more zones. For instance, media playback system 100 includes a plurality of zones (e.g., the Living Room zone, Kitchen zone, Dining Room zone, Bedroom zone, and so on). A control device may display a zone control interface that lists the zones of the media playback system. One example of such a zone control interface is playback zone region 420 of controller interface 400A shown in FIG. 4. Such a zone control interface might include an indication of the calibration state of the one or more zones.

Figure 10:
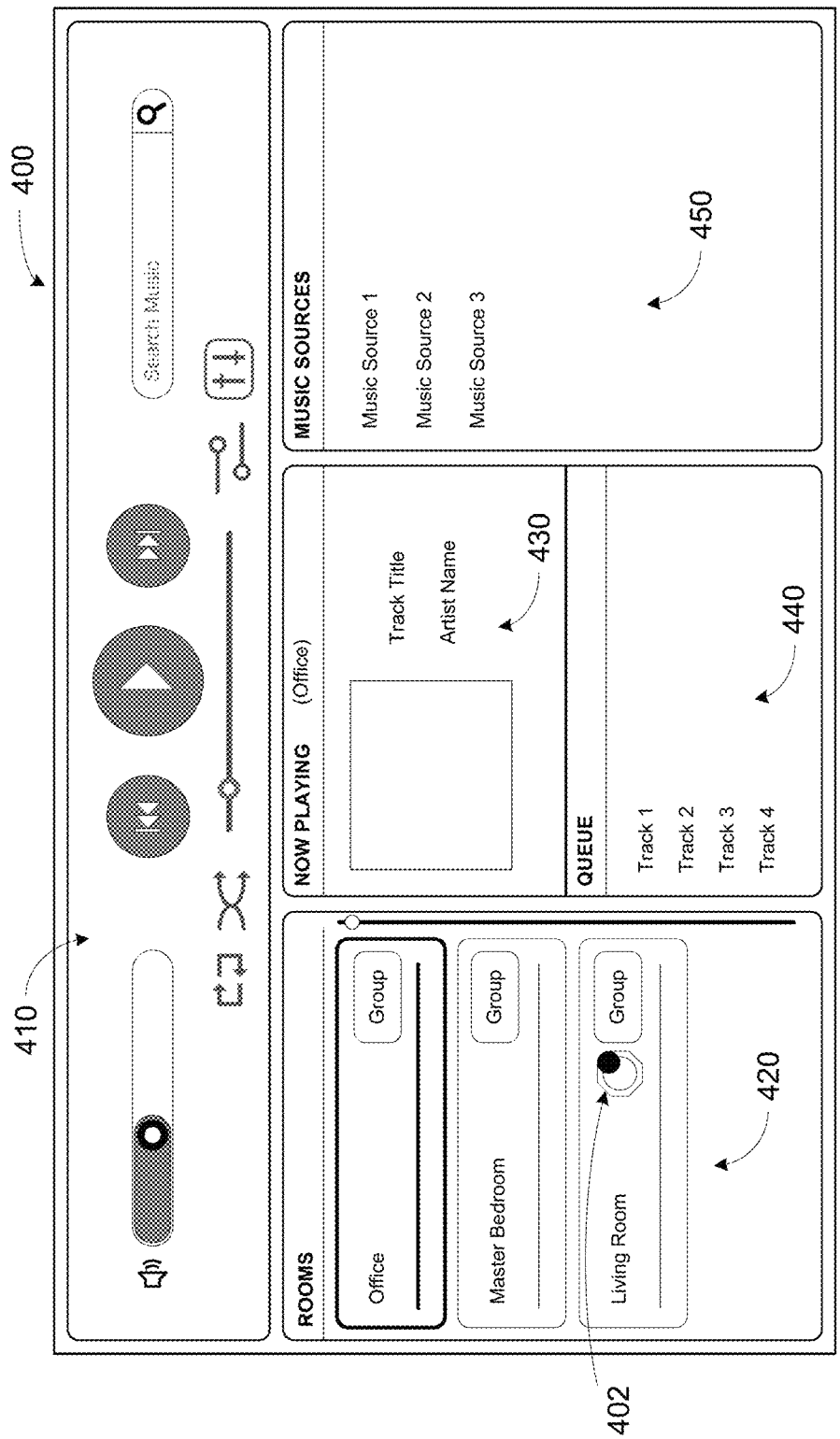
FIG. 10 shows an example controller interface that indicates that a zone is uncalibrated, according to an example embodiment.

To illustrate, FIG. 10 shows controller interface 400B, which is an instance of controller interface 400B that corresponds to media playback system 100 of FIG. 1. Like controller interface 400A, controller interface 400B includes a playback control region 410, a playback zone region 420, a playback status region 430, a playback queue region 440, and an audio content sources region 450. Within playback zone region 420, controller interface 400B also includes a graphical element 402 that indicates an issue with the Living Room zone, which may in turn indicate that the Living Room zone is uncalibrated. Conversely, a lack of such a graphical element, as shown with respect to the Office and Master Bedroom zones might indicate that these zones are calibrated.

Figure 11:
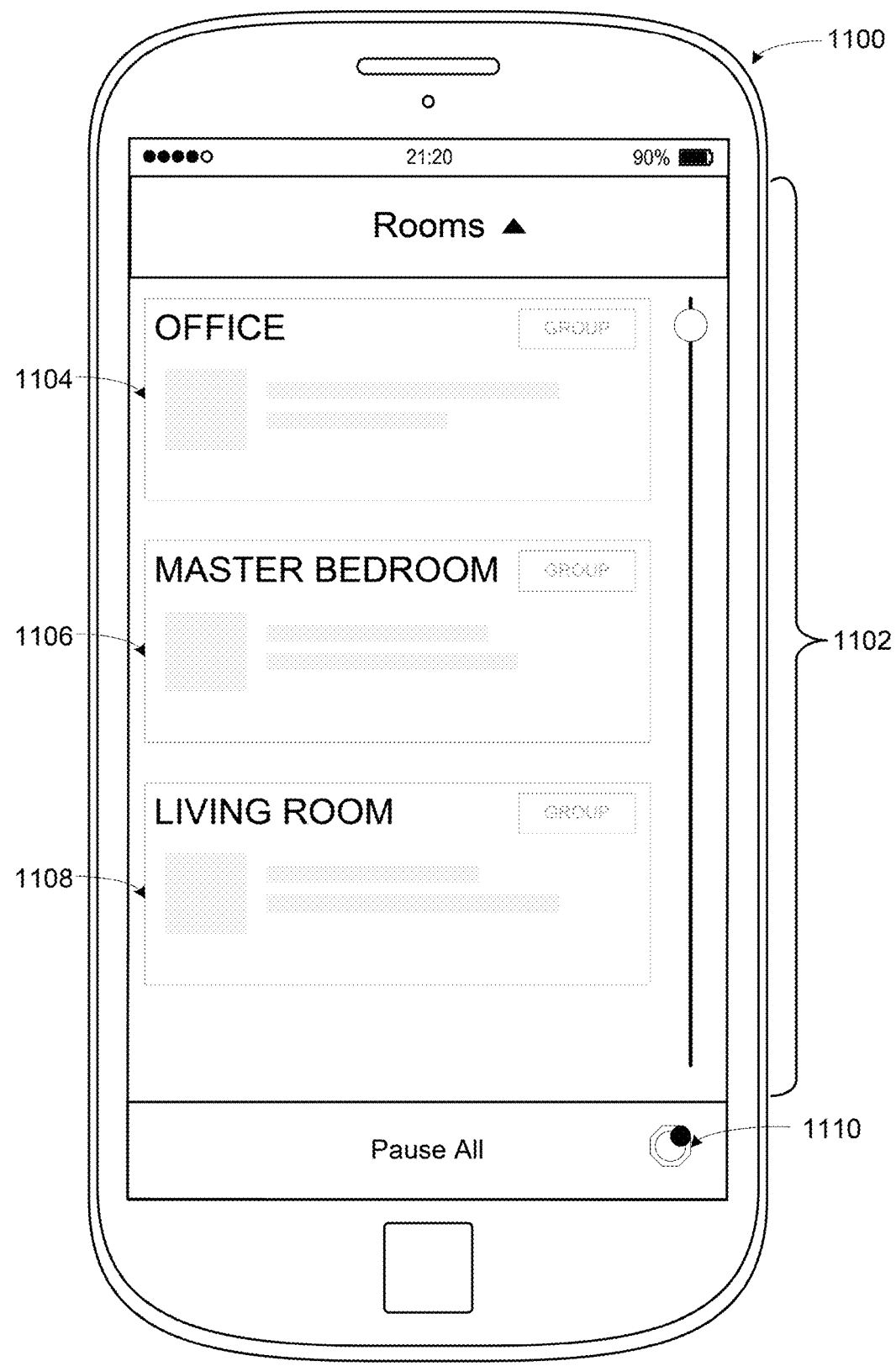
FIG. 11 shows another example controller interface that indicates that a zone is uncalibrated, according to an example embodiment.

As another example, FIG. 11 shows a smartphone 1100 that is displaying a zone control interface 1102. Zone control interface 1102 indicates the zones of media playback system 100. Zone controls 1104, 1106, and 1108 indicate the Office, Master Bedroom, and Living Room zones, respectively. Additional zone controls representing further zones of media playback system 100 may be displayed by way of scrolling. Zone controls, such as zone controls 1104, 1106, and 1108 may indicate media that is playing on the playback device(s) of the zone. Zone control interface 1102 also includes a graphical element 1110 that indicates an issue with at least one of the zones of media playback system 100, which may in turn indicate that at least one of the zones of media playback system 100 is uncalibrated.

In some embodiments, a control device may display a zone settings interface that indicates the calibration state of a given zone (e.g., that the given zone is uncalibrated). In some example interfaces, such an indication may contrast with an indication displayed on a zone control interface by indicating a particular zone that is uncalibrated (as opposed to generally indicating an issue with at least one zone). Selection of a selectable control, such as graphical element 402 of FIG. 10 or graphical element 1110 of FIG. 11, may cause display of such a zone settings interface.

Figure 12:
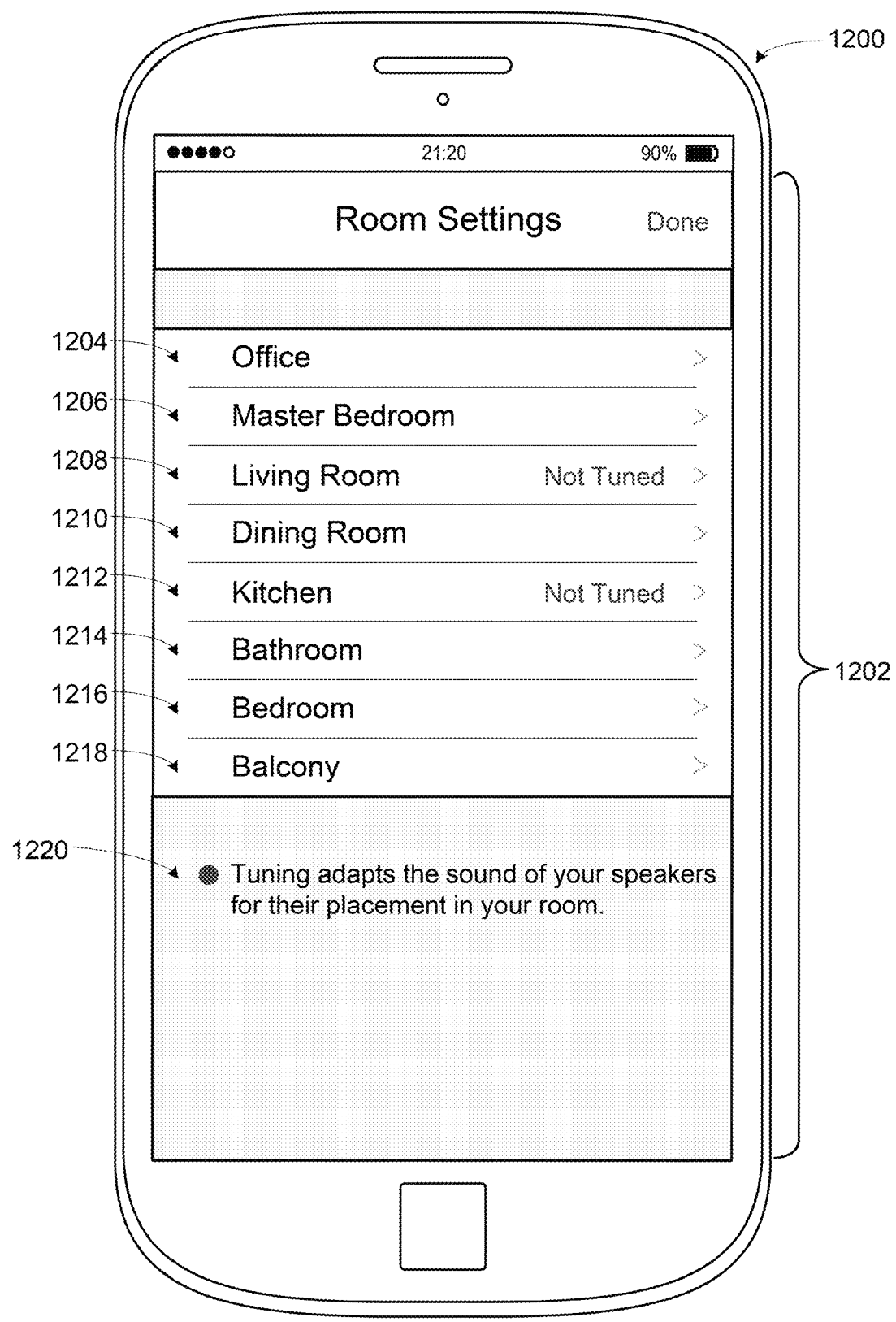
FIG. 12 shows an example zone settings interface, according to an example embodiment.

To illustrate a zone settings interface, FIG. 12 shows a smartphone 1200 that is displaying a zone settings interface 1202. Detecting the selection of a selectable control, such as graphical element 1110 of FIG. 11, may cause display of zone settings interface 1202. Zone settings interface 1202 includes selectable controls 1204, 1206, 1208, 1210, 1212, 1214, 1216, and 1218 that, when selected, cause display of a settings interface for the Office, Master Bedroom, Living Room, Dining Room, Kitchen, Bathroom, Bedroom, and Balcony zones, respectively.

Selectable controls 1204-1218 indicate whether the zone corresponding to that selectable control is calibrated. For instance, selectable control 1208 indicates that the Living Room zone is uncalibrated ("Not Tuned"). Likewise, selectable control 1212 indicates that the Kitchen zone is uncalibrated. In contrast, the lack of such indications on selectable controls 1204, 1206, 1210, 1214, 1216, and 1218 may indicate that the zones corresponding to those controls are calibrated. As noted above, the control device (i.e., smartphone 1200) may update a calibration state of a given zone after receiving a calibration state variable indicating whether that zone is calibrated.

Zone settings interface 1202 also includes graphical region 1220, which indicates the effect of calibration on the playback devices of a zone ("Tuning adapts the sound of your speakers for their placement in your room."). In some examples, graphical region 1220 might not display such an indication if all of the zones of the media playback system are calibrated. In other examples, graphical region 1220 might display a different indication when all of the zones of the media playback system are calibrated. For example, graphical region 1220 might indicate that the zones of the media playback system are tuned.

As noted above, in some embodiments, a control device may display a settings interface for a particular zone of the media playback system. The settings interface for the particular zone may include a plurality of controls that adjust operation of the particular zone in different ways. Further, such a settings interface may include an indication that a particular first playback device of the first zone is uncalibrated. Selection of a selectable control, such as selectable control 1208 or selectable control 1212 of FIG. 12, may cause display of such a settings interface.

Figure 13:
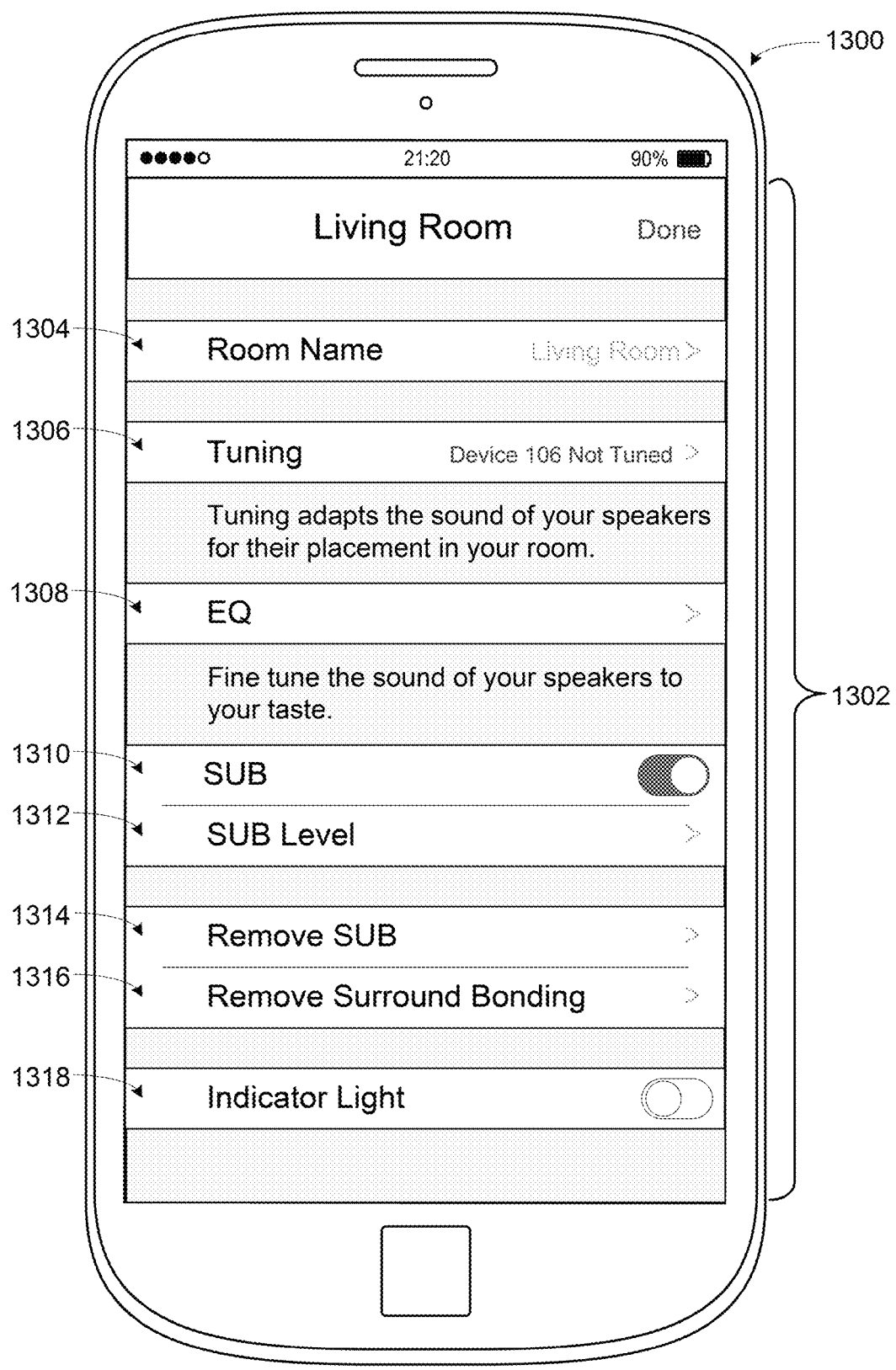
FIG. 13 shows an example settings interface for a first zone, according to an example embodiment.

By way of example, FIG. 13 shows a smartphone 1300 that is displaying a settings interface 1302 for the Living Room zone of media playback system 100. As noted above, this Living Room zone includes playback devices 104, 106, 108, and 110, which are joined into a surround sound configuration. Detecting the selection of a selectable control (e.g., selectable control 1208 of FIG. 12) may cause display of zone settings interface 1302. Zone settings interface 1302 includes selectable controls 1304, 1306, 1308, 1310, 1312, 1314, 1316, and 1318 that, when selected, adjust or change aspects of how the Living Room zone operates (i.e., how playback devices 104, 106, 108, and 110 operate).

More particularly, selectable control 1304, when selected, provides an interface to change the zone name of the Living Room zone. As described above in connection with block 506 of FIG. 5, a change to the name of a zone may create a presumption that a playback device of the zone has been moved, which may trigger a loss of calibration state. To illustrate, in some examples, upon detecting a change in the zone name of the Living Room zone, a control device such as smartphone 1300 may send an instruction to a playback device of the Living Room zone that indicates that the zone is uncalibrated, which may in turn cause the playback device(s) of the Living Room zone to update calibration state variables to reflect this calibration state.

Other selectable controls adjust other aspects of the zone. Selectable control 1308, when selected, provides an interface to adjust the equalization of the playback devices of the zone (e.g., to boost or cut certain frequencies, such as bass, treble, or mid-range frequencies). Selectable controls 1310 and 1312 adjust operation of playback device 110 (i.e., the subwoofer). In particular, selectable control 1310, when selected, toggles playback device 110 on and off and selectable control 1312, when selected, provides an interface to adjust the volume level of playback device 110. Selectable controls 1314 and 1316 adjust the bonded zone configuration of the Living Room zone (i.e., the surround sound configuration). More particularly, selectable control 1314 removes only playback device 110 from the bonded zone configuration while selectable control 1314 removes playback devices 104, 106, 108, and 110 from the bonded zone configuration. Lastly, selectable control 1318 toggles respective power indicator lights on playback devices 104, 106, 108, and 110 on and off.

While some example controls have been shown to illustrate an example settings interface, other example settings interfaces contemplated herein may include additional or fewer controls, or controls that are not shown in the example settings interface.

c. Cause Graphical Interface to Display a Selectable Control that Initiates Calibration of the First Zone In FIG. 9, at block 906, implementation 900 involves causing the graphical interface to display a selectable control that initiates calibration of the first zone. For example, the control device (e.g., control device 126 or 128) may display a controller interface (e.g., controller interface 400A of FIG. 4) that includes a selectable control that initiates calibration of one or more first playback devices of the first zone. In other examples, a control device may display such a selectable control on a settings interface, such as zone settings interface 1202 of FIG. 12 or settings interface 1302 of FIG. 13.

To illustrate, referring back to FIG. 13, settings interface 1302 includes a selectable control 1306, that when selected, initiates calibration of the Living Room zone. Selectable control 1306 also includes an indication that a particular playback device of the Living Room zone is uncalibrated (i.e., playback device 106). Selection of selectable control 1306 may initiate a calibration procedure that calibrates at least playback device 106 (and possibly other playback devices of the Living Room zone).

d. Initiate Calibration of the Zone

Referring again to FIG. 9, at block 908, implementation 900 involves initiating calibration of the first zone, which may involve calibrating one or more playback devices of the first zone. Some calibration procedures contemplated herein involve a control device detecting and analyzing sound waves (e.g., one or more calibration sounds) emitted by the playback device. In a first phase, the calibration process may involve preparing the playback device, the control device, and/or the environment for calibration of the playback device. A second phase of the calibration process may involve carrying out the calibration itself. In some embodiments, the control device may display a prompt, or a series of prompts, that direct the user to assist in one or both phases of the calibration procedure.

To prepare the playback device for calibration, a control device may provide prompts to position the playback device within the environment as the playback device will later be operated. An environment's acoustics may vary from physical location to physical location within the environment, so calibrating a playback device at a first physical location might not be helpful if the playback device will be listened to at a second physical location. In an attempt to get the playback device to be calibrated in its operating position, the control device may display a prompt to position the playback device in the physical location at which it will be operated.

To prepare the control device for calibration, the control device may provide a prompt to perform a step or steps to improve the acoustics of the microphone that will be detecting the calibration sounds emitted by the playback device. For instance, the control device may prompt to rotate the control device such that its microphone is oriented upwards, as such an orientation may improve the microphone sensitivity or other acoustic characteristics. As another example, the control device may prompt to remove any removable cases or covers that have been installed on the control devices. Cases or covers may negatively influence the microphones ability to sense sounds, as they may physically block or attenuate sound before the sound reaches the microphone. Within examples, the control device may prompt to perform other steps as well.

To prepare the environment for calibration, the control device may provide a prompt to perform one or more steps to reduce or eliminate environmental effects on the calibration. For instance, the control device may prompt to reduce ambient noise within an environment. Since the calibration involves the control device detecting calibration sounds emitted by the playback device, ambient noise may negatively influence the calibration procedure by affecting a microphone's ability to detect the calibration sounds.

Within example embodiments, the first phase may include any combination of the above steps in preparing the playback device, the control device, and the environment. Moreover, these steps may be performed in any order. For instance, the control device may prompt to prepare the environment before the control device. Further, some examples might not include all of these steps. For example, some calibration procedures involve preparing the control device and the playback device but not necessarily the environment. In addition, preparing any of the described entities might not include all of the described examples of how such an entity may be prepared. By way of example, in some embodiments, a control device may prompt to rotate the control device and might not prompt to remove any cases.

After the first phase, the control device may proceed to calibration. In some embodiments, the control device might not initiate (or might not allow calibration to be initiated) until the control device has received an indication that preparation is completed. For instance, the control device may display a selectable control to initiate calibration upon detecting input data indicating that the playback device, control device, and environment have each been prepared for calibration. Then, upon detecting input data indicating a selection the displayed control, the control device may initiate calibration. For instance, the control device may transmit an instruction to the playback device that causes the playback device to begin emitting a calibration sound.

Some calibration procedures may be improved by the control device detecting the calibration sounds at multiple physical locations within the environment. As noted above, acoustics of an environment may vary from location to location within the environment. Detecting the calibration sounds at multiple physical locations within the environment may provide a better understanding of the environment as a whole. To facilitate detecting the calibration sounds at multiple physical locations, the control device may provide a prompt to perform a movement during the calibration procedure. The movement may involve the user carrying the control device around the room while the playback device under calibration emits calibration sounds. In this manner, the control device may detect the calibration sounds at multiple physical locations within the environment.

After detecting the calibration sounds, the control device may analyze the calibration sounds to determine determining respective frequency responses of the one or more playback devices within a given environment. After determining such a response for a given playback device, the control device may instruct the given playback device to adopt a certain calibration profile (e.g., an equalization) that offsets the acoustics of the environment.

Some further example calibration procedures, or aspects thereof, are described in U.S. patent application Ser. No. 13/536,493 filed Jun. 28, 2012, entitled "System and Method for Device Playback Calibration," U.S. patent application Ser. No. 14/216,306 filed Mar. 17, 2014, entitled "Audio Settings Based On Environment," U.S. patent application Ser. No. 14/481,511 filed Sep. 9, 2014, entitled "Playback Device Calibration," and U.S. patent application Ser. No. 14/696,014, entitled "Speaker Calibration," which are incorporated herein in their entirety.

After a calibration procedure is performed to calibrate the playback devices of a zone (e.g., the Living Room zone of media playback system 100), a control device may perform certain operations to update the media playback system. For instance, the control device may cause the graphical interface to remove the indication(s) that the zone is uncalibrated. In particular, given that the zones of the media playback system are now calibrated, smartphone 1100 might remove or alter graphical element 1110 to no longer indicate that at least one zone of the media playback system is uncalibrated. As another example, smartphone 1200 may alter selectable control 1208 to no longer indicate that the Living Room zone is uncalibrated. And, as yet another example, smartphone 1300 may change selectable control 1306 to no longer indicate that playback device 106 is not calibrated. Other examples are possible as well.

The control device may update playback devices of the media playback system with the updated calibration state of the first zone. For instance, a control device, such as control device 126, may send an instruction that causes playback device 106 to update a calibration state variable to indicate that Living Room zone is now calibrated (i.e., that playback devices 104, 106, 108, and 110 are calibrated). As noted above, in some embodiments, multiple playback devices may store respective calibration variables indicating the calibration state of a given playback device. In some cases, the control device may send an indication of the updated calibration state of the Living Room zone to these playback devices as well. Alternatively, the playback devices may propagate this calibration state through media playback system 100 by sending an indication of the calibration state to one or more additional playback devices.

Referring back to the example zone setting interfaces noted above, in some cases, a control device may detect selection of a selectable control that causes display of a settings interface for a zone that is calibrated. For instance, in FIG. 12, smartphone 1200 may detect selection of selectable control 1216, which may cause smartphone 1200 to display a settings interface for the Bedroom zone. Like settings interface 1302, such a settings interface may include a plurality of controls that control operation of the zone that corresponds to the settings interface (i.e., the Bedroom zone).

Figure 14:
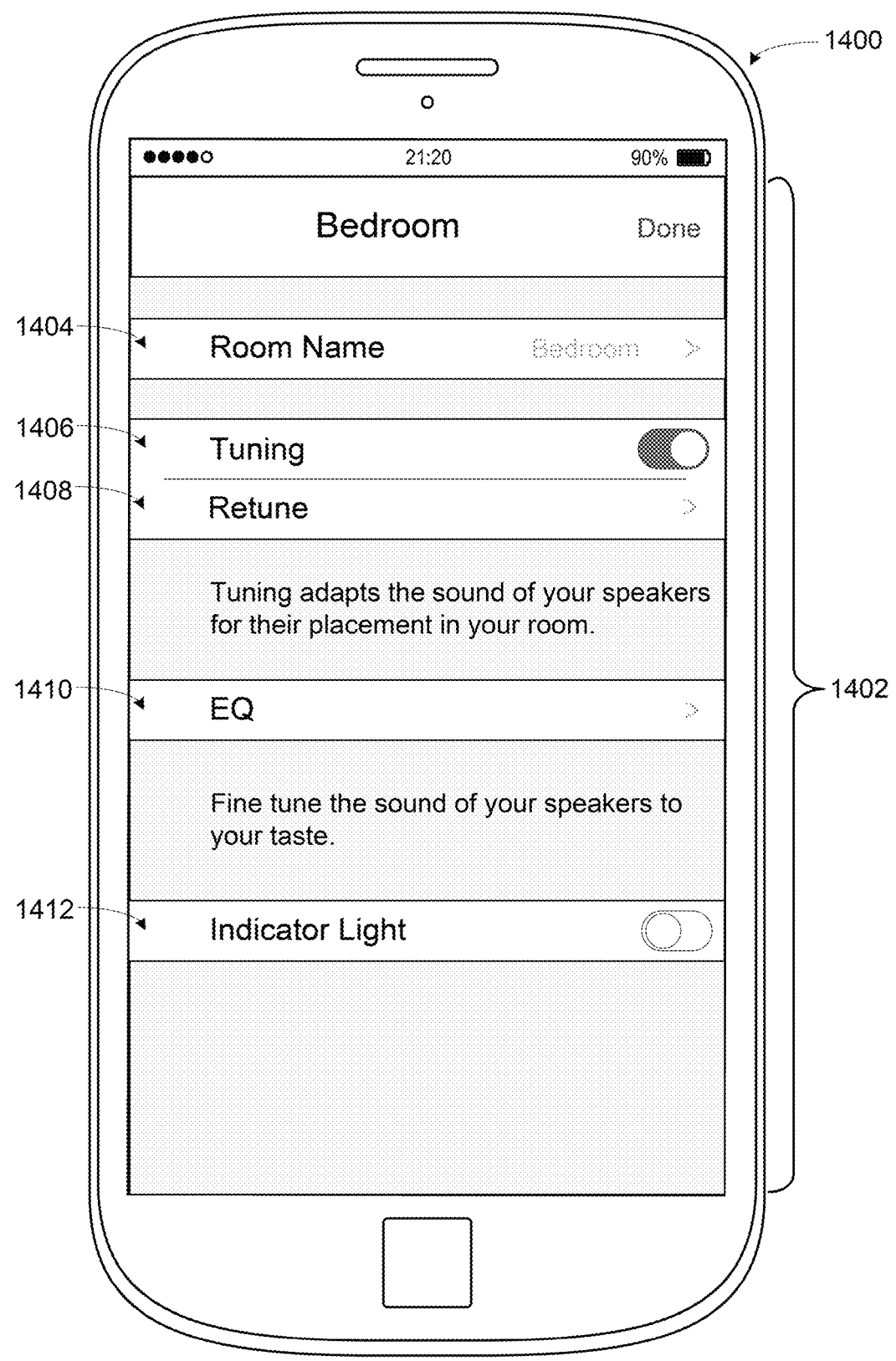
FIG. 14 shows an example zone settings interface for a second zone, according to an example embodiment.

To illustrate, FIG. 14 shows a smartphone 1400 that is displaying a settings interface 1402 for the Bedroom zone of media playback system 100. As noted above, this Bedroom zone includes playback devices 120. Detecting the selection of a selectable control (e.g., selectable control 1216 of FIG. 12) may cause display of zone settings interface 1402. Zone settings interface 1402 includes selectable controls 1404, 1406, 1408, 1410, and 1412 that, when selected, adjust or change aspects of how the Bedroom zone operates (i.e., how playback device 120 operates).

Selectable controls 1404, 1410, and 1412 operate similarly to selectable controls 1304, 1308, and 1318 of FIG. 13, respectively. In particular, similar to selectable control 1304, selectable control 1404, when selected, provides an interface to change the zone name of the Bedroom zone. Selectable control 1410, when selected, causes display of an interface to adjust the equalization of playback device 120. And, selectable control 1412, when selected, toggles a power indicator light on playback device 120 on and off. Since the Bedroom zone does not include a bonded zone configuration or certain types of playback devices (e.g., a subwoofer), settings interface 1402 might not include all of the controls that settings interface 1302 includes.

But, settings interface 1402 also includes selectable controls that settings interface 1302 does not include, as the Bedroom zone is calibrated. Instead, settings interface 1402 includes selectable control 1406 and 1408, which adjust the calibrated state of the Bedroom zone. In particular, selectable control 1406, when selected, toggles the calibration of the Bedroom zone on and off. And, selectable control 1408, when selected, initiates a calibration procedure for the Bedroom zone to re-calibrate playback device 120.

V. Conclusion

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only way(s) to implement such systems, methods, apparatus, and/or articles of manufacture.

Example techniques may involve a calibration state variable. In one aspect, a method is provided. The method may involve receiving, via a network interface, an indication that the first playback device is calibrated. The method may also involve updating a calibration state variable to indicate that the first playback device is calibrated based on receiving the indication that the first playback device is calibrated. The method may further involve sending, via the network interface, an indication of the updated calibration state variable to a second device.

In another aspect, a device is provided. The device includes a network interface, at least one processor, a data storage, and program logic stored in the data storage and executable by the at least one processor to perform operations. The operations may include receiving, via the network interface, an indication that the first playback device is calibrated. The operations may also include updating a calibration state variable to indicate that the first playback device is calibrated based on receiving the indication that the first playback device is calibrated. The operations may further include sending, via the network interface, an indication of the updated calibration state variable to a second device.

In yet another aspect, a non-transitory computer readable memory is provided. The non-transitory computer readable memory has stored thereon instructions executable by a computing device to cause the computing device to perform operations. The operations may include receiving, via the network interface, an indication that the first playback device is calibrated. The operations may also include updating a calibration state variable to indicate that the first playback device is calibrated based on receiving the indication that the first playback device is calibrated. The operations may further include sending, via the network interface, an indication of the updated calibration state variable to a second device.

Further example techniques may involve a graphical user interface displaying an indication of a calibration state variable. In one aspect, a method is provided. The method may involve receiving, from a first playback device of a media playback system, a calibration state variable indicating that the first playback device is uncalibrated. The method may also involve causing a graphical interface to display an indication that the first playback device is uncalibrated. The method may further involve causing the graphical interface to display a selectable control that, when selected, initiates calibration of the first playback device and initiating calibration of the first playback device.

In another aspect, a device is provided. The device includes a network interface, at least one processor, a data storage, and program logic stored in the data storage and executable by the at least one processor to perform operations. The operations may include receiving, from a first playback device of a media playback system, a calibration state variable indicating that the first playback device is uncalibrated. The operations may also include causing a graphical interface to display an indication that the first playback device is uncalibrated. The operations may further include causing the graphical interface to display a selectable control that, when selected, initiates calibration of the first playback device and initiating calibration of the first playback device.

In yet another aspect, a non-transitory computer readable memory is provided. The non-transitory computer readable memory has stored thereon instructions executable by a computing device to cause the computing device to perform operations. The operations may include receiving, from a first playback device of a media playback system, a calibration state variable indicating that the first playback device is uncalibrated. The operations may also include causing a graphical interface to display an indication that the first playback device is uncalibrated. The operations may further include causing the graphical interface to display a selectable control that, when selected, initiates calibration of the first playback device and initiating calibration of the first playback device.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

What is claimed is:

1. A first playback device of a media playback system, the first playback device comprising:
   one or more speakers;
   a network interface;
   one or more processors; and
   a data storage having stored therein instructions executable by the one or more processors to cause the first playback device to perform operations comprising:
      while the first playback device is in a first bonded configuration, determining that the first playback device is calibrated;
      in response to determining that the first playback device is calibrated, updating a calibration state variable to indicate (i) that the first playback device is calibrated, and (ii) the first bonded configuration in which the first playback device was last calibrated, wherein the calibration state variable is stored in the data storage;
      switching from the first bonded configuration to a second bonded configuration, wherein the second bonded configuration comprises the first playback device and a second playback device of the media playback system;
      after switching from the first bonded configuration to the second bonded configuration, updating the calibration state variable;
      sending, via the network interface, an indication of the updated calibration state variable to the second playback device; and
      in response to sending the indication of the updated calibration state variable to the second playback device, receiving, from the second playback device, an indication that (i) the first playback device is in the second bonded configuration and (ii) non-calibrated in the second bonded configuration.

2. The first playback device of claim 1, wherein sending the indication of the updated calibration state variable to the second playback device comprises sending an instruction that causes the second playback device to update a state variable that is stored on the second playback device to indicate that the first playback device is calibrated.

3. The first playback device of claim 1, wherein the operations further comprise:
   based on receiving the indication that (i) the first playback device is in the second bonded configuration and (ii) non-calibrated in the second bonded configuration, initiating calibration of the first playback device.

4. The first playback device of claim 3, wherein the operations further comprise:
   receiving, via the network interface, an indication that the first playback device is calibrated in the second bonded configuration;
   based on receiving the indication that the first playback device is calibrated in the second bonded configuration, updating a second calibration state variable to indicate (i) that the first playback device is calibrated and (ii) the second bonded configuration in which the first playback device was last calibrated, wherein the second calibration state variable is stored in the data storage; and
   sending, via the network interface, an indication of the updated second calibration state variable to the second playback device.

5. The first playback device of claim 1, wherein sending the indication of the updated calibration state variable to the second playback device comprises:
   receiving, from the second playback device, a query for an indication of a calibration state of the first playback device; and
   in response to receiving the query, sending, to the second playback device, an indication that the first playback device is calibrated.

6. The first playback device of claim 1, wherein the first bonded configuration or the second bonded configuration comprises an un-bonded configuration.

7. The first playback device of claim 1, wherein the second bonded configuration comprises a stereo pairing between the first playback device and the second playback device.

8. The first playback device of claim 1, wherein the second bonded configuration comprises a surround sound group pairing between the first playback device and the second playback device.

9. A method comprising:
   while a first playback device of a media playback system is in a first bonded configuration, determining, by the first playback device, that the first playback device is calibrated;
   in response to determining that the first playback device is calibrated, updating, by the first playback device, a calibration state variable to indicate (i) that the first playback device is calibrated, and (ii) the first bonded configuration in which the first playback device was last calibrated, wherein the calibration state variable is stored in a data storage of the first playback device;
   switching, by the first playback device, from the first bonded configuration to a second bonded configuration, wherein the second bonded configuration comprises the first playback device and a second playback device of the media playback system;
   after switching from the first bonded configuration to the second bonded configuration, updating, by the first playback device, the calibration state variable;
   sending, via a network interface, an indication of the updated calibration state variable to the second playback device; and
   in response to sending the indication of the updated calibration state variable to the second playback device, receiving, from the second playback device, an indication that (i) the first playback device is in the second bonded configuration and (ii) non-calibrated in the second bonded configuration.

10. The method of claim 9, wherein sending the indication of the updated calibration state variable to the second playback device comprises sending an instruction that causes the second playback device to update a state variable that is stored on the second playback device to indicate that the first playback device is calibrated.

11. The method of claim 9, wherein the method further comprises:
based on receiving the indication that (i) the first playback device is in the second bonded configuration and (ii) non-calibrated in the second bonded configuration, initiating, by the first playback device, calibration of the first playback device.

12. The method of claim 11, wherein the method further comprises:
receiving, via the network interface of the first playback device, an indication that the first playback device is calibrated in the second bonded configuration;
based on receiving the indication that the first playback device is calibrated in the second bonded configuration, updating a second calibration state variable to indicate (i) that the first playback device is calibrated and (ii) the second bonded configuration in which the first playback device was last calibrated, wherein the second calibration state variable is stored in the data storage of the first playback device; and
sending, via the network interface of the first playback device, an indication of the updated second calibration state variable to the second playback device.

13. The method of claim 9, wherein the first bonded configuration or the second bonded configuration comprises an un-bonded configuration.

14. The method of claim 9, wherein the second bonded configuration comprises a stereo pairing between the first playback device and the second playback device.

15. The method of claim 9, wherein the second bonded configuration comprises a surround sound group pairing between the first playback device and the second playback device.

16. Tangible, non-transitory computer-readable media having stored therein instructions executable by one or more processors, wherein the instructions, when executed, cause a first playback device of a media playback system to perform functions comprising:
while the first playback device is in a first bonded configuration, determining that the first playback device is calibrated;
in response to determining that the first playback device is calibrated, updating a calibration state variable to indicate (i) that the first playback device is calibrated, and (ii) the first bonded configuration in which the first playback device was last calibrated, wherein the calibration state variable is stored in a data storage of the first playback device;
switching from the first bonded configuration to a second bonded configuration, wherein the second bonded configuration comprises the first playback device and a second playback device of the media playback system;
after switching from the first bonded configuration to the second bonded configuration, updating the calibration state variable;
sending, via a network interface, an indication of the updated calibration state variable to the second playback device; and
in response to sending the indication of the updated calibration state variable to the second playback device, receiving, from the second playback device, an indication that (i) the first playback device is in the second bonded configuration and (ii) non-calibrated in the second bonded configuration.

* * * * *